(12) United States Patent
Yamazaki et al.

(10) Patent No.: US 8,772,128 B2
(45) Date of Patent: *Jul. 8, 2014

(54) METHOD FOR MANUFACTURING SEMICONDUCTOR DEVICE

(75) Inventors: Shunpei Yamazaki, Setagaya (JP);
Junpei Momo, Sagamihara (JP); Fumito Isaka, Zama (JP); Eiji Higa, Atsugi (JP);
Masaki Koyama, Atsugi (JP); Akihisa Shimomura, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1001 days.

This patent is subject to a terminal disclaimer.

(21) Appl. No.: 12/246,577

(22) Filed: Oct. 7, 2008

(65) Prior Publication Data
US 2009/0111244 A1 Apr. 30, 2009

(30) Foreign Application Priority Data

Oct. 10, 2007 (JP) ................. 2007-264912
Oct. 12, 2007 (JP) ................. 2007-267265
Nov. 1, 2007 (JP) ................. 2007-285598

(51) Int. Cl.
*H01L 21/762* (2006.01)

(52) U.S. Cl.
USPC ........... 438/458; 438/149; 438/150; 438/455; 438/514; 257/E21.567

(58) Field of Classification Search
USPC ................................. 438/455–459
See application file for complete search history.

(56) References Cited

U.S. PATENT DOCUMENTS 5,374,564 A 12/1994 Bruel
5,383,993 A 1/1995 Katada et al.
(Continued)

FOREIGN PATENT DOCUMENTS

EP 1758168 A 2/2007
JP 02-054532 A 2/1990
(Continued)

OTHER PUBLICATIONS

Kahlert.H et al., "UV-Optics for Excimer Laser Based Ctystallization Processes,", Mat. Res. Soc. Symp. Proc. (Materials Research Society Symposia Proceedings), 2001, vol. 685, pp. D6.2.1-D6.2.6.
(Continued)

*Primary Examiner* — Thanh Nguyen
(74) *Attorney, Agent, or Firm* — Eric J. Robinson; Robinson Intellectual Property Law Office, P.C.

(57) ABSTRACT

A single crystal semiconductor substrate is irradiated with ions that are generated by exciting a hydrogen gas and are accelerated with an ion doping apparatus, thereby forming a damaged region that contains a large amount of hydrogen. After the single crystal semiconductor substrate and a supporting substrate are bonded, the single crystal semiconductor substrate is heated to be separated along the damaged region. While a single crystal semiconductor layer separated from the single crystal semiconductor substrate is heated, this single crystal semiconductor layer is irradiated with a laser beam. The single crystal semiconductor layer undergoes re-single-crystallization by being melted through laser beam irradiation, thereby recovering its crystallinity and planarizing the surface of the single crystal semiconductor layer.

54 Claims, 39 Drawing Sheets
(1 of 39 Drawing Sheet(s) Filed in Color)

(56) References Cited

U.S. PATENT DOCUMENTS

| | | | |
|---|---|---|---|
| 6,110,845 A * | 8/2000 | Seguchi et al. | 438/795 |
| 6,117,700 A | 9/2000 | Orita et al. | |
| 6,127,702 A | 10/2000 | Yamazaki et al. | |
| 6,271,101 B1 | 8/2001 | Fukunaga | |
| 6,335,231 B1 | 1/2002 | Yamazaki et al. | |
| 6,372,609 B1 | 4/2002 | Aga et al. | |
| 6,380,046 B1 | 4/2002 | Yamazaki | |
| 6,388,652 B1 | 5/2002 | Yamazaki et al. | |
| 6,534,380 B1 | 3/2003 | Yamauchi et al. | |
| 6,583,440 B2 | 6/2003 | Yasukawa | |
| 6,602,761 B2 | 8/2003 | Fukunaga | |
| 6,611,005 B2 | 8/2003 | Tsujimura et al. | |
| 6,686,623 B2 | 2/2004 | Yamazaki | |
| 6,778,164 B2 | 8/2004 | Yamazaki et al. | |
| 6,803,264 B2 | 10/2004 | Yamazaki et al. | |
| 6,818,921 B2 | 11/2004 | Yasukawa | |
| 6,875,633 B2 | 4/2005 | Fukunaga | |
| 6,927,148 B2 | 8/2005 | Ito | |
| 6,992,025 B2 | 1/2006 | Maa et al. | |
| 7,052,943 B2 | 5/2006 | Yamazaki et al. | |
| 7,064,049 B2 | 6/2006 | Ito et al. | |
| 7,087,504 B2 | 8/2006 | Nakajima et al. | |
| 7,112,514 B2 | 9/2006 | Yasukawa | |
| 7,119,365 B2 | 10/2006 | Takafuji et al. | |
| 7,148,124 B1 | 12/2006 | Usenko | |
| 7,157,847 B2 | 1/2007 | Kawachi et al. | |
| RE39,484 E | 2/2007 | Bruel | |
| 7,176,525 B2 | 2/2007 | Fukunaga | |
| 7,199,024 B2 | 4/2007 | Yamazaki | |
| 7,217,952 B2 | 5/2007 | Nakajima et al. | |
| 7,232,715 B2 | 6/2007 | Arao et al. | |
| 7,253,032 B2 | 8/2007 | Yamazaki et al. | |
| 7,256,776 B2 | 8/2007 | Yamazaki et al. | |
| 7,390,725 B2 | 6/2008 | Maa et al. | |
| 7,410,882 B2 | 8/2008 | Wong et al. | |
| 7,473,592 B2 | 1/2009 | Yamazaki et al. | |
| 7,473,971 B2 | 1/2009 | Yamazaki et al. | |
| 7,476,576 B2 | 1/2009 | Yamazaki et al. | |
| 7,485,586 B2 | 2/2009 | Yamazaki et al. | |
| 7,491,342 B2 | 2/2009 | Kamiyama et al. | |
| 7,521,335 B2 * | 4/2009 | Yamanaka | 438/458 |
| 7,535,053 B2 | 5/2009 | Yamazaki | |
| 7,579,654 B2 * | 8/2009 | Couillard et al. | 257/347 |
| 7,608,521 B2 * | 10/2009 | Cites et al. | 438/455 |
| 7,638,408 B2 | 12/2009 | Yamazaki et al. | |
| 7,638,805 B2 | 12/2009 | Yamazaki et al. | |
| 7,642,598 B2 | 1/2010 | Yamazaki et al. | |
| 7,674,687 B2 | 3/2010 | Henley | |
| 7,675,232 B2 | 3/2010 | Kawachi et al. | |
| 7,736,998 B2 | 6/2010 | Morita et al. | |
| 7,781,306 B2 | 8/2010 | Kakehata | |
| 7,799,620 B2 | 9/2010 | Honda et al. | |
| 7,799,658 B2 * | 9/2010 | Yamazaki | 438/458 |
| 7,816,736 B2 | 10/2010 | Yamazaki | |
| 7,834,398 B2 | 11/2010 | Yamazaki | |
| 7,883,990 B2 | 2/2011 | Levy et al. | |
| 7,897,476 B2 | 3/2011 | Yamazaki et al. | |
| 7,978,190 B2 | 7/2011 | Yamazaki et al. | |
| 7,989,273 B2 | 8/2011 | Yamazaki et al. | |
| 8,106,330 B2 | 1/2012 | Arao et al. | |
| 8,314,012 B2 * | 11/2012 | Yamazaki | 438/458 |
| 8,324,086 B2 * | 12/2012 | Shimomura et al. | 438/479 |
| 2002/0070454 A1 | 6/2002 | Yasukawa | |
| 2003/0232466 A1 | 12/2003 | Zistl et al. | |
| 2004/0157409 A1 | 8/2004 | Ghyselen et al. | |
| 2005/0263767 A1 * | 12/2005 | Yamazaki et al. | 257/72 |
| 2006/0118868 A1 | 6/2006 | Yoshimura et al. | |
| 2007/0063281 A1 | 3/2007 | Takafuji et al. | |
| 2007/0108510 A1 | 5/2007 | Fukunaga | |
| 2007/0141803 A1 | 6/2007 | Boussagol et al. | |
| 2007/0173000 A1 | 7/2007 | Yamazaki | |
| 2007/0264825 A1 * | 11/2007 | Sasagawa et al. | 438/685 |
| 2007/0281440 A1 | 12/2007 | Cites et al. | |
| 2008/0038908 A1 | 2/2008 | Henley | |
| 2008/0054269 A1 | 3/2008 | Yamazaki et al. | |
| 2008/0061301 A1 | 3/2008 | Yamazaki | |
| 2008/0067529 A1 | 3/2008 | Yamazaki | |
| 2008/0070335 A1 | 3/2008 | Yamazaki et al. | |
| 2008/0099065 A1 | 5/2008 | Ito et al. | |
| 2008/0286952 A1 | 11/2008 | Miyairi et al. | |
| 2009/0009440 A1 | 1/2009 | Kawachi et al. | |
| 2009/0039349 A1 | 2/2009 | Honda | |
| 2009/0098710 A1 | 4/2009 | Yamazaki | |
| 2009/0115028 A1 | 5/2009 | Shimomura et al. | |
| 2011/0003461 A1 | 1/2011 | Yamazaki et al. | |
| 2011/0076837 A1 | 3/2011 | Miyairi et al. | |

FOREIGN PATENT DOCUMENTS

| | | |
|---|---|---|
| JP | 03-054532 A | 3/1991 |
| JP | 05-211128 | 8/1993 |
| JP | 11-097379 | 4/1999 |
| JP | 11-163363 | 6/1999 |
| JP | 2000-012864 | 1/2000 |
| JP | 2000-077287 A | 3/2000 |
| JP | 2000-150905 | 5/2000 |
| JP | 2002-170942 A | 6/2002 |
| JP | 2003-017411 A | 1/2003 |
| JP | 2003-037064 A | 2/2003 |
| JP | 2003-168570 A | 6/2003 |
| JP | 2004-087606 | 3/2004 |
| JP | 2004-139944 A | 5/2004 |
| JP | 2004-179653 A | 6/2004 |
| JP | 2005-203596 A | 7/2005 |
| JP | 2005-252244 | 9/2005 |
| JP | 2006-264804 A | 10/2006 |
| WO | WO-2005/117123 | 12/2005 |

OTHER PUBLICATIONS

Taiwanese Office Action (Application No. 97138722) Dated Sep. 23, 2013.

* cited by examiner

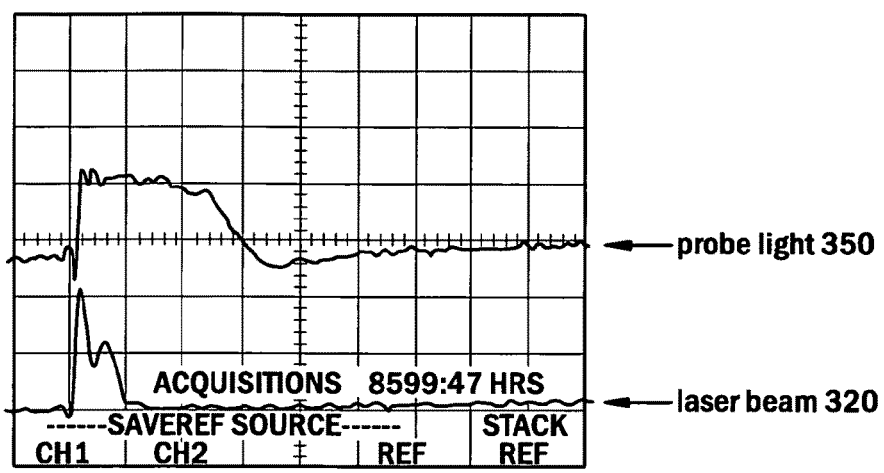
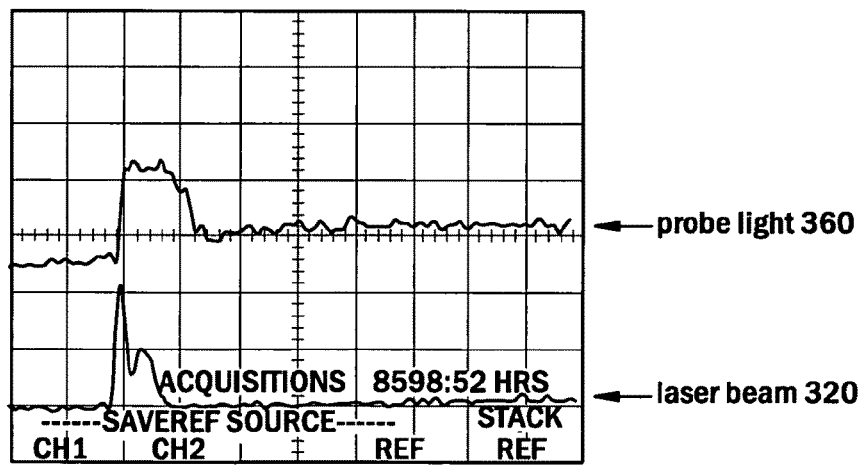
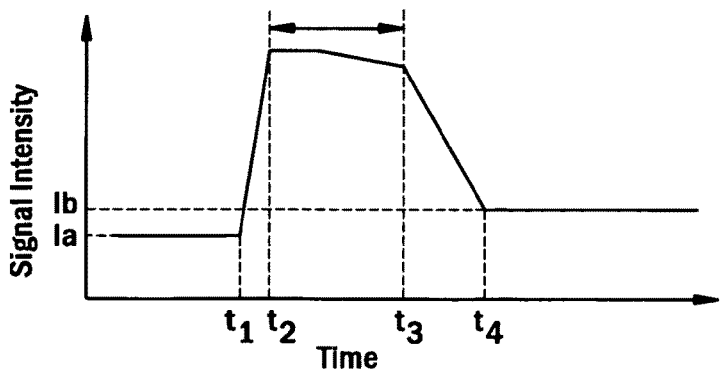

15 μm

15 μm

15 μm

15 μm

Gray Scale Map Type: <none>

Color Coded Map Type: Inverse Pole Figure [001]
Silicon

Boundaries: <none>

FIG. 40

| Process Condition | Before Laser Irradiation Process | After Laser Irradiation Process | | | |
|---|---|---|---|---|---|
| | | 500°C | | Room Temperature | |
| Stage Temperature | | | | | |
| Scanning Rate | | 1.0mm/sec | 8.0mm/sec | 1.0mm/sec | 8.0mm/sec |
| Overlap Percentage | | 89% | 11% | 89% | 11% |
| Energy Density | | 622mJ/cm² | 567mJ/cm² | 703mJ/cm² | 703mJ/cm² |
| AFM image [30 mm x 30 mm] | 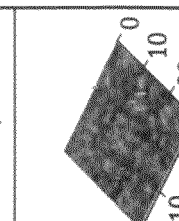 | 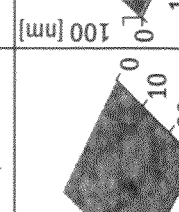 | 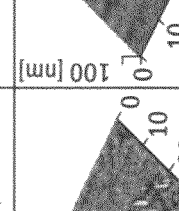 | 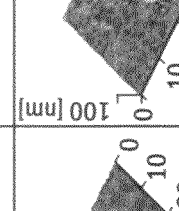 | |
| Ra[nm] | 9.8 | 2.1 | 1.3 | 2.8 | 1.5 |
| RMS[nm] | 14.5 | 3.0 | 2.0 | 5.0 | 2.5 |
| P-V[nm] | 258.5 | 80.4 | 77.2 | 130.2 | 105.4 |

Ra: average surface roughness
RMS: root-mean-square average surface roughness
P-V: maximum height difference

FIG. 48

| Acceleration Voltage | Hydrogen Element Ratio (X:Y) | Hydrogen Ion Species Ratio (X:Y/3) |
|---|---|---|
| 80kV | 01:44.1 | 01:14.7 |
| 60kV | 01:42.5 | 01:14.2 |
| 40kV | 01:43.5 | 01:14.5 |

METHOD FOR MANUFACTURING SEMICONDUCTOR DEVICE

BACKGROUND OF THE INVENTION

1. Field of the Invention

The present invention relates to a method for manufacturing a semiconductor substrate to which a single crystal semiconductor layer is fixed with a buffer layer interposed therebetween and a method for manufacturing a semiconductor device.

2. Description of the Related Art

In recent years, integrated circuits using a silicon-on-insulator (SOI) substrate instead of a bulk silicon wafer have been developed. A feature of a thin single crystal silicon layer formed over an insulating layer can be taken advantage of to form a completely electrically isolated semiconductor layer of a transistor in an integrated circuit and to form a completely depleted transistor. Accordingly, a semiconductor integrated circuit having high added values such as high integration, high-speed operation, and low power consumption can be realized.

Known examples of SOI substrates are SIMOX substrates and bonded substrates. For example, an SOI structure of a SIMOX substrate is obtained by implantation of oxygen ions into a single crystal silicon substrate and by heat treatment performed at 1300° C. or higher to form a buried oxide (BOX) layer, whereby a single crystal silicon thin film is formed on the surface.

An SOI structure of bonded substrates is obtained by bonding of two single crystal silicon substrates (a base substrate and a bond substrate) to each other with an oxide film interposed therebetween and by thinning of one of the single crystal silicon substrates (the bond substrate) on a back side (a side which is opposite to a bonding surface), whereby a single crystal silicon thin film is formed. Because it is difficult to form a uniform and thin single crystal silicon thin film through grinding or polishing, a technique employing hydrogen ion implantation, which is called Smart-Cut (registered trademark), has been proposed (see, for example, Reference 1: Japanese Published Patent Application No. H 5-211128).

A summary of a method for manufacturing this SOI substrate is described. By implantation of hydrogen ions into a silicon wafer, an ion implanted layer is formed at a predetermined depth from the surface. Next, a silicon oxide film is formed by oxidation of another silicon wafer which serves as a base substrate. After that, the silicon wafer into which hydrogen ions are implanted and the silicon oxide film on the other silicon wafer are bonded together to bond the two silicon wafers. Then, through heat treatment, cleavage is caused in the silicon wafer using the ion implanted layer as a cleavage plane, thereby forming a substrate in which a thin single crystal silicon layer is bonded to the base substrate.

In addition, a method for forming an SOI substrate in which a single crystal silicon layer is bonded to a glass substrate is known (see, for example, Reference 2: Japanese Published Patent Application No. H11-097379). In Reference 2, a separation plane is mechanically polished to remove a defective layer which is formed through hydrogen ion implantation or a step of several to several tens of nanometers on the separation plane.

Furthermore, the present applicant has disclosed a method for manufacturing a semiconductor device using Smart Cut (registered trademark), in which a substrate having high heat resistance is used as a supporting substrate, in References 3 and 4 and has disclosed a method for manufacturing a semiconductor device using Smart Cut (registered trademark), in which a light transmitting substrate is used as a supporting substrate, in Reference 5 (Reference 3: Japanese Published Patent Application No. H 11-163363, Reference 4: Japanese Published Patent Application No. 2000-012864, and Reference 5: Japanese Published Patent Application No. 2000-150905).

SUMMARY OF THE INVENTION

Because a glass substrate has a larger area and is less expensive than a silicon wafer, a glass substrate is used as a supporting substrate, whereby an inexpensive large-area SOI substrate can be manufactured. However, a glass substrate has a strain point of 700° C. or lower and thus has low heat resistance. Therefore, a glass substrate cannot be heated at a temperature which exceeds its upper temperature limit, and the process temperature is limited to be 700° C. or lower. That is, there are also limitations on process temperatures for a step of removing a crystal defect at a separation plane and a step of planarizing a surface.

Removal of a crystal defect in a semiconductor layer that is bonded to a silicon wafer has been conventionally achieved by heating at a temperature of 1000° C. or higher; however, such a high temperature process cannot be employed for removal of a crystal defect in a semiconductor layer that is bonded to a glass substrate having a strain point of 700° C. or lower. That is, a re-single-crystallization method has not been established, by which a single crystal semiconductor layer that is bonded to a glass substrate having a strain point of 700° C. or less is recovered to a single crystal semiconductor layer having the same or substantially the same crystallinity as a single crystal semiconductor substrate before processing.

A glass substrate is more easily bent than a silicon wafer and has an undulating surface. In particular, it is difficult to perform treatment by mechanical polishing on a large-area glass substrate having a side that is longer than 30 cm. Accordingly, from the viewpoint of processing accuracy, yield, and the like, treatment by mechanical polishing on a separation plane is not recommended to be used for planarization treatment of a semiconductor layer that is bonded to a supporting substrate. Meanwhile, it is required to suppress unevenness on the surface of the separation plane in order to manufacture high-performance semiconductor elements. This is because when a transistor is manufactured using an SOI substrate, a gate electrode is formed over a semiconductor layer with a gate insulating layer interposed therebetween. Thus, if there is a large unevenness of the semiconductor layer, it is difficult to manufacture a gate insulating layer with high dielectric strength. Therefore, a thick gate insulating layer is needed for higher dielectric strength. Accordingly, large unevenness on the surface of the semiconductor layer causes a decrease in performance of the semiconductor elements such as a decrease in field effect mobility, an increase in threshold voltage, and the like.

In this manner, when a substrate which has low heat resistance and is easily bent, such as a glass substrate, is used as a supporting substrate, a problem emerges in that it is difficult to improve surface unevenness of a semiconductor layer that is separated from a silicon wafer and fixed to the supporting substrate.

In view of such problems, an object of the present invention is to provide a method for manufacturing a semiconductor substrate, by which a high-performance semiconductor element can be formed even when a substrate having low heat resistance is used as a supporting substrate.

A method for manufacturing a semiconductor device of one aspect of the present invention includes the steps of:

preparing a single crystal semiconductor substrate and a supporting substrate; irradiating the single crystal semiconductor substrate with ions that are accelerated with an ion doping apparatus to form a damaged region in a region at a predetermined depth from a surface of the single crystal semiconductor substrate; forming a buffer layer over at least one of the supporting substrate and the single crystal semiconductor substrate; disposing the supporting substrate and the single crystal semiconductor substrate in contact with each other with the buffer layer interposed therebetween to bond the supporting substrate and the single crystal semiconductor substrate to each other; causing a crack in the damaged region by heating the single crystal semiconductor substrate to separate the single crystal semiconductor substrate from the supporting substrate, thereby forming a supporting substrate to which a single crystal semiconductor layer that is separated from the single crystal semiconductor substrate is fixed; and irradiating the single crystal semiconductor layer fixed to the supporting substrate with a laser beam while heating the single crystal semiconductor layer to melt the single crystal semiconductor layer and to perform re-single-crystallization of the single crystal semiconductor layer.

Here, the term "single crystal" means a crystal in which, when a certain crystal axis is focused, the direction of the crystal axis is oriented in the same direction in any portion of a sample and which has no crystal grain boundaries. Note that, in this specification, the single crystal includes a crystal in which the direction of crystal axes is uniform as described above and which has no grain boundaries even when it includes a crystal defect or a dangling bond.

In addition, re-single-crystallization of a single crystal semiconductor layer means that a semiconductor layer having a single crystal structure returns to a single crystal structure after being in a different state from the single crystal structure (e.g., a liquid phase state). In addition, it can be said that re-single-crystallization of a single crystal semiconductor layer means that a single crystal semiconductor layer is recrystallized to form a single crystal semiconductor layer.

By laser beam irradiation, a region irradiated with a laser beam in a single crystal semiconductor layer is melted from the surface partly in a depth direction. For example, the surface and a vicinity of the surface are melted. Alternatively, the region irradiated with the laser beam in the single crystal semiconductor layer is melted entirely in a depth direction.

The laser beam irradiation can be performed while the supporting substrate to which the single crystal semiconductor layer is fixed is heated at a temperature equal to or higher than 400° C. and equal to or lower than the strain point of the supporting substrate. The heating temperature can range from 400° C. to 670° C. The heating temperature is preferably in the range from 450° C. to 650° C., more preferably 500° C. or higher.

It is preferable that a substrate having a strain point of 650° C. to 690° C. be used as the supporting substrate. A glass substrate can be used as the supporting substrate. For example, a non-alkali glass substrate can be used.

It is preferable that the thickness of the single crystal semiconductor layer separated from the single crystal semiconductor substrate be greater than or equal to 20 nm and less than or equal to 200 nm.

The buffer layer can be formed with a film including a single layer or two or more layers. It is preferable that the buffer layer include a barrier layer which can prevent sodium from diffusing from the supporting substrate side. The supporting substrate as well as the single crystal semiconductor layer is heated when irradiated with a laser beam, and the supporting substrate is also heated by heat conduction from the single crystal semiconductor layer which is melted. In the case where impurities (typically, sodium) such as an alkali metal or an alkaline earth metal are contained in the supporting substrate, such impurities might be diffused from the supporting substrate into the single crystal semiconductor layer because of an increase in temperature of the supporting substrate. When the barrier layer is provided, impurities can be prevented from diffusing into the single crystal semiconductor layer.

It is preferable that the buffer layer include an insulating film that is in contact with the single crystal semiconductor layer and contains halogen such as chlorine or fluorine.

The single crystal semiconductor layer is irradiated with a laser beam while the supporting substrate to which the single crystal semiconductor layer is fixed is heated, whereby the length of time the single crystal semiconductor layer is being melted can be increased. When the single crystal semiconductor layer is irradiated with a laser beam at room temperature, the single crystal semiconductor layer is melted for about 100 nanoseconds or less; however, when a heated gas is blown thereto, the length of time the single crystal semiconductor layer is being melted can be increased. It is preferable that the single crystal semiconductor layer be melted for 200 nanoseconds to 1000 nanoseconds. This is because when the length of melting time exceeds 1000 nanoseconds, heat conduction might occur and damage such as melting of a glass substrate that is the supporting substrate might be caused to the substrate.

In a method for manufacturing a semiconductor device of the present invention, it is preferable that a semiconductor layer be irradiated with a laser beam in an inert gas atmosphere. It is also preferable that a single crystal semiconductor layer be irradiated with a laser beam while an inert gas is blown onto a region irradiated with the laser beam on the upper surface of the single crystal semiconductor layer. As the inert gas, a nitrogen gas or a noble gas can be used. The inert gas refers to a gas of molecules or atoms that do not form an oxide film by reacting with the surface of the single crystal semiconductor layer in the laser beam irradiation step. Examples of inert gases include a nitrogen gas ($N_2$ gas), noble gases such as argon and xenon, and the like.

In a method for manufacturing a semiconductor device of the present invention, a cross-sectional shape of the laser beam with which the single crystal semiconductor layer is irradiated can be linear, square, or rectangular. By scanning with a laser beam having such a cross-sectional shape, a position where melting and recrystallization occur can be moved.

The single crystal semiconductor layer fixed to the supporting substrate is melted by being irradiated with a laser beam while being heated, whereby many effects given below can be obtained. Note that it is acceptable as long as a method for manufacturing a semiconductor device of the present invention can provide at least one of the effects below.

When the single crystal semiconductor layer is heated, the length of time the single crystal semiconductor layer is being melted can be made longer than when not heated. Accordingly, planarity of an irradiation surface is significantly improved by the action of surface tension.

When the single crystal semiconductor layer is heated, a dangling bond in the single crystal semiconductor layer or a microdefect such as an interfacial defect between the single crystal semiconductor layer and a base film can be removed, whereby a better single crystal semiconductor layer can be obtained. A region irradiated with a laser beam in the single crystal semiconductor layer while being heated is heated to a temperature equal to or higher than its melting point and is thus melted. Then, the melted portion is recrystallized by being solidified. As a result of re-single-crystallization in this manner, a single crystal semiconductor layer having excellent properties can be obtained.

By an increase in the length of melting time, a single crystal semiconductor layer can be irradiated with a laser beam before the single crystal semiconductor layer is solidified after it is melted by being irradiated with the previous laser beam. Therefore, the number of shots can be reduced. A reduction in the number of shots contributes to an improvement in productivity. In laser beam scanning, the percentage of overlap of one shot with the subsequent shot is also referred to as overlap percentage. By extension of melting time, the overlap percentage can be reduced to about one tenth of that when heating is not performed, and can also be reduced to 0%.

When the supporting substrate to which the single crystal semiconductor layer is fixed is heated during laser beam irradiation, the energy of a laser beam needed to melt the single crystal semiconductor layer can be reduced. If the required energy of a laser beam can be reduced, the life of a laser can be extended as well as decreasing power consumption. By extension of the life of the laser, the interval of time between component replacements can be lengthened; therefore, productivity can be improved.

By heating of the single crystal semiconductor layer during laser beam irradiation, the number of laser beam shots used for planarization of the surface of the single crystal semiconductor layer can be reduced. A reduction in the number of shots contributes to an improvement in productivity.

In addition to the increase in the length of time the single crystal semiconductor layer is being melted, the cooling rate of the melted single crystal semiconductor layer can be reduced compared with natural cooling. If the cooling rate of the melted single crystal semiconductor layer can be reduced compared with natural cooling, re-single-crystallization smoothly proceeds due to the extension of melting time, and a single crystal semiconductor layer with no grain boundary can be obtained.

By scanning with a laser beam having a linear, square, or rectangular irradiation area, a position where melting and recrystallization occur can be moved, and the melting time is extended. Accordingly, refinement of a single crystal is partly performed in the single crystal semiconductor layer and a single crystal semiconductor layer which contains a smaller amount of impurities can be obtained.

When an insulating film that is in contact with the single crystal semiconductor layer contains a halogen, the halogen can be diffused from the insulating film and segregated at the interface between the single crystal semiconductor layer and the insulating film because the insulating film is also heated by laser beam irradiation. By segregation of a halogen at the interface between the single crystal semiconductor layer and the insulating film, the halogen can capture mobile ions such as sodium which are present at the interface. Therefore, in the case where a glass substrate is used as the supporting substrate, formation of an insulating film that contains a halogen and a laser beam irradiation process with heating are very effective for preventing contamination by an impurity such as sodium.

In the above References 1 to 5, the main process for planarization of a single crystal semiconductor layer is mechanical polishing; therefore, an object of the present invention to use a glass substrate having a strain point of 700° C. or lower, a mode for extension of melting time, and an effect are not assumed at all. Thus, the above References 1 to 5 differ widely from the present invention.

The present invention provides a novel innovative technique for a method for obtaining a better single crystal by irradiating a single crystal semiconductor layer with a laser beam and melting a part or whole of the single crystal semiconductor layer to perform recrystallization. In addition, such a method of using a laser beam is not assumed in conventional techniques at all and is a completely novel concept.

By a method for manufacturing a semiconductor substrate of the present invention, a single crystal semiconductor layer which is obtained by being separated from a single crystal semiconductor substrate can be recrystallized by being heated at a process temperature of 700° C. or less, and its crystallinity can be recovered. In addition, the single crystal semiconductor layer which is obtained by being separated from the single crystal semiconductor substrate can be planarized at a process temperature of 700° C. or less. Therefore, even if a substrate having low heat resistance is used as a supporting substrate, a high-performance semiconductor element can be formed by using a semiconductor substrate. For example, by using a light-transmitting glass substrate having a large area, a high-performance display device can be formed.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIGS. 34A and 34B are photographs of waveforms of signals input to an oscilloscope.

FIG. 35 is a schematic graph of a signal waveform corresponding to intensity of probe light.

FIG. 40 is a table showing observed images and surface roughnesses of surfaces of single crystal silicon layers, which are measured with an atomic force microscope.

FIG. 48 is a table of fitting parameters (hydrogen element ratios and hydrogen ion species ratios) of the fitting functions shown in FIGS. 45 to 47.

DETAILED DESCRIPTION OF THE INVENTION

Figure 1:
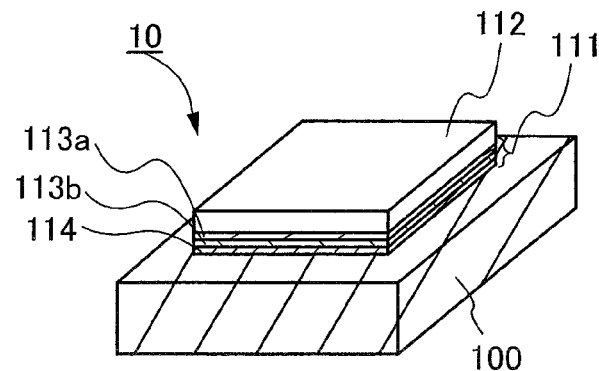
FIG. 1 shows an external view of an example of a structure of a semiconductor substrate.

The present invention is hereinafter described. The present invention can be embodied in many different modes, and it is easily understood by those skilled in the art that the mode and detail of the present invention can be modified in various ways without departing from the spirit and scope thereof. Thus, the present invention is not interpreted as being limited to the description in Embodiment Modes and Embodiments. In addition, components denoted by the same reference numerals in different diagrams represent the same components, and repetitive description of the material, shape, manufacturing method, or the like is omitted.

Embodiment Mode 1

In this embodiment mode, a semiconductor substrate in which a single crystal semiconductor layer is fixed to a supporting substrate with a buffer layer interposed therebetween and a manufacturing method thereof will be described.

FIG. 1 shows a perspective view of an example of a structure of a semiconductor substrate. In a semiconductor substrate 10, a single crystal semiconductor layer 112 is fixed to a supporting substrate 100 with a buffer layer 111 interposed therebetween. The single crystal semiconductor layer 112 is formed by thinning of a single crystal semiconductor substrate. The single crystal semiconductor layer 112 is fixed to the supporting substrate 100 by bonding of the surface of the buffer layer 111 and the surface of the supporting substrate 100 to each other. The semiconductor substrate 10 is a substrate having a so-called SOI structure, in which a single crystal semiconductor layer is formed over an insulating layer.

The buffer layer 111 may have a single layer structure or a multilayer structure in which two or more films are stacked. A film included in the buffer layer 111 is formed over a surface of the single crystal semiconductor substrate by a film formation process. In this embodiment mode, the buffer layer 111 has a three-layer structure in which a second insulating layer 114, a first insulating layer 113b, and a first insulating layer 113a are stacked from the supporting substrate 100 side.

In the semiconductor substrate 10 of FIG. 1, the second insulating layer 114 is a film which functions as a bonding layer. That is, a surface of the second insulating layer 114 and a surface of the supporting substrate 100 are bonded to each other, whereby the single crystal semiconductor layer 112 is fixed to the supporting substrate 100.

The first insulating layer 113a is an insulating film which functions as a barrier layer. The barrier layer is a film which prevents impurities that may decrease reliability of a semiconductor device, such as an alkali metal or an alkaline earth metal (typically, sodium), from entering the single crystal semiconductor layer 112 from the supporting substrate 100 side during manufacture of the semiconductor substrate and during manufacture of the semiconductor device by use of this semiconductor substrate. By formation of the barrier layer, a semiconductor substrate and a semiconductor device can be prevented from being contaminated by impurities; therefore, reliability thereof can be improved.

The single crystal semiconductor layer 112 is a layer which is formed by thinning of a single crystal semiconductor substrate. As the single crystal semiconductor substrate, a commercially available semiconductor substrate can be used. For example, a single crystal semiconductor substrate that is formed of a group 14 element, such as a single crystal silicon substrate, a single crystal germanium substrate, or a single crystal silicon germanium substrate can be used. In addition, a compound semiconductor substrate of gallium arsenide, indium phosphide, or the like can be used.

As the supporting substrate 100, a substrate having an insulating surface is used. Specific examples include: a variety of glass substrates used in the electronic industries, such as substrates using aluminosilicate glass, aluminoborosilicate glass, and barium borosilicate glass; a quartz substrate; a ceramic substrate; and a sapphire substrate. It is preferable that a glass substrate be used as the supporting substrate 100. It is preferable that a glass substrate have a coefficient of thermal expansion of $25 \times 10^{-7}/°$ C. to $50 \times 10^{-7}/°$ C. (more preferably, $30 \times 10^{-7}/°$ C. to $40 \times 10^{-7}/°$ C.) and a strain point of 580° C. to 700° C. (more preferably, 650° C. to 690° C.). It is also preferable that the glass substrate be a non-alkali glass substrate in order to suppress contamination of a semiconductor device. Examples of materials of non-alkali glass substrates include glass materials such as aluminosilicate glass, aluminoborosilicate glass, and barium borosilicate glass, and the like. For example, it is preferable that a non-alkali glass substrate (product name: AN100), a non-alkali glass substrate (product name: EAGLE2000 (registered trademark)), or a non-alkali glass substrate (product name: EAGLE XG (registered trademark)) be used as the supporting substrate 100.

The non-alkali glass substrate (AN100) has the following physical properties: the specific gravity, 2.51 g/cm$^3$; the Poisson's ratio, 0.22; the Young's modulus, 77 GPa; and the coefficient of thermal expansion, $38 \times 10^{-7}/°$ C.

The non-alkali glass substrate (EAGLE2000 (registered trademark)) has the following physical properties: the specific gravity, 2.37 g/cm$^3$; the Poisson's ratio, 0.23; the Young's modulus, 70.9 GPa; and the coefficient of thermal expansion, $31.8 \times 10^{-7}/°$ C.

Examples of substrates that can be used as the supporting substrate 100 other than glass substrates are as follows: insulating substrates made of insulators such as a ceramic substrate, a quartz substrate, and a sapphire substrate; conductive substrates made of conductors such as a metal substrate and a stainless steel substrate; and semiconductor substrates made of semiconductors such as a silicon substrate and a gallium arsenide substrate; and the like. In addition, it is preferable that the supporting substrate 100 be a light transmitting substrate such as a glass substrate or a quartz substrate. By use of a light transmitting substrate, the semiconductor substrate 10 which is suitable for manufacture of display devices can be formed.

A method for manufacturing the semiconductor substrate 10 shown in FIG. 1 will be hereinafter described with reference to FIG. 3, FIGS. 4A to 4E, and FIGS. 5A and 5B.

Figure 3:
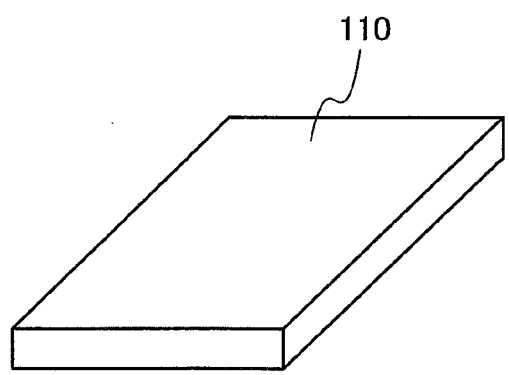
FIG. 3 shows an external view of a single crystal semiconductor substrate used for manufacture of a semiconductor substrate.

First, a single crystal semiconductor substrate 110 is prepared. The single crystal semiconductor substrate 110 is processed into a desired size and shape. FIG. 3 shows an external view of the single crystal semiconductor substrate 110. In consideration of the facts that the single crystal semiconductor substrate 110 is bonded to the supporting substrate 100 having a rectangular shape and that a light exposure region of a light exposure apparatus such as a stepper is rectangular, and the like, it is preferable that the shape of the single crystal semiconductor substrate 110 be rectangular as shown in FIG. 3. Note that a rectangle also includes a square and an oblong unless otherwise specified.

Needless to say, the shape of the single crystal semiconductor substrate 110 is not limited to that shown in FIG. 3. For example, a circular substrate, a polygonal substrate such as a pentagonal substrate or a hexagonal substrate can be used. It is natural that a commercially available circular single crystal semiconductor wafer can also be used as the single crystal semiconductor substrate 110.

Examples of circular single crystal semiconductor wafers include semiconductor wafers of silicon, germanium, and the like and compound semiconductor wafers of gallium arsenide, indium phosphide, and the like. Typical known examples of single crystal semiconductor wafers are circular single crystal silicon wafers which are 5 inches (125 mm) in diameter, 6 inches (150 mm) in diameter, 8 inches (200 mm) in diameter, 12 inches (300 mm) in diameter, 400 mm in diameter, and 450 mm in diameter.

The single crystal semiconductor substrate 110 having a rectangular shape can be formed by cutting of a circular single crystal semiconductor wafer. To cut the substrate, a cutting apparatus such as a dicer or a wire saw, a cutting means such as a laser cutter, a plasma cutter, or an electron beam cutter, or the like can be used. Alternatively, the single crystal semiconductor substrate 110 having a rectangular shape can be formed as follows: an ingot used for manufacturing semiconductor substrates is processed into a rectangular solid so that it has a rectangular cross section before being sliced into substrates and then this ingot that is a rectangular solid is sliced.

Although there is no particular limitation on the thickness of the single crystal semiconductor substrate 110, it is preferable that the single crystal semiconductor substrate 110 be thick in view of reuse of the single crystal semiconductor substrate 110 so that a larger number of single crystal semiconductor layers 112 can be formed from a single piece of material wafer. The thickness of commercially available single crystal silicon wafers conforms to SEMI Standards, which specify that, for example, a wafer of 6 inches in diameter is 625 µm thick, a wafer of 8 inches in diameter is 725 µm thick, and a wafer of 12 inches in diameter is 775 µm thick. Note that the thickness of a wafer conforming to SEMI standards has a tolerance of +25 µm. Needless to say, the thickness of the single crystal semiconductor substrate that serves as a material is not limited to those in SEMI standards, and the thickness can be adjusted as appropriate when an ingot is sliced. Needless to say, when a reprocessed single crystal semiconductor substrate 110 is used, the thickness thereof is thinner than that of SEMI standards.

Note that, in the case where a substrate formed of a group 14 element having a diamond structure as a crystal structure, such as a single crystal silicon substrate, is used as the single crystal semiconductor substrate 110, the plane orientation of its main surface may be (100), (110), or (111). By use of the single crystal semiconductor substrate 110 with (100) orientation, the interface state density between the single crystal semiconductor layer 112 and an insulating layer formed on the surface thereof can be reduced, which is preferable for manufacture of a field effect transistor.

By use of the single crystal semiconductor substrate 110 having a (110) main surface, an element that forms the second insulating layer 114 is closely coupled with a group 14 element (e.g., silicon) that forms the single crystal semiconductor layer 112 at a bonding surface between the second insulating layer 114 and the single crystal semiconductor layer 112, whereby bonding strength between the second insulating layer 114 and the single crystal semiconductor layer 112 is improved.

By use of the single crystal semiconductor substrate 110 having a (110) main surface, atoms are more densely arranged on the main surface than on a surface with different plane orientation; therefore, planarity of the single crystal semiconductor layer 112 is improved. Accordingly, a transistor which is formed using the single crystal semiconductor layer 112 having a (110) main surface has excellent electrical characteristics such as a small subthreshold swing and a high field-effect mobility. Note that a single crystal semiconductor substrate having a (110) main surface has advantages over a single crystal semiconductor substrate having a (100) main surface in that it has a high Young's modulus and is likely to be cleaved.

Figure 4A:
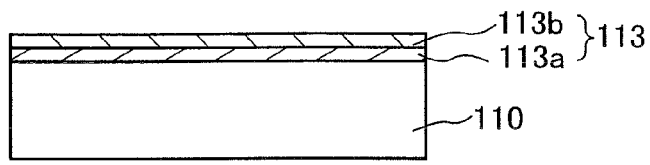
FIGS. 4A to 4E show cross-sectional views illustrating a method for manufacturing a semiconductor substrate.

First, the single crystal semiconductor substrate 110 is washed and cleaned. Next, as shown in FIG. 4A, a first insulating layer 113 is formed over the single crystal semiconductor substrate 110. The first insulating layer 113 can have a single layer structure or a multilayer structure including two or more layers. The thickness of the first insulating layer 113 can be set in the range of from 5 nm to 400 nm. As a film included in the first insulating layer 113, an insulating film containing silicon or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including metal oxide such as aluminum oxide, tantalum oxide, or hafnium oxide; an insulating film including metal nitride such as aluminum nitride; an insulating film including metal oxynitride such as an aluminum oxynitride film; or an insulating film including metal nitride oxide such as an aluminum nitride oxide film can also be used.

An insulating film included in the first insulating layer 113 can be formed by a chemical vapor deposition (CVD) method, a sputtering method, an atomic layer epitaxy (ALE) method, or a method of, for example, oxidizing or nitriding the single crystal semiconductor substrate 110. CVD methods include a low-pressure CVD method, a thermal CVD method, a plasma-enhanced CVD method (hereinafter referred to as a PECVD method), and the like. A PECVD method is preferable because it is low-temperature treatment at 350° C. or less and has a higher deposition rate than other CVD methods.

Note that in this specification, oxynitride refers to a substance which contains more oxygen atoms than nitrogen atoms, and nitride oxide refers to a substance which contains more nitrogen atoms than oxygen atoms. For example, an example of silicon oxynitride is a substance that contains oxygen, nitrogen, silicon, and hydrogen at concentrations ranging from 50 at. % to 70 at. %, 0.5 at. % to 20 at. %, 25 at. % to 35 at. %, and 0.1 at. % to 10 at. %, respectively. Further, an example of silicon nitride oxide is a substance that contains more nitrogen than oxygen and contains oxygen, nitrogen, silicon, and hydrogen at concentrations ranging from 5 at. % to 30 at. %, 20 at. % to 55 at. %, 25 at. % to 35 at. %, and 10 at. % to 30 at. %, respectively.

The first insulating layer 113 preferably includes at least one insulating film which functions as a barrier layer for preventing sodium from entering the single crystal semiconductor layer 112. The first insulating layer 113 may include either one barrier layer or two or more barrier layers. For example, in the case where a substrate containing impurities that may reduce reliability of a semiconductor device, such as an alkali metal, an alkaline earth metal, or the like (typically, a glass substrate) is used as the supporting substrate 100, such impurities might diffuse into the single crystal semiconductor layer 112 from the supporting substrate 100 when the supporting substrate 100 is heated. Therefore, by formation of the barrier layer, such impurities that may reduce reliability of a semiconductor device such as an alkali metal, an alkaline earth metal, or the like can be prevented from being moved to the single crystal semiconductor layer 112. Examples of the film which functions as a barrier layer are as follows: a silicon nitride film, a silicon nitride oxide film, an aluminum nitride film, an aluminum nitride oxide film, and the like. When including such a film, the first insulating layer 113 can function as a barrier layer.

For example, in the case where the first insulating layer 113 has a single layer structure, the first insulating layer 113 is preferably formed of a film which functions as a barrier layer. In this case, the first insulating layer 113 having a single layer structure can be formed of a silicon nitride film, a silicon nitride oxide film, an aluminum nitride film, or an aluminum nitride oxide film having a thickness of 5 nm to 200 nm.

When the first insulating layer 113 is a film having a two-layer structure including one barrier layer, the upper layer is formed of a barrier layer for blocking impurities such as sodium. The upper layer can be formed of a silicon nitride film, a silicon nitride oxide film, an aluminum nitride film, or an aluminum nitride oxide film having a thickness of 5 nm to 200 nm. These films which function as barrier layers have a high blocking effect for preventing impurity diffusion, but their internal stress is high. Therefore, as the lower insulating film which is in contact with the single crystal semiconductor substrate 110, a film with an effect of relieving the stress of the upper insulating film is preferable. As the insulating film having such an effect, a silicon oxide film, a silicon oxynitride film, a thermal oxide film formed by thermal oxidation of the single crystal semiconductor substrate 110, and the like are given. The lower insulating film can be formed at a thickness of from 5 nm to 300 nm.

In this embodiment mode, the first insulating layer 113 has a two-layer structure including the first insulating layer 113a and the first insulating layer 113b. Examples of combinations of the first insulating layer 113a and the first insulating layer 113b which enable the first insulating layer 113 to function as a blocking film are as follows: a silicon oxide film and a silicon nitride film; a silicon oxynitride film and a silicon nitride film; a silicon oxide film and a silicon nitride oxide film; a silicon oxynitride film and a silicon nitride oxide film; and the like.

For example, as the first insulating layer 113a that is the lower layer, a silicon oxynitride film can be formed using $SiH_4$ and $N_2O$ as a process gas by a PECVD method. Alternatively, as the first insulating layer 113a, a silicon oxide film can be formed using an organosilane gas and oxygen as a process gas by a PECVD method. Further alternatively, as the first insulating layer 113a, an oxide film can be formed by oxidation of the single crystal semiconductor substrate 110.

Organosilane refers to compounds such as tetraethoxysilane (TEOS) (chemical formula: $Si(OC_2H_5)_4$), tetramethylsilane (TMS) (chemical formula: $Si(CH_3)_4$), tetramethylcyclotetrasiloxane (TMCTS), octamethylcyclotetrasiloxane (OMCTS), hexamethyldisilazane (HMDS), triethoxysilane (chemical formula: $SiH(OC_2H_5)_3$), and trisdimethylaminosilane (chemical formula: $SiH(N(CH_3)_2)_3$).

As the first insulating layer 113b that is the upper layer, a silicon nitride oxide film can be formed using $SiH_4$, $N_2O$, $NH_3$, and $H_2$ as a process gas by a PECVD method, or a silicon nitride film can be formed using $SiH_4$, $N_2$, $NH_3$, and $H_2$ as a process gas by a PECVD method.

For example, in the case where the first insulating layer 113a using silicon oxynitride and the first insulating layer 113b using silicon nitride oxide are formed by a PECVD method, the single crystal semiconductor substrate 110 is carried into a chamber of a PECVD apparatus. Then, $SiH_4$ and $N_2O$ are supplied to the chamber as a process gas for formation of the first insulating layer 113a, and plasma of this process gas is generated, whereby a silicon oxynitride film is formed over the single crystal semiconductor substrate 110. Next, the gas introduced into the chamber is changed to a process gas for formation of the first insulating layer 113b. Here, $SiH_4$, $NH_3$, $H_2$, and $N_2O$ are used. Plasma of a mixed gas of these is generated, and a silicon nitride oxide film is formed over a silicon oxynitride film in succession. In the case where a PECVD apparatus having a plurality of chambers is used, a silicon oxynitride film and a silicon nitride oxide film can be formed in different chambers. Needless to say, by change of a gas introduced into the chamber, a silicon oxide film can be formed as the lower layer and a silicon nitride film can be formed as the upper layer.

When the first insulating layer 113a and the first insulating layer 113b are formed as described above, the first insulating layer 113 can be formed over the single crystal semiconductor substrate 110 with high throughput. In addition, because the first insulating layer 113a and the first insulating layer 113b can be formed without exposure to the atmosphere, the interface between the first insulating layer 113a and the first insulating layer 113b can be prevented from being contaminated by the atmosphere.

Alternatively, as first insulating layer 113a, an oxide film can be formed by thermal oxidation treatment of the single crystal semiconductor substrate 110. The thermal oxidation treatment to form this oxide film may be dry oxidation, and it is preferable to add a halogen-containing gas to an oxidizing atmosphere. By oxidation of the single crystal semiconductor substrate 110 in a halogen-containing atmosphere, a halogen-containing oxide film can be formed as the first insulating layer 113a. As a halogen-containing gas, a kind or plural kinds of gases selected from HCl, HF, $NF_3$, HBr, $Cl_2$, ClF, $BCl_3$, $F_2$, $Br_2$, and the like can be used.

For example, heat treatment of the single crystal semiconductor substrate 110 is performed at a temperature of 700° C. or higher in an atmosphere containing HCl at 0.5 volume % to 10 volume % (preferably, 3 volume %) with respect to oxygen. Thermal oxidation is preferably performed at a heating temperature of 950° C. to 1100° C. Treatment time may be 0.1 to 6 hours, preferably 0.5 to 1 hour. The thickness of the oxide film formed on the single crystal semiconductor substrate 110 can be set to 10 nm to 1000 nm (preferably, 50 nm to 200 nm), for example, 100 nm.

Through oxidation treatment within such a temperature range, a gettering effect with a halogen element can be obtained. Gettering particularly has the effect of removing a metal impurity. That is, by the action of chlorine, an impurity such as a metal becomes a volatile chloride and is released into a gas phase, thereby being removed from the single crystal semiconductor substrate 110. In addition, because a dangling bond at the surface of the single crystal semiconductor substrate 110 is terminated with a halogen element used in the oxidation treatment, the localized level density at the interface between the oxide film and the single crystal semiconductor substrate 110 can be reduced.

By this thermal oxidation treatment in the halogen-containing atmosphere, the oxide film can be made to contain a halogen. When containing a halogen element at a concentration of $1\times10^{17}$ atoms/cm$^3$ to $5\times10^{20}$ atoms/cm$^3$, the oxide film can function as a protective film which prevents contamination of the single crystal semiconductor layer 112 by capturing impurities such as a metal in the semiconductor substrate 10.

The first insulating layer 113a can also be made to contain a halogen by being formed in a chamber of a PECVD apparatus containing a fluoride gas or a fluorine gas. A process gas for formation of the first insulating layer 113a is introduced into such a chamber; this process gas is excited to generate plasma; and the first insulating layer 113a is formed over the single crystal semiconductor substrate 110 by chemical reaction of active species contained in the plasma.

A chamber of a PECVD apparatus can be made to contain a fluorine compound gas by cleaning of the chamber through plasma gas etching using a fluoride gas. When a film is formed with a PECVD apparatus, a reaction product of a material is deposited not only on a substrate surface but also on an inner wall, an electrode, a substrate holder, and the like of the chamber. This deposit is a cause of a particle or dust. Accordingly, cleaning steps are regularly performed to remove such a deposit. One of typical chamber cleaning methods is a plasma gas etching method. In this method, a fluoride gas such as $NF_3$ is introduced into a chamber, the fluoride gas is excited to generate plasma so that fluorine radicals are generated, and a deposit is removed by etching A fluoride which is produced by reacting with the fluorine radicals is removed from a chamber by an exhaust system because of its high vapor pressure.

Through cleaning by plasma gas etching, a fluoride gas used as a cleaning gas is adsorbed to an inner wall of the chamber and an electrode and various jigs provided in the chamber. That is, the chamber can be made to contain a fluoride gas. Note that, a method for making the chamber contain a fluoride gas includes a method in which a fluoride gas is introduced into the chamber after the single crystal semiconductor substrate 110 that is disposed on a tray is placed in the chamber, as well as a method in which the chamber is cleaned with a fluoride gas so that the fluoride gas remains in the chamber.

In the case where a silicon oxynitride film is formed as the first insulating layer 113a from, for example, $SiH_4$ and $N_2O$ by a PECVD method, $SiH_4$ and $N_2O$ are supplied to the chamber and excited to generate plasma, whereby the fluoride gas which remains in the chamber is also excited so that fluorine radicals are generated. Accordingly, the silicon oxynitride film can be made to contain fluorine. In addition, because the amount of the fluoride which remains in the chamber is very small and the fluoride gas is not supplied during formation of the silicon oxynitride film, fluorine is taken into the silicon oxynitride film at an early stage of formation thereof. Thus, the first insulating layer 113a can be made to have high fluorine concentration at the interface between the single crystal semiconductor substrate 110 and the first insulating layer 113a or at the periphery thereof. That is, the first insulating layer 113 of the semiconductor substrate 10 of FIG. 1 can be made to have high fluorine concentration at the interface between the first insulating layer 113 and the single crystal semiconductor layer 112 or at the periphery thereof.

When fluorine is contained in such a region, a dangling bond of a semiconductor at the interface with the single crystal semiconductor layer 112 can be terminated with fluorine. Therefore, the interface state density between the single crystal semiconductor layer 112 and the first insulating layer 113 can be reduced. In addition, even when impurities such as sodium are diffused into the first insulating layer 113 from the supporting substrate 100, by the presence of fluorine, a metal can be captured by fluorine. Thus, metal contamination of the single crystal semiconductor layer 112 can be prevented.

Instead of the fluoride gas, a fluorine ($F_2$) gas can be contained in the chamber. A fluoride is a compound that contains fluorine (F) in its composition. As the fluoride gas, a gas selected from $OF_2$, $ClF_3$, $NF_3$, $F_3NO$, $F_3NO$, $SF_6$, $SF_5NO$, $SOF_2$, and the like can be used.

An oxide film can also be formed on the single crystal semiconductor substrate 110 by a method other than thermal oxidation treatment at a temperature of 700° C. or higher. For example, an oxide film can be formed on the single crystal semiconductor substrate 110 by plasma treatment with plasma including oxygen radicals (O radicals) or hydroxide radicals (OH radicals), by high-density plasma treatment, by oxidation treatment with ozone-containing water ($O_3$ water).

Note that because thermal oxidation treatment is a high-temperature process, thermal stress is likely to be generated; thus, a crystal defect such as dislocation glide is likely to be caused in the single crystal semiconductor substrate 110. Therefore, when the first insulating layer 113 is formed by oxidation treatment of the single crystal semiconductor substrate 110, low-temperature treatment at 700° C. or lower such as oxidation treatment with ozone-containing water, or the like is more preferable than thermal oxidation treatment.

Figure 4B:
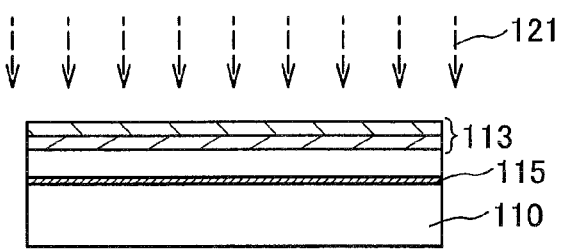

Next, a damaged region 115 where a crystal structure is damaged is formed in the single crystal semiconductor substrate 110 at a predetermined depth by irradiation of the single crystal semiconductor substrate 110 with ions having kinetic energy. FIG. 4B shows a cross-sectional view illustrating a step of forming the damaged region 115. As shown in FIG. 4B, by irradiation of the single crystal semiconductor substrate 110 through the first insulating layer 113 with ions 121 that are accelerated, the ions are added to a region at a predetermined depth from a surface of the single crystal semiconductor substrate 110, whereby the damaged region 115 can be formed. The ions 121 are obtained as follows: a source gas is excited to generate plasma of the source gas, and ions included in the plasma are extracted from the plasma by the action of an electric field and are then accelerated. Thus, when the single crystal semiconductor substrate 110 is irradiated with the ions 121, an embrittled layer where a crystal structure is brittle is formed in the single crystal semiconductor substrate 110 at a predetermined depth due to the impact of the ions 121 that are accelerated. This layer is the damaged region 115.

The depth of the region where the damaged region 115 is formed can be adjusted by the acceleration energy of the ions 121 and the incident angle of the ions 121. The acceleration energy can be adjusted by acceleration voltage, dosage, or the like. The damaged region 115 is formed in a region at the same or substantially the same depth as the average penetration depth of the ions 121. Thus, the thickness of a single crystal semiconductor layer 117 separated from the single crystal semiconductor substrate 110 is determined by the depth to which the ions 121 are added. The depth at which the damaged region 115 is formed is adjusted so that the thickness of this single crystal semiconductor layer becomes 20 nm to 200 nm, preferably, 50 nm to 200 nm.

The damaged region 115 can be formed by ion doping treatment. The ion doping treatment can be performed using an ion doping apparatus. A typical ion doping apparatus is a non-mass-separation apparatus with which an object that is disposed in a chamber is irradiated with all ion species in plasma that is generated by excitation of a process gas. The non-mass-separation apparatus is an apparatus with which an object is irradiated with all ion species without mass separation of ion species in plasma. In contrast, an ion implantation apparatus is a mass-separation apparatus. The ion implantation apparatus is an apparatus with which an object is irradiated with ion species having a specific mass through mass separation of ion species in plasma.

Main components of the ion doping apparatus are as follows: a chamber in which an object is disposed; an ion source for generating desired ions; and an acceleration mechanism for acceleration of ions and for irradiation therewith. The ion source includes a gas supply device for supplying a source gas to generate a desired ion species, an electrode for exciting the source gas to generate plasma, and the like. As the electrode for generating plasma, a filament electrode, a capacitive coupling high-frequency discharging electrode, or the like is used. The acceleration mechanism includes electrodes such as an extraction electrode, an acceleration electrode, a deceleration electrode, and a ground electrode; a power source for supplying power to these electrodes; and the like. These electrodes that are included in the acceleration mechanism are provided with a number of openings or slits, through which ions that are generated from the ion source are accelerated. Note that the components of the ion doping apparatus are not limited to the above-mentioned components, and a mechanism as needed is provided.

In this embodiment mode, hydrogen is added to a semiconductor wafer with the ion doping apparatus. A hydrogen-containing gas is supplied as a plasma source gas. For example, $H_2$ is supplied. Plasma is generated by excitation of a hydrogen gas; ions included in plasma are accelerated without mass separation; and the single crystal semiconductor substrate 110 is irradiated with the accelerated ions.

In the ion doping apparatus, the percentage of $H_3^+$ to the total amount of ion species ($H^+$, $H_2^+$, and $H_3^+$) that are generated from a hydrogen gas is set to be 50% or higher. Preferably, the percentage of $H_3^+$ is set to be 80% or higher. Because mass separation is not performed in the ion doping apparatus, the percentage of one kind to plural kinds of ion species that are generated in plasma is preferably 50% or higher, more preferably 80% or higher. By irradiation with ion species having the same mass, ions can be added in a concentrated manner to the same depth in the single crystal semiconductor substrate 110.

In order to form the damaged region 115 in a shallow region, the acceleration voltage for the ions 121 needs to be low. By an increase in the percentage of $H_3^+$ ions in plasma, atomic hydrogen (H) can be added to the single crystal semiconductor substrate 110 with high efficiency. Because the mass of an $H_3^+$ ion is three times as large as that of an $H^+$ ion, when one hydrogen atom is added to the same depth, the acceleration voltage for an $H_3^+$ ion can be three times as high as that of an $H^+$ ion. When the acceleration voltage for ions can be increased, the cycle time for an ion irradiation step can be shortened, and productivity and throughput can be improved.

The step of irradiating the single crystal semiconductor substrate 110 with the ions 121 that are accelerated can also be performed with an ion implantation apparatus. The ion implantation apparatus is a mass-separation apparatus with which an object that is disposed in a chamber is irradiated with a specific ion species through mass separation of a plurality of ion species that are generated by plasma excitation of a source gas. Thus, when an ion implantation apparatus is used, H+ ions and H2+ ions that are generated by excitation of a hydrogen gas are subjected to mass separation, and either H+ ions or H2+ ions are accelerated, with which the single crystal semiconductor substrate 110 is irradiated.

It is preferable that the damaged region 115 contain hydrogen (H) at $5\times10^{20}$ atoms/cm$^3$ or higher. When a high-concentration hydrogen-added region is locally formed in the single crystal semiconductor substrate 110, the crystal structure is impaired and microvoids are formed. Thus, the damaged region 115 has a porous structure. Therefore, by heat treatment at a relatively low temperature (at 600° C. or lower), a change occurs in the volume of the microvoids formed in the damaged region 115, which allows the single crystal semiconductor substrate 110 to be cleaved along the damaged region 115. Note that the concentration of hydrogen contained in the damaged region 115 is controlled by the dosage, acceleration voltage, or the like of the ions 121.

In the case where the ions are added to the single crystal semiconductor substrate 110 with an ion doping apparatus by using a hydrogen gas, the acceleration voltage can be set in the range of 10 kV to 200 kV and the dosage can be set in the range of $1\times10^{16}$ ions/cm$^2$ to $6\times10^{16}$ ions/cm$^2$. By addition of hydrogen ions under the conditions, the damaged region 115 can be formed in a region of the single crystal semiconductor substrate 110 at a depth of 50 nm to 500 nm, although depending on ion species included in the ions 121 and percentages thereof.

For example, in the case where the single crystal semiconductor substrate 110 is a single crystal silicon substrate, the first insulating layer 113a is a 50-nm-thick silicon oxynitride film, and the first insulating layer 113b is a 50-nm-thick silicon nitride oxide film, a single crystal semiconductor layer with a thickness of approximately 100 nm can be separated from the single crystal semiconductor substrate 110 under the following conditions; the source gas is hydrogen, the acceleration voltage is 40 kV, and the dosage is $2.2\times10^{16}$ ions/cm$^2$. When doping with hydrogen ions is performed under the aforementioned conditions except that the first insulating layer 113a is a 100-nm-thick silicon oxynitride film, a single crystal semiconductor layer with a thickness of approximately 70 nm can be separated from the single crystal semiconductor substrate 110.

Helium (He) can alternatively be used as a source gas of the ions 121. Most of ion species produced by excitation of helium is He+; therefore, the single crystal semiconductor substrate 110 can be irradiated mainly with He+ as the ions 121 even by an ion doping method which does not involve mass separation. Accordingly, microvoids can be efficiently formed in the damaged region 115 by an ion doping method. In the case where the single crystal semiconductor substrate 110 is irradiated with ions by an ion doping method using helium, the acceleration voltage can be set to be 10 kV to 200 kV and the dosage can be set to be $1\times10^{16}$ ions/cm$^2$ to $6\times10^{16}$ ions/cm$^2$.

A halogen gas such as a chlorine gas (Cl$_2$ gas) or a fluorine gas (F$_2$ gas) can also be used as the source gas.

Figure 41:
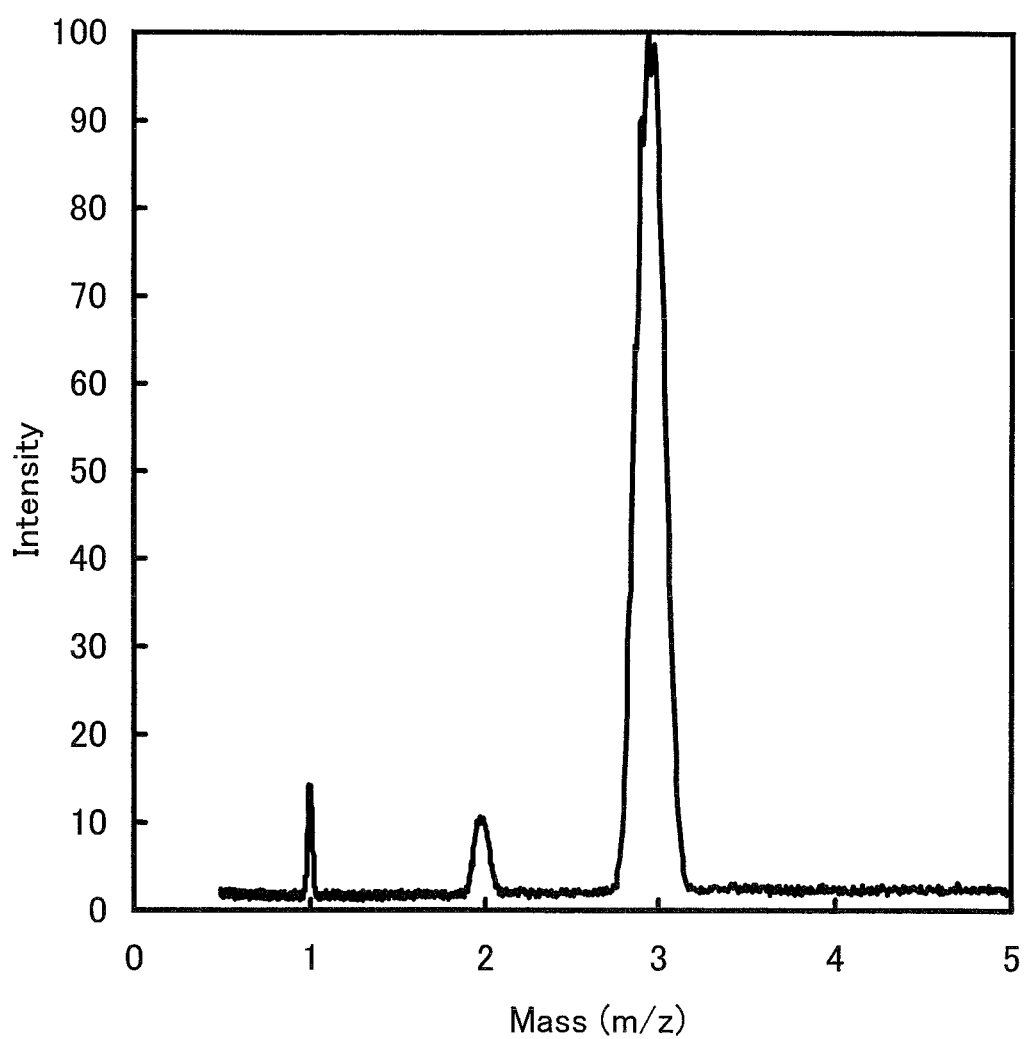
FIG. 41 is a diagram showing the results of mass spectrometry of ion species generated from a $H_2$ gas with an ion doping apparatus.

The ratio between hydrogen ions species, H+, H2+, and H3+, which are generated from a hydrogen gas, varies between an ion implantation apparatus and an ion doping apparatus. FIG. 41 is a graph showing the results of mass spectrometry of ion species that are generated from a 100% hydrogen gas (with the pressure of an ion source of $4.7\times10^{-2}$ Pa) with an ion doping apparatus. The vertical axis represents spectrum intensity, which corresponds to the number of ions. The horizontal axis represents mass of ion species. In the spectrum, the mass 1 peak, the mass 2 peak, and the mass 3 peak correspond to H+, H2+, and H3+, respectively. In FIG. 41, the number of ions with different masses is expressed as a relative proportion where the number of ions with a mass of 3 is defined as 100. It can be seen from FIG. 41 that the ratio between hydrogen ion species that are generated in plasma, i.e., the ratio between H+, H2+, and H3+, is about 1:1:8. It is also confirmed, from the results of secondary ion mass spectroscopy of hydrogen concentration distribution in a single crystal silicon wafer into which hydrogen ions are implanted with an ion doping apparatus, that H3+ accounts for about 80% of hydrogen ion species with which the single crystal silicon wafer is irradiated.

Figure 42:
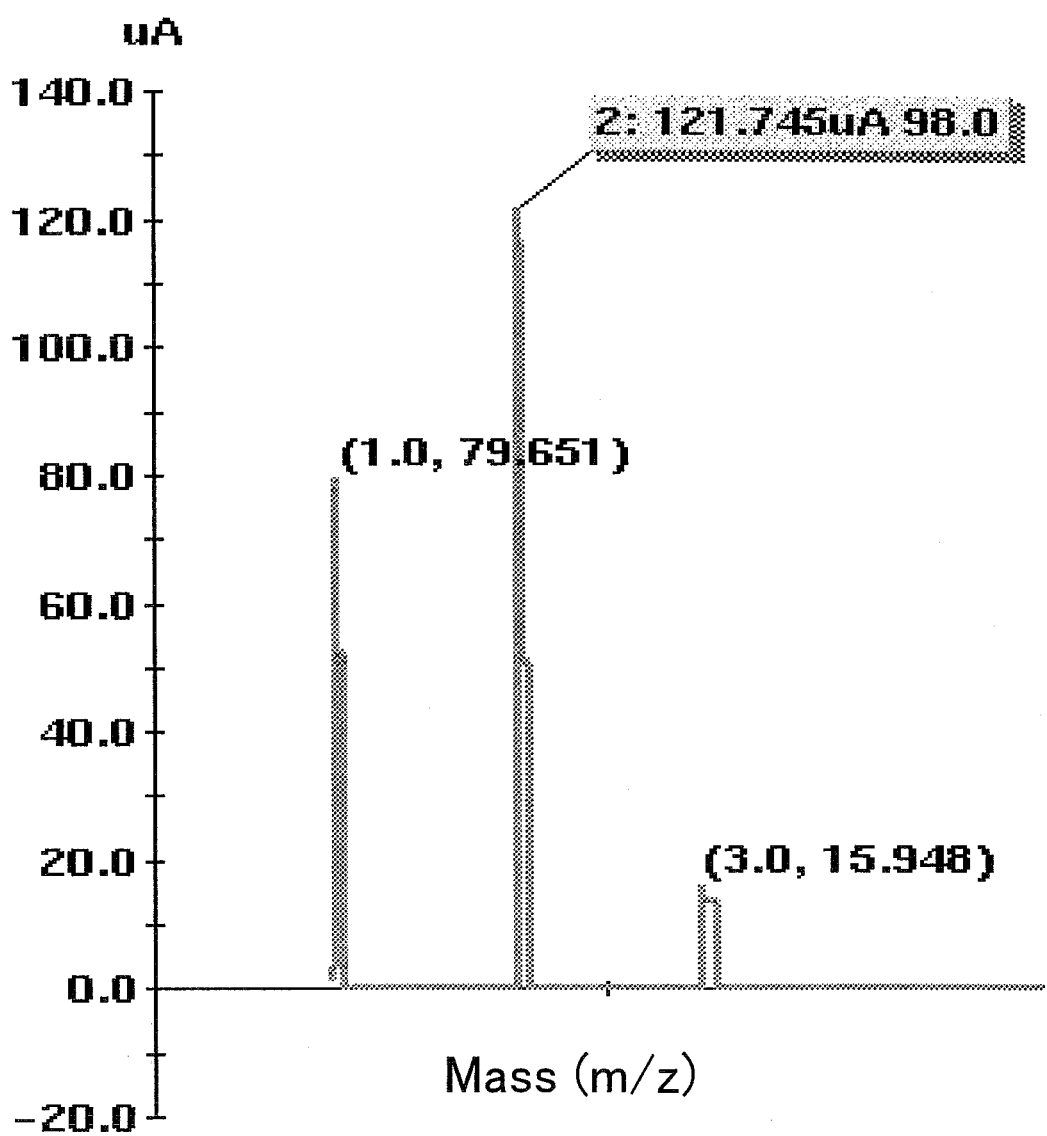
FIG. 42 is a diagram showing the results of mass spectrometry of ion species generated from a $PH_3$ gas with an ion implantation apparatus.

FIG. 42 is a graph showing the results of mass spectrometry of ion species that are generated from PH$_3$ with an ion implantation apparatus when the pressure of an ion source is about $3\times10^{-3}$ Pa. As in FIG. 41, the vertical axis represents spectrum intensity, which corresponds to the number of ions. The horizontal axis represents mass of ion species, and the mass 1 peak, the mass 2 peak, and the mass 3 peak correspond to H+, H2+, and H3+, respectively. It can be seen from FIG. 42 that the ratio between hydrogen ion species in plasma, i.e., the ratio between H+, H2+, and H3+, is about 37:56:7. Note that, although FIG. 42 shows the data obtained when the source gas is PH$_3$, the ratio between the hydrogen ion species is the same or substantially the same when a 100% hydrogen gas is used as a source gas, as well. That is, the ratio between ions species that are generated from a hydrogen gas, i.e., the ratio between H+, H2+, and H3+, is about 37:56:7.

Therefore, an ion implantation apparatus generates H3+, of hydrogen ion species, H+, H2+, and H3+, at a proportion of only about 7%. On the other hand, an ion doping apparatus can generate H3+ at a proportion of 50% or higher, about 80%. Hereinafter, the reason why the proportion of H3+ generated significantly varies between an ion doping apparatus and an ion implantation apparatus is examined.

[Ions in Hydrogen Plasma]

Figure 43:
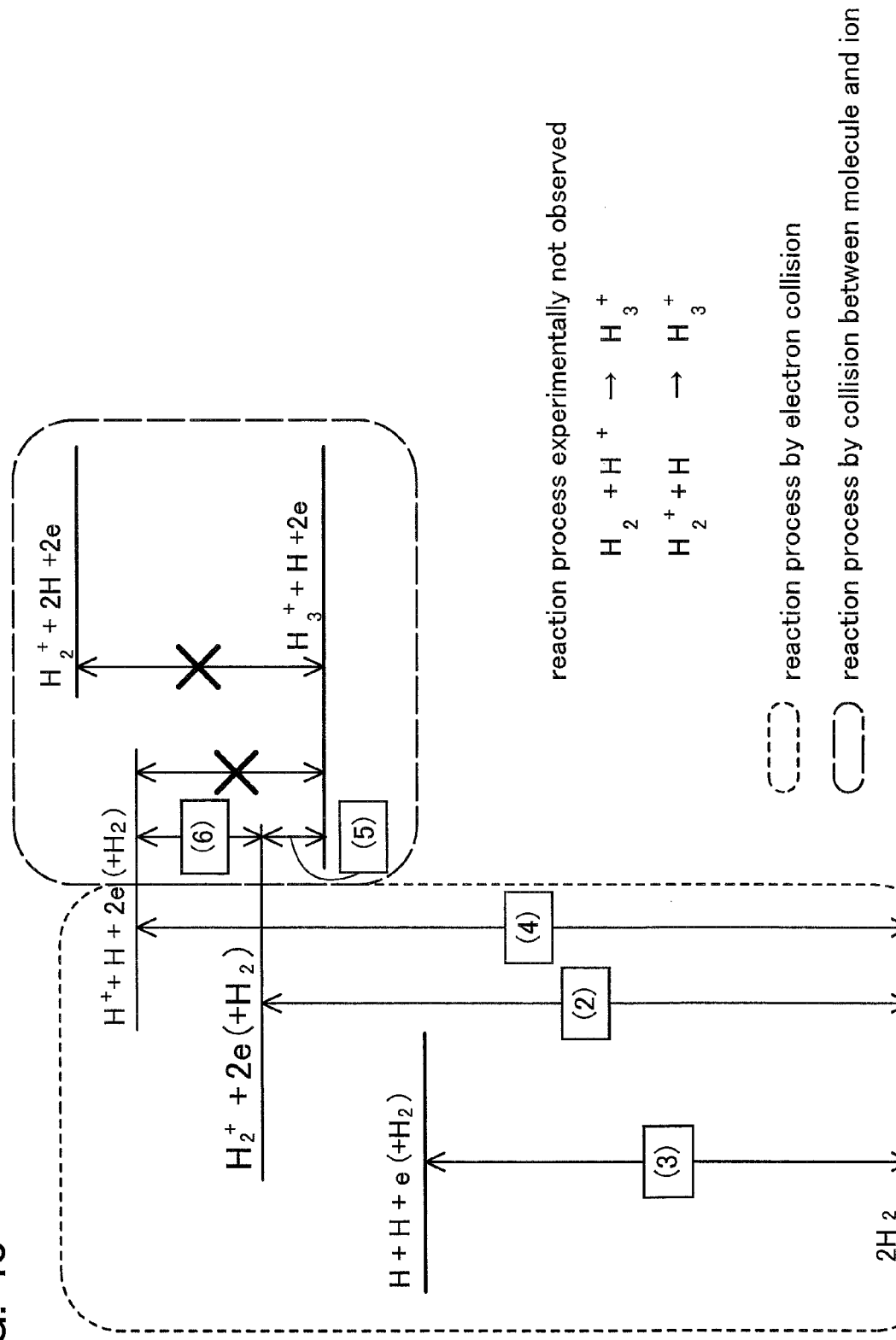
FIG. 43 is an energy diagram of a hydrogen molecule and hydrogen ions ($H^+$, $H_2^+$, and $H_3^+$).

Hydrogen plasma includes hydrogen ion species such as H+, H2+, and H3+. Below are listed reaction equations representing reaction processes (formation processes, destruction processes) of the hydrogen ion species. In addition, FIG. 43 is an energy diagram which schematically shows some of these reactions. Note that the energy diagram shown in FIG. 43 is merely a schematic diagram and does not depict the relationships of energies of the reactions exactly.

(1)

(2)

(3)

(4)

(5)

(6)

(7)

(8)

(9)

[H3+ Ion Formation Process]

As shown above, H3+ is mainly produced through the reaction process that is represented by the reaction equation (5). On the other hand, as a reaction that competes with the reaction equation (5), there is the reaction process represented by the reaction equation (6). For H3+ to increase, at the least, it is necessary that the reaction of the reaction equation (5) occur more often than the reaction of the reaction equation (6) (note that, because there are also other reactions, (7), (8), and (9), through which $H_3^+$ is decreased, $H_3^+$ is not necessarily increased even if the reaction of the reaction equation (5) occurs more often than the reaction of the reaction equation (6)). In contrast, when the reaction of the reaction equation (5) occurs less often than the reaction of the reaction equation (6), the proportion of $H_3^+$ in plasma is decreased. In each reaction equation, the amount of increase in the product on the right-hand side (rightmost side) depends on the concentration of a source material on the left-hand side (leftmost side), the rate coefficient of the reaction, and the like. Here, it is experimentally confirmed that, when the kinetic energy of $H_2^+$ is lower than about 11 eV, the reaction of the reaction equation (5) is the main reaction (that is, the rate coefficient of the reaction equation (5) is sufficiently higher than the rate coefficient of the reaction equation (6)) and that, when the kinetic energy of $H_2^+$ is higher than about 11 eV, the reaction of the reaction equation (6) is the main reaction.

A force is exerted on a charged particle by an electric field, and the charged particle gains kinetic energy. The kinetic energy corresponds to the amount of decrease in potential energy due to an electric field. For example, the amount of kinetic energy a given charged particle gains before colliding with another particle is equal to the amount of potential the charged particle loses by moving. That is, in a situation where a charged particle can travel a long distance in an electric field without colliding with another particle, the kinetic energy (or the average thereof) of the charged particle tends to be higher than that in a situation where the charged particle cannot. Such a tendency toward an increase in kinetic energy of a charged particle can be shown in a situation where the mean free path of a particle is long, that is, in a situation where pressure is low. Even in a situation where the mean free path is short, the kinetic energy of a charged particle is high if the charged particle can gain a high amount of kinetic energy before collision. That is, it can be said that, even in the situation where the mean free path is short, the kinetic energy of a charged particle is high if the potential difference is large.

This is applied to $H_2^+$. Assuming that an electric field is present as in a plasma generation chamber, the kinetic energy of $H_2^+$ is high in a situation where the pressure inside the chamber is low and the kinetic energy of an $H_2^+$ ion is low in a situation where the pressure inside the chamber is high. That is, because the reaction of the reaction equation (6) is the main reaction in the situation where the pressure inside the chamber is low, $H_3^+$ tends to be decreased, and because the reaction of the reaction equation (5) is the main reaction in the situation where the pressure inside the chamber is high, $H_3^+$ tends to be increased. In addition, in a situation where an electric field in a plasma generation region is high, that is, in a situation where the potential difference between given two points is large, the kinetic energy of $H_2^+$ is high. In the opposite situation, the kinetic energy of $H_2^+$ is low. That is, because the reaction of the reaction equation (6) is the main reaction in the situation where the electric field is high, $H_3^+$ tends to be decreased, and because the reaction of the reaction equation (5) is the main reaction in a situation where the electric field is low, $H_3^+$ tends to be increased.

For example, in the case of the ion source from which the data shown in FIG. 42 is obtained, $H_3^+$, of $H^+$, $H_2^+$, and $H_3^+$, is generated at a proportion of only about 7%. On the other hand, in the case of the ion source from which the data shown in FIG. 41 is obtained, the proportion of $H_3^+$ can be up to 50% or higher (according to the data of FIG. 41, about 80%). This can be thought to result from the pressure and electric field inside a chamber as described above.

[$H_3^+$ Irradiation Mechanism]

When plasma that contains a plurality of ion species as shown in FIG. 41 is generated and a semiconductor substrate is irradiated with the generated plurality of ion species without any mass separation being performed, the surface of the semiconductor substrate is irradiated with each of $H^+$ ions, $H_2^+$ ions, and $H_3^+$ ions. In order to examine the mechanism, from the irradiation with ions to the formation of an ion-implanted layer, the following five types of models (Models 1 to 5) are considered.

Model 1, where the ion species used for irradiation is $H^+$, which is still $H^+$ (H) after the irradiation.

Model 2, where the ion species used for irradiation is $H_2^+$, which is still $H_2^+$ ($H_2$) after the irradiation.

Model 3, where the ion species used for irradiation is $H_2^+$, which splits into two H atoms ($H^+$) after the irradiation.

Model 4, where the ion species used for irradiation is $H_3^+$, which is still $H_3^+$ ($H_3$) after the irradiation.

Model 5, where the ion species used for irradiation is $H_3^+$, which each splits into three H atoms ($H^+$) after the irradiation.

[Comparison of Simulation Results with Measured Values]

Based on the above models 1 to 5, the irradiation of a silicon substrate with hydrogen ion species was simulated. As simulation software, SRIM, the Stopping and Range of Ions in Matter, was used. SRIM is simulation software for ion introduction processes by a Monte Carlo method and is an improved version of TRIM, the Transport of Ions in Matter. Note that SRIM is software intended for amorphous structures, but SRIM can be applied to cases where a silicon substrate is irradiated with hydrogen ion species with high energy at a high dose. This is because the crystal structure of the silicon substrate changes into a non-single-crystal structure due to the collision of the hydrogen ion species with Si atoms.

The simulation results are hereinafter described. Note that, in the simulation of this embodiment mode, a calculation based on Model 2 was performed with $H_2^+$ replaced by $H^+$ that has twice the mass. Furthermore, a calculation based on Model 3 was performed with $H_2^+$ replaced by $H^+$ that has half the kinetic energy; a calculation based on Model 4, with $H_3^+$ replaced by $H^+$ that has three times the mass; and a calculation based on Model 5, with $H_3^+$ replaced by $H^+$ that has one-third the kinetic energy.

Figure 44:
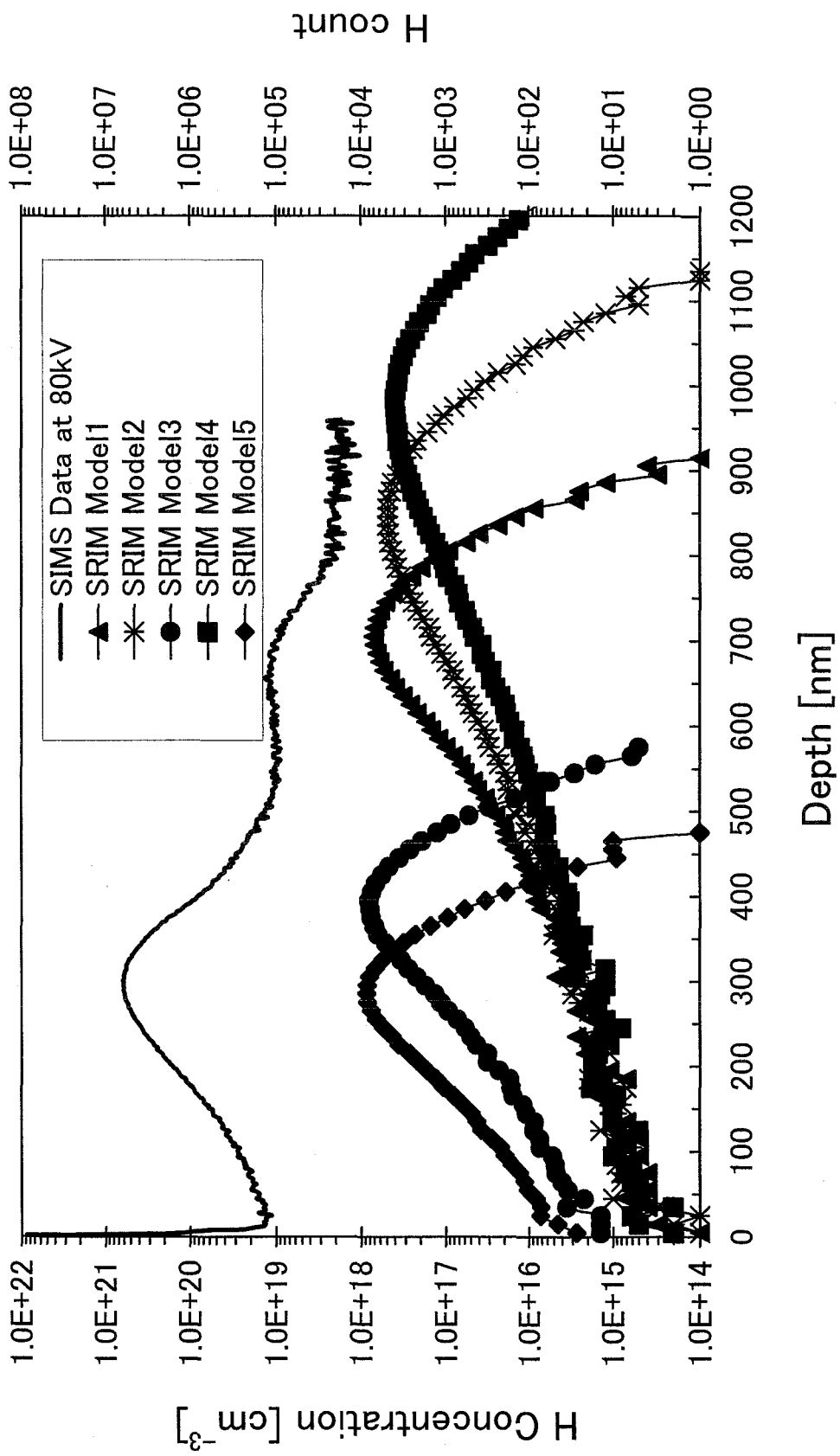
FIG. 44 is a graph of the profile (calculated values and measured values) of hydrogen in the depth direction when the accelerating voltage is 80 kV.

Using the above models 1 to 5, distributions of a hydrogen element (H) in silicon substrates, in the depth direction, which were each irradiated with hydrogen ion species (irradiated with 100000 atoms for H) at an acceleration voltage of 80 kV were calculated. FIG. 44 shows the calculation results. FIG. 44 also shows measured values of a distribution of a hydrogen element (H) in a silicon substrate in the depth direction. The measured values are data measured by secondary ion mass spectroscopy (SIMS) (the data being hereinafter referred to as SIMS data). A sample measured by SIMS was a Si substrate which was irradiated with hydrogen ion species ($H^+$, $H_2^+$, and $H_3^+$) generated under the conditions where the data of FIG. 41 was obtained.

In FIG. 44, each of the vertical axes of graphs of calculated values based on Models 1 to 5 is the right vertical axis which represents the number of hydrogen atoms. The vertical axis of a graph of the SIMS data is the left vertical axis which represents concentration of hydrogen atoms. Each of the horizontal axes of the graphs of the calculated values and the SIMS data represents depth from a surface of each Si substrate. When the SIMS data, which is measured values, is compared with the calculated values, Models 2 and 4 obviously do not match the graph of the SIMS data and a peak corresponding to Model 3 cannot be observed in the SIMS data. This shows that the contribution of each of Models 2 to 4 is relatively smaller than that of each of Models 1 and 5. Considering that the unit of the kinetic energy of ions is keV whereas the H—H bond energy is only about several electron volts, it is thought that the contribution of each of Models 2 and 4 is small because $H_2^+$ and $H_3^+$ mostly split into $H^+$ or H by colliding with Si atoms. Therefore, Models 2 to 4 will not be considered in the following examination. Next, using Models 1 and 5, the results of simulation of irradiation of Si substrates with hydrogen ion species (100000 atoms for H) at accelerating voltages of 80 kV, 60 kV, and 40 kV are described.

Figure 45:
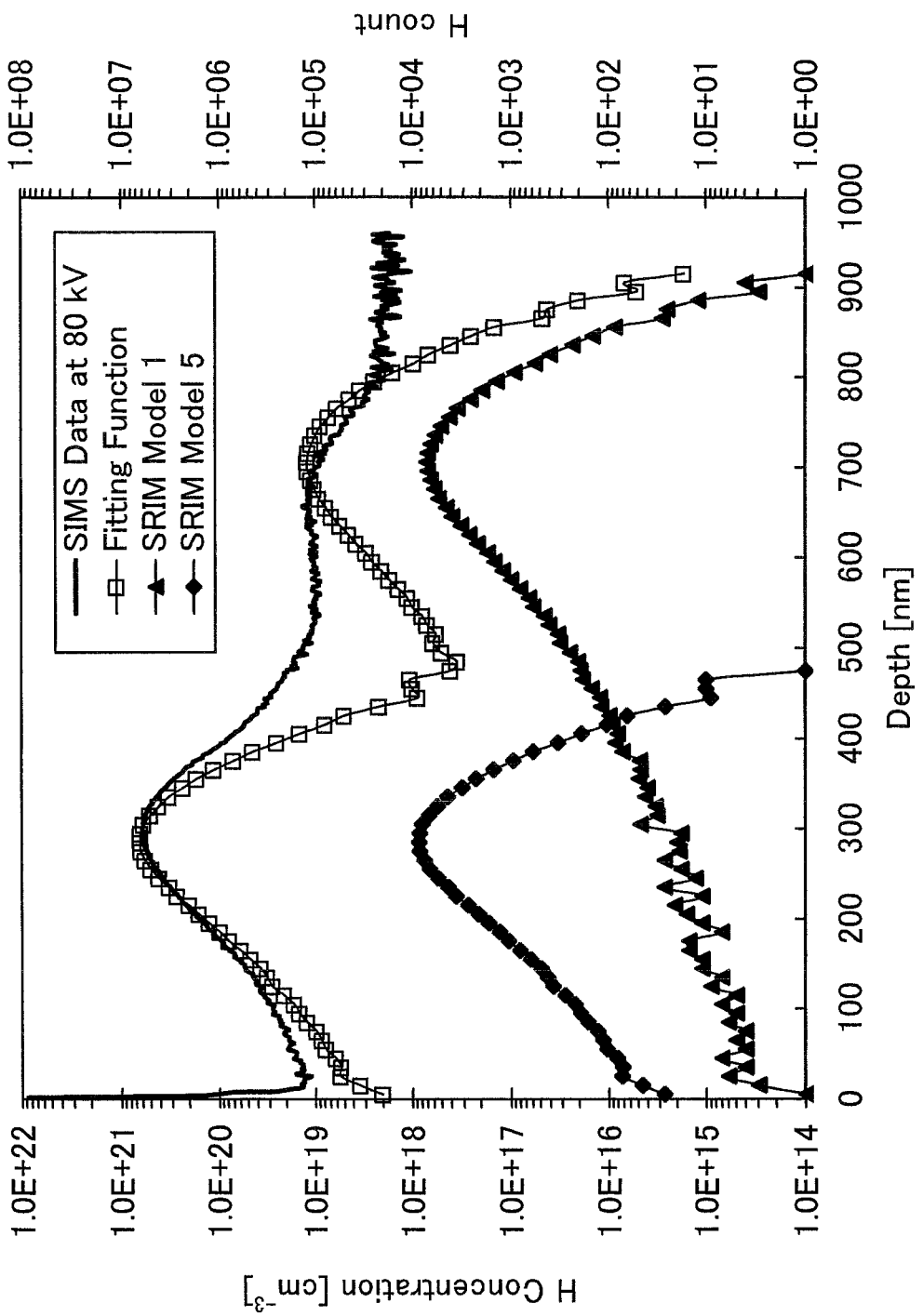
FIG. 45 is a graph of the profile (calculated values, measured values, and fitting function) of hydrogen in the depth direction when the accelerating voltage is 80 kV.
Figure 46:
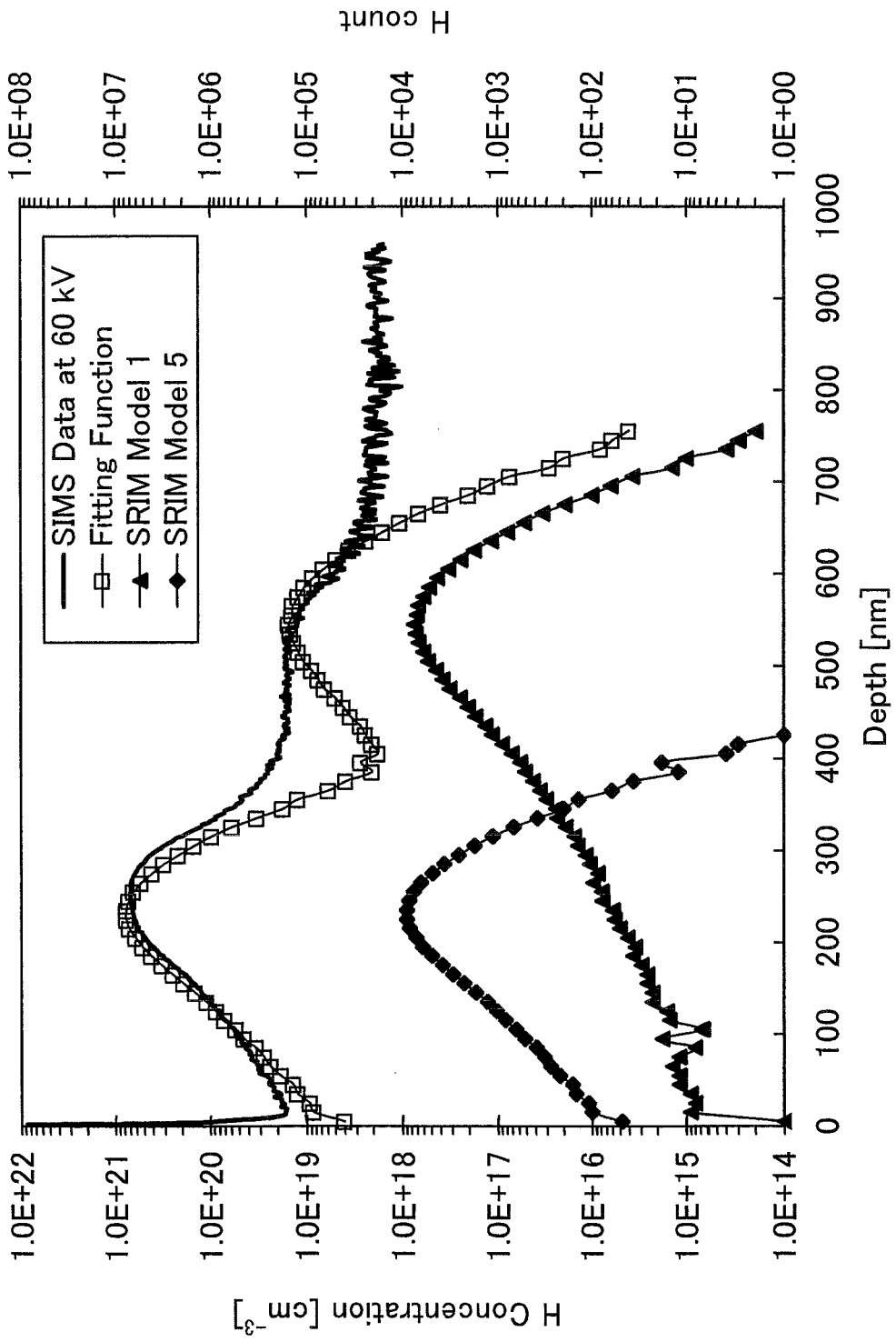
FIG. 46 is a graph of the profile (calculated values, measured values, and fitting function) of hydrogen in the depth direction when the accelerating voltage is 60 kV.
Figure 47:
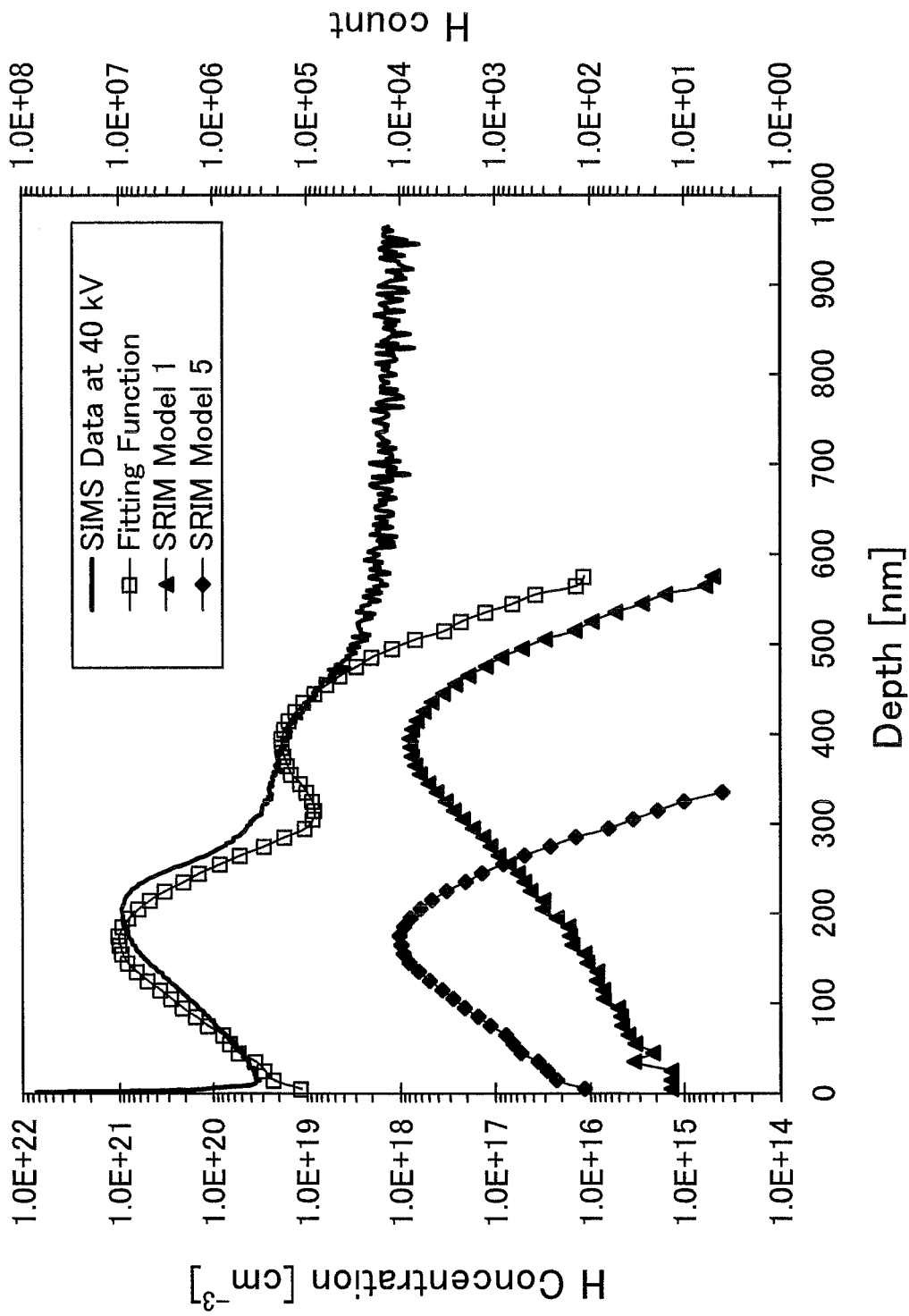
FIG. 47 is a graph of the profile (calculated values, measured values, and fitting function) of hydrogen in the depth direction when the accelerating voltage is 40 kV.

FIGS. 45 to 47 each show the calculation results of a distribution of hydrogen (H) in a Si substrate in the depth direction. FIGS. 45, 46, and 47 show the calculation results when the accelerating voltages are 80 kV, 60 kV, and 40 kV, respectively. In addition, FIGS. 45 to 47 each show SIMS data, which is measured values, and a curve fitted to the SIMS data (hereinafter referred to as a fitting function). A sample measured by SIMS was a Si substrate which was irradiated with hydrogen ion species ($H^+$, $H_2^+$, and $H_3^+$) that were generated under the conditions where the data of FIG. 41 was obtained and were accelerated at an accelerating voltage of 80 kV, 60 kV, or 40 kV. Note that each of the vertical axes of graphs of the calculated values based on Models 1 and 5 represents the number of hydrogen atoms on the right vertical axis, and each of the vertical axes of graphs of the SIMS data and the fitting function represents the concentration of hydrogen atoms on the left vertical axis. Each of the horizontal axes of the graphs represents depth from a surface of each Si substrate.

Here, the fitting function is obtained using the calculation formula (f1) given below, in consideration of Models 1 and 5. In the calculation formula (f1), X and Y represent fitting parameters and V represents volume.

(Fitting Function)=$X/V$×(Data of Model 1)+$Y/V$×(Data of Model 5)  (f1)

In consideration of the ratio between ion species used for actual irradiation ($H^+$:$H_2^+$:$H_3^+$ is about 1:1:8, see FIG. 41), the contribution of $H_2^+$ (i.e., Model 3) should also be considered in determining the fitting function; however, the contribution of $H_2^+$ is excluded for the following reasons:

Because the amount of hydrogen introduced through the irradiation process represented by Model 3 is small as compared to that introduced through the irradiation process of Model 5, there is no significant influence even if the contribution of $H_2^+$ is excluded (no peak corresponding to Model 3 appears in the SIMS data, see FIG. 44).

Because the peak position of the profile of a hydrogen element in a Si substrate in the depth direction based on Model 3 is close to that of the profile in the depth direction based on Model 5 (see FIG. 44), the contribution of Model 3 is likely to be obscured by channeling (movement of atoms due to crystal lattice structure) that occurs in the irradiation process of Model 5. That is, it is difficult to estimate fitting parameters for Model 3. The reason for this is that this simulation assumes amorphous silicon and the influence due to crystallinity is not considered.

FIG. 48 shows fitting parameters for the calculation formula (f1). At any of the accelerating voltages, the ratio of the amount of H introduced into the Si substrate according to Model 1 to that introduced according to Model 5 is about 1:42 to 1:45 (the amount of H in Model 5, when the amount of H in Model 1 is defined as 1, is about 42 to 45), and the ratio of the amount of ions used for irradiation, $H^+$ (Model 1) to that of $H_3^+$ (Model 5) is about 1:14 to 1:15 (the amount of $H_3^+$ in Model 5, when the amount of $H^+$ in Model 1 is defined as 1, is about 14 to 15). Considering that Model 3 is not considered and the calculation assumes amorphous silicon, it can be said that values close to that of the ratio between hydrogen ion species used for actual irradiation ($H^+$:$H_2^+$:$H_3^+$ is about 1:1:8, see FIG. 41) are obtained.

[Effects of Use of $H_3^+$]

A plurality of benefits resulting from $H_3^+$ can be enjoyed by irradiation of a substrate with hydrogen ion species with a higher proportion of $H_3^+$ as shown in FIG. 41. For example, because $H_3^+$ splits into $H^+$, H, or the like to be introduced into a substrate, ion introduction efficiency can be improved compared with the case of irradiation mainly with $H^+$ or $H_2^+$. This leads to an improvement in SOI substrate production efficiency. In addition, because the kinetic energy of $H^+$ or H after $H_3^+$ splits similarly tends to be low, $H_3^+$ is suitable for manufacture of thin semiconductor layers. Note that, a method using an ion doping apparatus that is capable of irradiation with the hydrogen ion species as shown in FIG. 41 in order to efficiently perform irradiation with $H_3^+$ is described here. Because ion doping apparatuses are inexpensive and excellent for use in large-area treatment, by irradiation with $H_3^+$ by use of such an ion doping apparatus, significant effects such as an improvement in semiconductor characteristics, an increase in area of an SOI substrate, a reduction in costs, and an improvement in production efficiency can be obtained.

It can be seen from the above consideration that an ion doping apparatus is more preferable than an ion implantation apparatus for use to implant more $H_3^+$ into the single crystal semiconductor substrate 110. In addition, an ion doping apparatus does not involve mass separation of generated ion species; thus, it has a high source gas use efficiency. Furthermore, it enables planar or linear irradiation with accelerated ions; thus, cycle time can be easily shortened. In contrast, an ion implantation apparatus is characterized in that generated ions can be separated by mass and only a specific ion species can be implanted into a substrate. However, through mass separation, an ion implantation apparatus has a lower use efficiency of ions that are generated from a source gas than an ion doping apparatus. Moreover, in an ion implantation apparatus, ions are implanted by scanning with an ion beam having a dot-like beam shape; thus, there is a problem in throughput for large-area treatment. Therefore, in view of source gas use efficiency and large-area treatment, it is preferable that an ion doping apparatus be used to form the damaged region 115 in the single crystal semiconductor substrate 110 through irradiation with the ions 121.

Figure 4C:
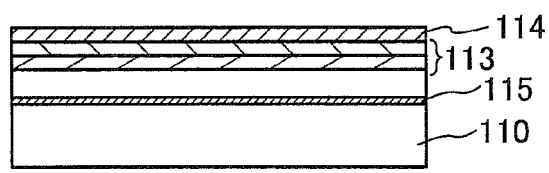

After the damaged region 115 is formed, the second insulating layer 114 is formed over the upper surface of the first insulating layer 113, as shown in FIG. 4C. In the step of forming the second insulating layer 114, the single crystal semiconductor substrate 110 is heated at a temperature at which an element or a molecule that is added to the damaged region 115 does not precipitate, preferably at 350° C. or lower. In other words, the single crystal semiconductor substrate 110 is heated at a temperature at which the damaged region 115 is not degassed. Note that the second insulating layer 114 can be formed before the damaged region 115 is formed. In this case, the process temperature at the time of forming the second insulating layer 114 can be set to be 350° C. or higher.

The second insulating layer 114 is a layer for forming a smooth hydrophilic bonding surface on the single crystal semiconductor substrate 110. Therefore, the second insulating layer 114 preferably has an average surface roughness $R_a$ of 0.7 nm or less, more preferably, 0.4 nm or less. The second insulating layer 114 can have a thickness ranging from 10 nm to 200 nm. The second insulating layer 114 preferably has a thickness ranging from 5 nm to 500 nm, more preferably 10 nm to 200 nm.

The second insulating layer 114 is preferably an insulating film which is formed by chemical vapor reaction. For example, a silicon oxide film, a silicon oxynitride film, a silicon nitride oxide film, a silicon nitride film, or the like can be formed as the second insulating layer 114. In the case where a silicon oxide film is formed as the second insulating layer 114 by a PECVD method, it is preferable to use an organosilane gas and an oxygen ($O_2$) gas as a source gas. By using organosilane as the source gas, it is possible to form a silicon oxide film having a smooth surface at a process temperature of 350° C. or lower. Alternatively, the second insulating layer 114 can be formed using a low temperature oxide (LTO) which is formed by a thermal CVD method at a heating temperature of from 200° C. to 500° C. LTO can be formed by using monosilane ($SiH_4$), disilane ($Si_2H_6$), or the like as a silicon source gas and using $N_2O$ or the like as an oxygen source gas.

Examples of conditions for formation of the second insulating layer 114 of a silicon oxide film by using TEOS and $O_2$ as a source gas are that TEOS is introduced into the chamber at a flow rate of 15 sccm and $O_2$ is introduced into the chamber at a flow rate of 750 sccm and that the film formation pressure is 100 Pa, the film formation temperature is 300° C., the RF output is 300 W, and the power frequency is 13.56 MHz.

The order of the step of FIG. 4B and the step of FIG. 4C can be reversed. That is, after the first insulating layer 113 and the second insulating layer 114 are formed over the single crystal semiconductor substrate 110, the damaged region 115 can be formed. In this case, it is preferable that the first insulating layer 113 and the second insulating layer 114 be formed in succession when the first insulating layer 113 and the second insulating layer 114 can be formed with the same film formation apparatus.

Alternatively, after the step of FIG. 4B is performed, the step of FIG. 4A and the step of FIG. 4C can be performed. That is, after the single crystal semiconductor substrate 110 is irradiated with the ions 121 to form the damaged region 115, the first insulating layer 113 and the second insulating layer 114 can be formed. In this case, when the first insulating layer 113 and the second insulating layer 114 can be formed with the same film formation apparatus, it is preferable that the first insulating layer 113 and the second insulating layer 114 be formed in succession. In addition, in order to protect the surface of the single crystal semiconductor substrate 110 before the damaged region 115 is formed, the single crystal semiconductor substrate 110 can be subjected to oxidation treatment to form an oxide film on the surface, and then the single crystal semiconductor substrate 110 can be irradiated with ions through the oxide film. This oxide film is removed after the damaged region 115 is formed. Alternatively, the first insulating layer 113 can be formed in a state where the oxide film remains.

Next, the supporting substrate 100 and the single crystal semiconductor substrate 110 provided with the first insulating layer 113, the damaged region 115, and the second insulating layer 114 are cleaned. This cleaning step can be performed by ultrasonic cleaning in pure water. The ultrasonic cleaning is preferably megahertz ultrasonic cleaning (megasonic cleaning). After the ultrasonic cleaning, it is preferable that one or both of the single crystal semiconductor substrate 110 and the supporting substrate 100 be cleaned with ozone-containing water. By cleaning with ozone-containing water, removal of an organic substance and surface activation treatment to improve hydrophilicity of the surface of the second insulating layer 114 and the supporting substrate 100 can be performed. Other than ozone-containing water, cleaning treatment may be performed with oxygen-containing water, hydrogen-containing water, pure water, or the like. Through such cleaning treatment, the bonding surface can be made hydrophilic and the number of OH groups on the bonding surface can be increased. Accordingly, a stronger bond by hydrogen bonding can be obtained.

The activation treatment of the surface of the second insulating layer 114 and the supporting substrate 100 can be performed by irradiation with an atomic beam or an ion beam, plasma treatment, or radical treatment as well as cleaning with ozone-containing water. When an atomic beam or an ion beam is utilized, an inert gas neutral atom beam or inert gas ion beam of argon or the like can be used. Such surface treatment facilitates bonding between different kinds of materials even at a temperature of 400° C. or lower.

Figure 4D:
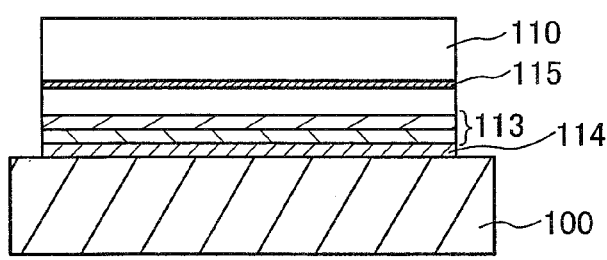

FIG. 4D shows a cross-sectional view illustrating a bonding step. The supporting substrate 100 and the single crystal semiconductor substrate 110 are disposed in contact with each other with the second insulating layer 114 interposed therebetween. In this embodiment mode, the surface of the supporting substrate 100 and the surface of the second insulating layer 114 are disposed in contact with each other, and portions that are in contact with each other are bonded to each other. As bonding force of bonding between the surface of the supporting substrate 100 and the surface of the second insulating layer 114, it can be considered that van der Waals force acts at the initial stage. When pressure is applied to the surface of the second insulating layer 114 and the surface of the supporting substrate 100, hydrogen bonding is formed at portions that are in contact with each other, and the surface of the second insulating layer 114 and the surface of the supporting substrate 100 can be bonded to each other more strongly.

A pressure of about 300 N/cm$^2$ to 15000 N/cm$^2$ is applied to one part of the edge of the single crystal semiconductor substrate 110. This pressure is preferably 1000 N/cm$^2$ to 5000 N/cm$^2$. The second insulating layer 114 and the supporting substrate 100 start bonding to each other from the pressurized part, and portions that are bonded to each other are extended over the entire surface of the second insulating layer 114. Accordingly, the single crystal semiconductor substrate 110 is fixed to the supporting substrate 100. This bonding step can be performed at room temperature without heat treatment; therefore, a substrate having low heat resistance and having an allowable temperature limit of 700° C. or lower like a glass substrate can be used as the supporting substrate 100.

After the single crystal semiconductor substrate 110 is bonded to the supporting substrate 100, heat treatment or pressurization treatment is preferably performed to increase bonding force between the supporting substrate 100 and the second insulating layer 114. This treatment is performed at a temperature where a crack is not generated in the damaged region 115 and can be performed at a temperature in the range of room temperature to 400° C. In addition, by bonding of the single crystal semiconductor substrate 110 to the supporting substrate 100 while heating is performed within this temperature range, bonding force at the bonding interface between the supporting substrate 100 and the second insulating layer 114 can be increased. Pressurization treatment is preferably performed so that pressure is applied perpendicular to the bonding surfaces. For this heat treatment, a diffusion furnace, a heating furnace such as a resistance heating furnace, a rapid thermal annealing (RTA) apparatus, a microwave heating apparatus, or the like can be used.

Figure 4E:
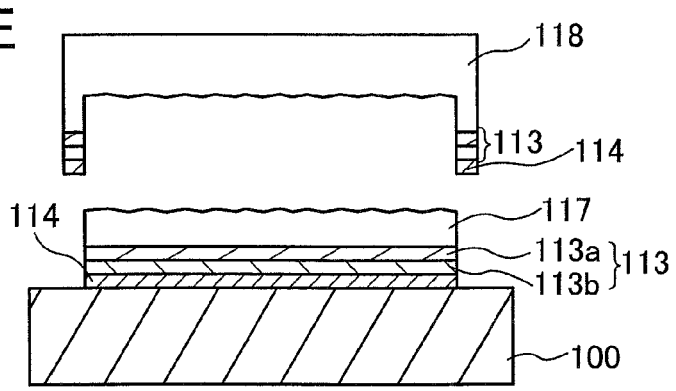

Next, heat treatment is performed to cause separation at the damaged region 115, whereby the single crystal semiconductor layer 117 is separated from the single crystal semiconductor substrate 110. FIG. 4E is a diagram illustrating a separation step where the single crystal semiconductor layer 117 is separated from the single crystal semiconductor substrate 110. Reference numeral 118 denotes the single crystal semiconductor substrate 110 from which the single crystal semiconductor layer 117 has been separated.

When heat treatment is performed, the element added by ion doping is precipitated in the microvoids formed in the damaged region 115 due to an increase in temperature, whereby internal pressure increases. Due to the increase in pressure, a change occurs in the volume of the microvoids in the damaged region 115 to generate a crack in the damaged region 115. As a result, the single crystal semiconductor substrate 110 is cleaved along the damaged region 115. Because the second insulating layer 114 is bonded to the supporting substrate 100, the single crystal semiconductor layer 117 which is separated from the single crystal semiconductor substrate 110 is fixed over the supporting substrate 100. The heat treatment for separating the single crystal semiconductor layer 117 from the single crystal semiconductor substrate 110 is performed at a temperature which does not exceed the strain point of the supporting substrate 100.

For this heat treatment, a diffusion furnace, a heating furnace such as a resistance heating furnace, a rapid thermal annealing (RTA) apparatus, a microwave heating apparatus, or the like can be used.

A heating furnace is an apparatus for heating an object mainly by radiation from a furnace that is heated with a resistance heater or the like.

An RTA apparatus is a heating apparatus using lamp light. Examples of RTA apparatuses include a lamp rapid thermal annealing (LRTA) apparatus and a gas rapid thermal annealing (GRTA) apparatus. An LRTA apparatus is an apparatus for heating an object by radiation of light emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object by heat radiation with light emitted from any of the aforementioned lamps and by heat conduction from a gas which is heated with light (an electromagnetic wave) emitted from any of the aforementioned lamps. As the gas, an inert gas, like nitrogen or a noble gas such as argon, which does not react with an object through heat treatment is used. An LRTA apparatus or a GRTA apparatus may have not only a lamp but also a device for heating an object by heat conduction or heat radiation from a heater such as a resistance heater.

A microwave heating apparatus is an apparatus for heating an object by radiation of a microwave. A microwave heating apparatus may have a device for heating an object by heat conduction or heat radiation from a heater such as a resistance heater.

When a GRTA apparatus is used, heating temperature can be set at 550° C. or higher and 650° C. or lower, and processing time can be set for 0.5 minutes or more and 60 minutes or less. When a resistance heating apparatus is used, heating temperature can be set at 550° C. or higher and 650° C. or lower, and processing time can be set for two hours or more and four hours or less. In the case where a microwave heating apparatus is used, irradiation can be performed with, for example, microwaves having a frequency of 2.45 GHz for a processing time of 10 minutes or more and 20 minutes or less.

A specific treatment method of heat treatment by using a vertical furnace with resistance heating is described. The supporting substrate 100 to which the single crystal semiconductor substrate 110 is bonded is loaded into a boat for the vertical furnace. The boat is carried into a chamber of the vertical furnace. In order to suppress oxidation of the single crystal semiconductor substrate 110, the chamber is first evacuated to a vacuum state. The degree of vacuum is approximately $5 \times 10^{-3}$ Pa. After a vacuum state is obtained, nitrogen is supplied to the chamber so that the chamber has a nitrogen atmosphere under atmospheric pressure. Meanwhile, the temperature is increased to 200° C.

After the chamber is made to have a nitrogen atmosphere under atmospheric pressure, heating is performed at 200° C. for two hours. Then, the temperature is increased to 400° C. for one hour. After a state in which the heating temperature is 400° C. becomes stable, the temperature is increased to 600° C. for one hour. After a state in which the heating temperature is 600° C. becomes stable, heat treatment is performed at 600° C. for two hours. Then, the heating temperature is decreased to 400° C. for one hour, and after 10 minutes to 30 minutes, the boat is carried out from the chamber. In an air atmosphere, the single crystal semiconductor substrate 118 and the supporting substrate 100 to which the single crystal semiconductor layer 117 is bonded are cooled on the boat.

In the above-mentioned heat treatment using a resistance heating furnace, heat treatment to increase bonding force between the second insulating layer 114 and the supporting substrate 100 and heat treatment to cause separation at the damaged region 115 are performed in succession. In the case of performing these two heat treatments in different apparatuses, for example, heat treatment is performed at 200° C. for two hours in a resistance heating furnace and then the supporting substrate 100 and the single crystal semiconductor substrate 110 which are bonded to each other are carried out from the furnace. Next, heat treatment is performed at a temperature in the range of from 600° C. to 700° C. for 1 minute to 30 minutes with an RTA apparatus, so that the single crystal semiconductor substrate 110 is divided at the damaged region 115.

In order to strongly bond the second insulating layer 114 and the supporting substrate 100 to each other by low-temperature treatment at 700° C. or lower, it is preferable that OH groups or water molecules ($H_2O$) are present on the surface of the second insulating layer 114 and the surface of the supporting substrate. This is because the bonding between the second insulating layer 114 and the supporting substrate 100 starts from formation of covalent bonds (covalent bonds of oxygen molecules and hydrogen molecules) or hydrogen bonds of the OH groups or the water molecules.

Therefore, it is preferable that the surface of the second insulating layer 114 and the surface of the supporting substrate 100 be activated to be hydrophilic. It is also preferable that the second insulating layer 114 be formed by a method such that oxygen or hydrogen is contained. For example, a silicon oxide film, a silicon oxynitride film, a silicon nitride oxide film, a silicon nitride film, or the like is formed by a PECVD method at a process temperature of 400° C. or lower, whereby hydrogen can be contained in the film. In order to form a silicon oxide film or a silicon oxynitride film, for example, $SiH_4$ and $N_2O$ are used as a process gas. In order to form a silicon nitride oxide film, for example, $SiH_4$, $NH_3$, and $N_2O$ are used as a process gas. In order to form a silicon nitride film, for example, $SiH_4$ and $NH_3$ are used as a process gas. In addition, it is preferable that a compound having an OH group such as TEOS (chemical formula: $Si(OC_2H_5)_4$) be used as a material in formation by a PECVD method.

Note that low-temperature treatment refers to treatment at a process temperature of 700° C. or lower. This is because the process temperature is lower than or equal to a strain point of a glass substrate. In contrast, for an SOI substrate that is formed by Smart Cut (registered trademark), heat treatment at 800° C. or higher is performed to bond a single crystal silicon layer and a single crystal silicon wafer to each other, and heat treatment at a temperature exceeding a strain point of a glass substrate is needed.

Note that, as shown in FIG. 4E, it is often the case that the peripheral portion of the single crystal semiconductor substrate 110 is not bonded to the supporting substrate 100. The reasons include that the damaged region 115 is not easily separated in the peripheral portion of the single crystal semiconductor substrate 110 where the supporting substrate 100 and the second insulating layer 114 are not disposed in close contact with each other because the peripheral portion of the single crystal semiconductor substrate 110 is chamfered or the peripheral portion of the second insulating layer 114 is damaged or contaminated when the single crystal semiconductor substrate 110 is moved. Therefore, in some cases, the single crystal semiconductor layer 117 that has a smaller size than the single crystal semiconductor substrate 110 is bonded to the supporting substrate 100, a projecting portion is formed on the periphery of the single crystal semiconductor substrate 118, and portions of the first insulating layer 113b, the first insulating layer 113a, and the second insulating layer 114 which are not bonded to the supporting substrate 100 remain over the projecting portion.

Figure 5A:
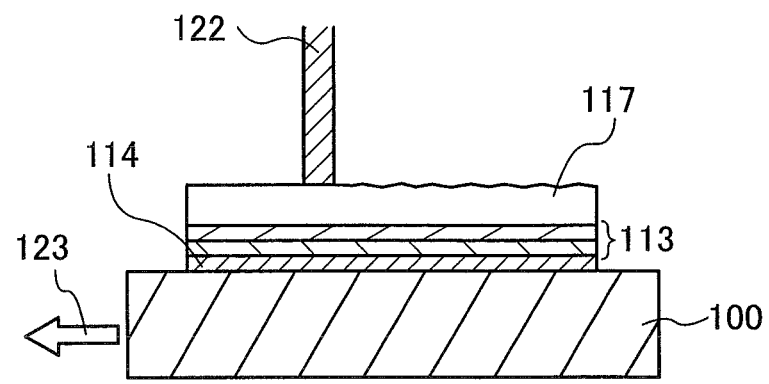
FIGS. 5A and 5B show cross-sectional views illustrating a method for manufacturing a semiconductor substrate.

The crystallinity of the single crystal semiconductor layer 117 in close contact with the supporting substrate 100 is impaired by formation of the damaged region 115, cleavage along the damaged region 115, and the like. In other words, crystal defects such as dislocation or crystal microdefects such as dangling bonds which have not been seen in the single crystal semiconductor substrate 110 before processing are produced in the single crystal semiconductor layer 117. In addition, the surface of the single crystal semiconductor layer 117 is a separation face from the single crystal semiconductor substrate 110 and thus planarity thereof is impaired. In order to recover the crystallinity of the single crystal semiconductor layer 117, the single crystal semiconductor layer 117 is melted and recrystallized by being irradiated with a laser beam. In addition, in order to planarize its surface, the single crystal semiconductor layer 117 is irradiated with a laser beam. FIG. 5A illustrates the laser irradiation process step.

As shown in FIG. 5A, the single crystal semiconductor layer 117 is scanned with the laser beam 122 such that the entire separation face of the single crystal semiconductor layer 117 is irradiated with the laser beam 122. The scanning with the laser beam 122 is conducted, for example, by moving the supporting substrate 100 to which the single crystal semiconductor layer 117 is fixed, instead of moving the laser beam 122. An arrow 123 denotes the movement direction of the supporting substrate 100.

When irradiated with the laser beam 122, the single crystal semiconductor layer 117 absorbs the laser beam 122, and the temperature of a portion irradiated with the laser beam 122 is increased. When the temperature of this portion becomes equal to or higher than the melting point of the single crystal semiconductor substrate 110, the portion is melted. After irradiation with the laser beam 122 is stopped, the temperature of the melted portion of the single crystal semiconductor layer 117 is decreased, and the melted portion is solidified and recrystallized with time. By scanning with the laser beam 122, the entire surface of the single crystal semiconductor layer 117 is irradiated with the laser beam 122. Alternatively, only a region of the single crystal semiconductor layer 117 that needs re-single-crystallization may be selectively irradiated with the laser beam 122.

Figure 5B:
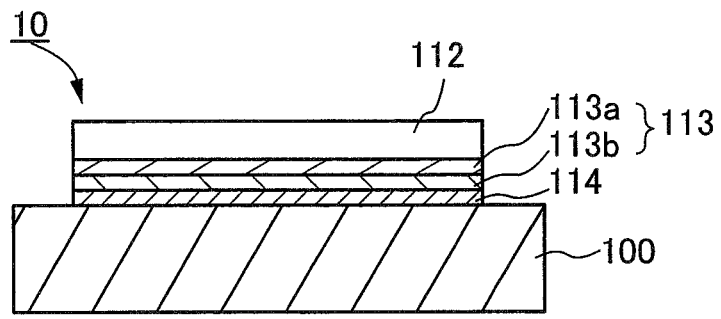

FIG. 5B shows a cross-sectional view of the semiconductor substrate 10 after the laser irradiation step. The single crystal semiconductor layer 112 is the single crystal semiconductor layer 117 which has undergone re-single-crystallization. An external view of FIG. 5B is shown in FIG. 1.

The single crystal semiconductor layer 112 which has been subjected to a laser irradiation process has higher crystallinity than the single crystal semiconductor layer 117. In addition, planarity can be improved by the laser irradiation process. The crystallinity of the single crystal semiconductor layer can be evaluated by measurement of an electron backscatter diffraction pattern (electron backscatter pattern (EBSP)), measurement of an X-ray diffraction pattern, observation using an optical microscope or an electron microscope, measurement of a Raman spectroscopic spectrum, or the like. The planarity of the surface of the single crystal semiconductor layer can be evaluated by observation using an atomic force microscope, for example.

By irradiation with the laser beam 122, a region irradiated with the laser beam 122 in the single crystal semiconductor layer 117 is partially or completely melted. Note that a completely melted state of the single crystal semiconductor layer 117 means that the entire layer from its upper surface to lower surface is melted. In a stacked structure of FIG. 5A, a completely melted state means that the single crystal semiconductor layer 117 is melted into a liquid state from its upper surface to the interface with the first insulating layer 113. Meanwhile, to partially melt the single crystal semiconductor layer 117 means melting the single crystal semiconductor layer 117 so that the depth of a melted portion is shallower than that of the interface with the first insulating layer 113 (the thickness of the single crystal semiconductor layer 117). In other words, a partially melted state of the single crystal semiconductor layer 117 means a state in which the upper portion is melted into a liquid phase and the lower portion is not melted and remains as a solid-phase single crystal semiconductor.

When the single crystal semiconductor layer 117 is partially melted by being irradiated with the laser beam 122, planarization is advanced due to surface tension of a semiconductor that is changed into a liquid phase. At the same time, cooling of the single crystal semiconductor layer 117 is advanced due to thermal diffusion to the supporting substrate 100. In the single crystal semiconductor layer 117, temperature gradient is generated in the depth direction. The solid-liquid interface is moved from the supporting substrate 100 side to the surface of the single crystal semiconductor layer 117, and recrystallization occurs. A so-called longitudinal growth occurs. This recrystallization is advanced using as a seed a lower region which is not melted.

The lower solid-phase portion is single crystal and has uniform crystal orientation; thus, no crystal grain boundary is formed therein and the single crystal semiconductor layer 112 after laser irradiation process can be a single crystal semiconductor layer without any crystal grain boundary. The upper melted portion is recrystallized by being solidified, and a single crystal semiconductor which has the same crystal orientation as the single crystal semiconductor in the lower portion which remains in a solid phase is formed. Therefore, in the case where a single crystal silicon wafer whose main surface is oriented along the (100) plane is used as the single crystal semiconductor substrate 110, a main surface of the single crystal semiconductor layer 117 is oriented along the (100) plane, and a main surface of the single crystal semiconductor layer 112 which is partially melted by laser irradiation process and is recrystallized is oriented along the (100) plane.

Furthermore, when the single crystal semiconductor layer 117 is completely melted by being irradiated with the laser beam 122, planarization is advanced due to surface tension of a semiconductor that is changed into a liquid phase. In the completely melted region, crystal growth occurs in the process of solidification from the single crystal semiconductor which is adjacent to the melted region, and lateral growth occurs. A portion which is not melted is single crystal and has uniform crystal orientation; thus, no crystal grain boundary is formed therein and the single crystal semiconductor layer 112 after laser irradiation process can be a single crystal semiconductor layer without any crystal grain boundary. That is, the completely melted region is recrystallized by being solidified, and a single crystal semiconductor which has the same crystal orientation as the single crystal semiconductor in the portion which is adjacent and not melted is formed. Therefore, in the case where a single crystal silicon wafer whose main surface is oriented along the (100) plane is used as the single crystal semiconductor substrate 110, a main surface of the single crystal semiconductor layer 117 is oriented along the (100) plane, and a main surface of the single crystal semiconductor layer 112 which is completely melted by laser irradiation process and is recrystallized is oriented along the (100) plane.

By complete melting or partial melting of the single crystal semiconductor layer 117 through irradiation with the laser beam 122, the single crystal semiconductor layer 112 having a flat surface can be formed. The reason is as follows. A melted portion of the single crystal semiconductor layer 117 is liquid and thus changes its shape by the action of surface tension so as to minimize its surface area. That is, a liquid portion changes its shape so as to have no depressed and protruding portions, and this liquid portion is then solidified and recrystallized. Accordingly, the single crystal semiconductor layer 112 having a planarized surface can be formed.

By planarization of the surface of the single crystal semiconductor layer 112, the thickness of a gate insulating film which is formed over the single crystal semiconductor layer 112 can be small, approximately 5 nm to 50 nm. Accordingly, a transistor having high on current can be formed while gate voltage is kept low.

As described above, this embodiment mode discloses a novel innovative technique for a method for obtaining a better single crystal semiconductor layer by irradiating a single crystal semiconductor layer with a laser beam and melting a part or whole of the single crystal semiconductor layer to perform recrystallization. Such a method of using a laser beam is not assumed in conventional techniques and is a completely novel concept.

As a planarization process, chemical mechanical polishing (abbr.: CMP) is known. However, it is difficult to employ CMP for a planarization process of the single crystal semiconductor layer 117 when a glass substrate is used as the supporting substrate 100 because a glass substrate is easily bendable and has undulation. In this embodiment mode, this planarization process is performed by an irradiation process with the laser beam 122. Accordingly, the single crystal semiconductor layer 117 can be planarized without applying any force that may damage the supporting substrate 100 and without heating the supporting substrate 100 at a temperature exceeding its strain point. Accordingly, in this embodiment mode, a glass substrate can be used as the supporting substrate 100. That is, this embodiment mode discloses an innovative method for using a laser beam irradiation process in a method for manufacturing a semiconductor substrate.

When irradiation with the laser beam 122 is performed, the single crystal semiconductor layer 117 which is fixed to the supporting substrate 100 is heated, whereby the temperature of the single crystal semiconductor layer 117 is increased. The heating temperature can be higher than or equal to 200° C. and lower than or equal to the strain point of the supporting substrate 100. The heating temperature is preferably 400° C. or higher, more preferably, 450° C. or higher. Specifically, the heating temperature is preferably 400° C. or higher and 670° C. or lower, more preferably, 450° C. or higher and 650° C. or lower. By heating of the single crystal semiconductor layer 117, the energy needed for recovery of the crystallinity and planarization of the single crystal semiconductor layer 117 can be reduced. Accordingly, the width of the beam shape of the laser beam 122 (the length in a scanning direction) can be increased, or the overlap percentage of the laser beam 122 can be decreased. Thus, a scanning rate can be increased. As a result, cycle time for processing of one substrate is shortened; thus, throughput of a laser irradiation process is improved.

By heating of the single crystal semiconductor layer 117 during a laser irradiation process, dangling bonds in the single crystal semiconductor layer 117 or microdefects such as defects at the interface between the single crystal semiconductor layer 117 and a base film (here, the first insulating layer 113) can be removed, and the single crystal semiconductor layer 112 having better characteristics can be obtained. With the use of the semiconductor substrate 10 in which the single crystal semiconductor layer 112 having a small number of crystal defects, such as dislocation, or crystal microdefects, such as dangling bonds, is fixed, a transistor with high on current and high field-effect mobility can be formed. In order to obtain such effects, the single crystal semiconductor layer 117 is preferably heated to 400° C. or higher, more preferably, 500° C. or higher.

In the case where a glass substrate is used as the supporting substrate 100, the supporting substrate 100 to which the single crystal semiconductor layer 117 is fixed is heated to 500° C. or higher, preferably, 550° C. or higher, whereby the supporting substrate 100 can be shrunk. Accordingly, in the case where a transistor is formed using a glass substrate to which the single crystal semiconductor layer 112 is fixed, if the glass substrate is shrunk in advance in the process of manufacturing the semiconductor substrate, shrinkage in the process of manufacturing a transistor can be suppressed. Therefore, mask misalignment in a light-exposure step can be suppressed.

By the laser irradiation process, not only the single crystal semiconductor layer 117 but also the first insulating layer 113a which is in contact with the single crystal semiconductor layer 117 is heated. When the first insulating layer 113a is made to contain a halogen, the halogen is diffused from the first insulating layer 113a and can be segregated at the interface between the single crystal semiconductor layer 112 which is obtained by re-single-crystallization and the first insulating layer 113a. By segregation of a halogen at the interface between the single crystal semiconductor layer 112 and the first insulating layer 113a, the halogen can capture mobile ions of sodium or the like which are present at the interface. Thus, in the case where a glass substrate is used as the supporting substrate 100, the first insulating layer 113a which contains a halogen is very effective for a laser irradiation process while heating is performed, as a barrier layer to prevent contamination of the single crystal semiconductor layer 112 by an impurity such as sodium.

To form the first insulating layer 113a which is in contact with the single crystal semiconductor layer 117 and contains a halogen and to form the first insulating layer 113b which is in contact with the first insulating layer 113a and serves as a barrier layer with a high impurity blocking effect are effective in increasing the concentration of the halogen that is segregated at the interface between the single crystal semiconductor layer 112 and the first insulating layer 113a. The reason is that a larger amount of halogen is diffused to the single crystal semiconductor layer 112 side because a halogen is not easily diffused into the first insulating layer 113b that serves as a barrier layer. Examples of the above-described first insulating layer 113b include a silicon nitride film and a silicon nitride oxide film.

The above-described first insulating layer 113a and first insulating layer 113b can be formed by a method where the first insulating layer 113a and the first insulating layer 113b are successively formed of either silicon oxynitride or silicon oxide and either silicon nitride oxide or silicon nitride, respectively, in a chamber of a PECVD apparatus after plasma cleaning with, for example, $NF_3$. Successive formation of the first insulating layer 113a and the first insulating layer 113b can be achieved by changing a process gas for film formation to be supplied to the chamber.

Lasers can be classified into pulsed lasers, continuous wave lasers, and quasi-continuous wave lasers according to their emission mode. It is recommended to use a pulsed laser to perform re-single-crystallization of a melted portion of the single crystal semiconductor layer 117. When a pulsed laser is used, a region which is irradiated with one pulse (one shot) of a laser beam is melted, solidified, and recrystallized by the time it is irradiated with the subsequent pulse. In other words, a region which is melted by being irradiated with one pulse is recrystallized and returns to a solid-phase state by the time it is irradiated with the subsequent pulse. Thus, the most stable state when a region which is melted with a laser beam emitted from a pulsed laser is solidified is a single crystal structure that is obtained through crystal growth from a single crystal which is not melted.

On the other hand, in the case of a continuous wave laser, laser beam irradiation is not intermittent but constant. Thus, by scanning with a laser beam, the interface between a melted region (a liquid-phase region) and a solid-phase region is moved in that direction. Therefore, when the melted region is solidified, uniform crystal growth is unlikely to occur; the orientation of crystal axes does not become uniform; and grain boundaries are likely to be generated. The same applies to quasi-continuous wave lasers.

Accordingly, in a laser irradiation step, re-single-crystallization of the single crystal semiconductor layer 117 can be performed with higher reproducibility when a pulsed laser is used. As a pulsed laser, a laser having a repetition rate of less than 10 MHz, preferably 10 kHz or less can be used. When the repetition rate is less than 10 MHz, a region can be melted and solidified with every shot of a laser beam before being irradiated with the subsequent shot. In addition, the pulse width of a laser beam which is emitted from a pulsed laser can range from 10 nsec to 500 nsec.

Examples of the pulsed laser that is used for the laser irradiation step of FIG. 5A include excimer lasers such as a XeCl laser and a KrF laser and gas lasers such as an Ar laser and a Kr laser. Other examples that can be used are solid-state lasers such as a YAG laser, a $YVO_4$ laser, a YLF laser, a $YAlO_3$ laser, a $GdVO_4$ laser, a KGW laser, a KYW laser, and a $Y_2O_3$ laser. As the laser beam, a fundamental wave, a harmonic (such as a second harmonic, a third harmonic, or a fourth harmonic) of any of these lasers can be used. Some of these solid-state lasers can be either a continuous wave laser or a quasi-continuous wave laser even when using the same laser medium.

As a laser that emits the laser beam 122, a laser whose emission wavelength is in the range from the ultraviolet region to the visible light region is selected. The wavelength of the laser beam 122 is a wavelength that is absorbed by the single crystal semiconductor layer 117. The wavelength can be determined in consideration of the skin depth of laser light, and the like. For example, the wavelength can be in the range of 250 nm to 700 nm.

The energy of the laser beam 122 can be determined in consideration of the wavelength of the laser beam 122, the skin depth of the laser beam 122, the thickness of the single crystal semiconductor layer 117, and the like. When a pulsed laser is used, the energy density of the laser beam 122 can be set, for example, in the range of 300 $mJ/cm^2$ to 700 $mJ/cm^2$.

Irradiation with the laser beam 122 may be performed either in an air atmosphere without any control or in an inert gas atmosphere. It is confirmed that each of an air atmosphere and an inert gas atmosphere is effective for recovery of crystallinity and planarization of the single crystal semiconductor layer 117. It is also confirmed that an inert gas atmosphere is more preferable than an air atmosphere. An inert gas atmosphere such as nitrogen is more effective than an air atmosphere in improving planarity of the single crystal semiconductor layer 117. In addition, deformation such as a crack is less likely to be generated in an inert gas atmosphere than in an air atmosphere, and the energy of the laser beam 122 to reduce crystal defects and to achieve planarization can be selected from a wider range in an inert gas atmosphere than in an air atmosphere.

In order to perform irradiation with the laser beam 122 in an inert gas atmosphere, irradiation with the laser beam 122 may be performed in an airtight chamber. By supply of an inert gas into this chamber, irradiation with the laser beam 122 can be performed in an inert gas atmosphere. When a chamber is not used, a surface of the single crystal semiconductor layer 117 is irradiated with the laser beam 122 while an inert gas is blown onto the irradiated surface. Accordingly, irradiation with the laser beam 122 in an inert gas atmosphere can be achieved.

An inert gas refers to a gas of molecules or atoms that do not form an oxide film by reacting with a surface of a single crystal semiconductor layer in a laser beam irradiation step. Examples of inert gases include a nitrogen gas ($N_2$ gas), noble gases such as argon and xenon, and the like. The concentration of oxygen in an inert gas is preferably 30 ppm or less, more preferably, 10 ppm or less.

When the laser irradiation process is performed in an airtight chamber, the pressure inside the chamber is reduced to a vacuum. Accordingly, an effect similar to that produced by performing a laser irradiation process in an inert gas atmosphere can be obtained. It is preferable that the pressure inside the chamber be 12 Pa or less. It is more preferable that the pressure inside the chamber be 4 Pa or less.

It is preferable that the laser beam 122 be made to pass through an optical system so that the laser beam 122 has a linear or rectangular beam shape. Accordingly, irradiation with the laser beam 122 can be performed with high throughput.

Before the single crystal semiconductor layer 117 is irradiated with the laser beam 122, an oxide film such as a natural oxide film, which is formed on the surface of the single crystal semiconductor layer 117, is removed. This is because there is a case where a sufficient planarization effect is not obtained when the single crystal semiconductor layer 117 is irradiated with the laser beam 122 in the presence of an oxide film on the surface of the single crystal semiconductor layer 117. The oxide film can be removed by treatment of the single crystal semiconductor layer 117 with hydrofluoric acid. Treatment with hydrofluoric acid is desirably performed until the surface of the single crystal semiconductor layer 117 becomes water repellent. When the single crystal semiconductor layer 117 has water repellency, it can be confirmed that the oxide film is removed from the single crystal semiconductor layer 117.

The irradiation step with the laser beam 122 of FIG. 5A can be performed as follows. First, the single crystal semiconductor layer 117 is treated with a 100-fold diluted hydrofluoric acid for 110 seconds to remove the oxide film on the surface. Next, the supporting substrate 100 to which the single crystal semiconductor layer 117 is bonded is placed on a stage of a laser irradiation apparatus. With a heating unit such as a resistance heating apparatus which is provided in the stage, the single crystal semiconductor layer 117 is heated to a temperature in the range of 200° C. to 650° C. For example, the single crystal semiconductor layer 117 is heated to 500° C.

As a laser which emits the laser beam 122, a XeCl excimer laser (with a wavelength of 308 nm, a pulse width of 25 nsec, and a repetition rate of 60 Hz) is used. Through an optical system, a section of the laser beam 122 is formed into a linear shape of 300 mm×0.34 mm. The single crystal semiconductor layer 117 is irradiated with the laser beam 122 while the single crystal semiconductor layer 117 is scanned with the laser beam 122. Scanning with the laser beam 122 can be conducted by moving the stage of the laser irradiation apparatus, and the movement rate of the stage corresponds to the scanning rate of the laser beam. The scanning rate of the laser beam 122 is adjusted so that the same irradiation region of the single crystal semiconductor layer 117 is irradiated with 1 to 20 shots of the laser beam 122. The number of shots of the laser beam 122 is preferably greater than or equal to 1 and less than or equal to 11. By being irradiated with one shot of the laser beam 122, the single crystal semiconductor layer 117 can be melted, whereby it can be recrystallized and its surface can be planarized.

Before the single crystal semiconductor layer 117 is irradiated with the laser beam 122, the single crystal semiconductor layer 117 can be etched. It is preferable that the damaged region 115 which remains on the separation face of the single crystal semiconductor layer 117 be removed by this etching. By removal of the damaged region 115, a surface planarization effect and a crystallinity recovery effect produced by irradiation with the laser beam 122 can be enhanced.

This etching can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a tetramethylammonium hydroxide (abbr.: TMAH) solution.

In the case where this etching is performed, it is also preferable that an oxide film such as a natural oxide film, which is formed on the surface of the single crystal semiconductor layer 117 after the etching, be removed before the single crystal semiconductor layer 117 is irradiated with the laser beam 122. The oxide film can be removed by treatment of the single crystal semiconductor layer 117 with hydrofluoric acid.

After the single crystal semiconductor layer 117 is irradiated with the laser beam 122, the single crystal semiconductor layer 112 may be thinned by etching. The thickness of the single crystal semiconductor layer 112 can be determined in accordance with characteristics of an element to be formed with the single crystal semiconductor layer 112. In order to form a thin gate insulating layer with excellent step coverage over the surface of the single crystal semiconductor layer 112 which is bonded to the supporting substrate 100, the thickness of the single crystal semiconductor layer 116 is preferably 50 nm or less and may be 5 nm or more and 50 nm or less.

The etching for thinning the single crystal semiconductor layer 112 can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a TMAH solution.

Because the steps from FIG. 4A to FIG. 5B can be performed at a temperature of 700° C. or lower, a glass substrate having an allowable temperature limit of 700° C. or lower can be used as the supporting substrate 100. Thus, an inexpensive glass substrate can be used, whereby material cost of the semiconductor substrate 10 can be reduced.

Note that, by using the method of this embodiment mode, a plurality of single crystal semiconductor layers 112 can also be bonded to one piece of the supporting substrate 100. A plurality of single crystal semiconductor substrates 110 each having the structure of FIG. 4C is formed through the steps of FIGS. 4A to 4C. Then, the step of FIG. 4D is repeated a plurality of times, thereby bonding the plurality of single crystal semiconductor substrates 110 to one piece of the supporting substrate 100. After that, through the steps of FIG. 4E to FIG. 5B, it is possible to manufacture a semiconductor substrate 20 including the supporting substrate 100 to which a plurality of single crystal semiconductor layers 112 is bonded as shown in FIG. 2.

In order to manufacture the semiconductor substrate 20, it is preferable that a glass substrate of 300 mm×300 mm or larger be used as the supporting substrate 100. As a large-area glass substrate, a mother glass substrate which is developed for production of liquid crystal panels is preferred. Examples of the size of known mother glass substrates are as follows: the third generation (550 mm×650 mm); the 3.5th generation (600 mm×720 mm); the fourth generation (680 mm×880 mm or 730 mm×920 mm); the fifth generation (1100 mm×1300 mm); the sixth generation (1500 mm×1850 mm); the seventh generation (1870 mm×2200 mm); the eighth generation (2200 mm×2400 mm); and the like.

By the use of a large-area substrate like a mother glass substrate as the supporting substrate 100, an SOI substrate having a larger area can be obtained. If an SOI substrate having a larger area can be obtained, a number of chips such as ICs or LSIs can be manufactured from one piece of SOI substrate and a larger number of chips can be manufactured from one piece of substrate. Accordingly, productivity can be drastically improved.

Figure 2:
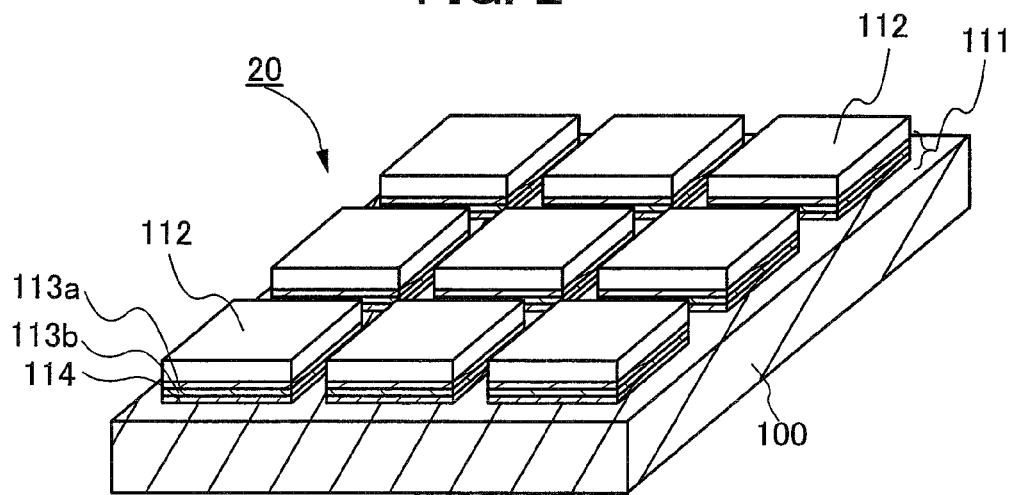
FIG. 2 shows an external view of an example of a structure of a semiconductor substrate.

In the case where the supporting substrate 100 of the semiconductor substrate 20 in FIG. 2 is a substrate which is easily bendable and brittle like a glass substrate, it is very difficult to employ a polishing process for planarization of the plurality of single crystal semiconductor layers 117 which is bonded to one supporting substrate. In this embodiment mode, this planarization process is performed by an irradiation process with the laser beam 122. Accordingly, the plurality of single crystal semiconductor layers 117 which is fixed to the supporting substrate 100 can be planarized without applying any force that may damage the supporting substrate 100 and without heating the supporting substrate 100 at a temperature exceeding its strain point. That is, a laser beam irradiation process is a very important process in the manufacturing process of the semiconductor substrate 20 to which a plurality of single crystal semiconductor layers 112 is fixed as shown in FIG. 2. That is, this embodiment mode discloses an innovative method for using a laser beam irradiation process.

Embodiment Mode 2

In this embodiment mode, a semiconductor substrate in which a single crystal semiconductor layer is fixed to a supporting substrate with a buffer layer interposed therebetween and a manufacturing method thereof will be described. In this embodiment mode, a method for manufacturing a semiconductor substrate in which a buffer layer is formed over a supporting substrate will be described.

Figure 6:
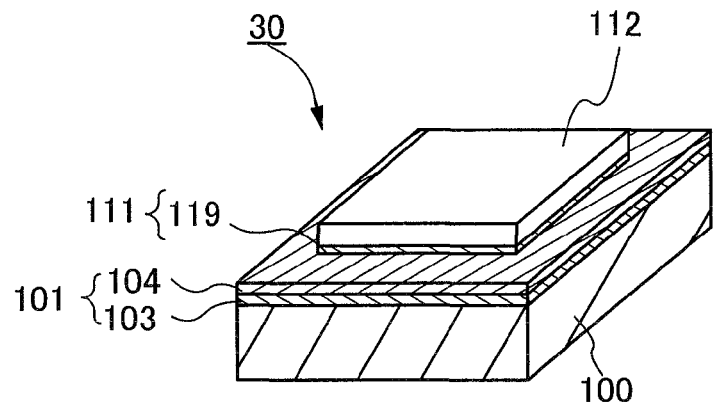
FIG. 6 shows an external view of an example of a structure of a semiconductor substrate.

FIG. 6 shows a perspective view of an example of a structure of a semiconductor substrate. In a semiconductor substrate 30, a single crystal semiconductor layer 112 is bonded to a supporting substrate 100. The single crystal semiconductor layer 112 is formed by thinning of a single crystal semiconductor substrate and is fixed to the supporting substrate 100 with a buffer layer 111 and a buffer layer 101 interposed therebetween. The semiconductor substrate 30 is a substrate having a so-called SOI structure, in which a single crystal semiconductor layer is formed over an insulating layer. The single crystal semiconductor layer 112 is fixed to the supporting substrate 100 by bonding of the surface of the buffer layer 101 formed over the supporting substrate 100 and the surface of the buffer layer 111 formed over the single crystal semiconductor layer 112 to each other.

The buffer layer 101 is a film having a single layer structure or film having a multilayer structure in which two or more layers are stacked. A film included in the buffer layer 101 is formed on the surface of the supporting substrate 100 by a film formation process. In this embodiment mode, the buffer layer 101 is a film having a two-layer structure in which an insulating layer 103 and an insulating layer 104 are stacked from the supporting substrate 100 side. In this embodiment mode, the insulating layer 103 which is formed in contact with the supporting substrate 100 functions as a barrier layer. The buffer layer 111 is a film having a single layer structure or a film having a multilayer structure in which two or more layers are stacked. A film included in the buffer layer 111 is formed on the surface of the single crystal semiconductor substrate by a film formation process. In this embodiment mode, the buffer layer 111 has a single layer structure and is formed of an insulating layer 119.

A method for manufacturing the semiconductor substrate 30 shown in FIG. 6 is hereinafter described with reference to FIG. 8, FIGS. 9A to 9E, and FIGS. 10A and 10B.

Figure 8:
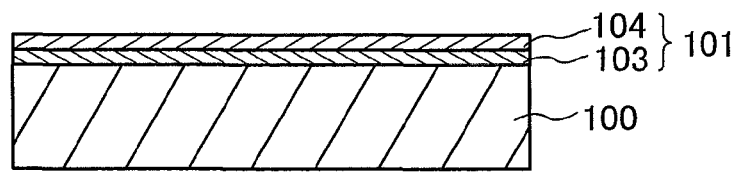
FIG. 8 shows a cross-sectional view illustrating a method for manufacturing a semiconductor substrate.

First, a step of forming the buffer layer 101 over the supporting substrate 100 is described. FIG. 8 shows a cross-sectional view illustrating the step of forming the buffer layer 101. As a film included in the buffer layer 101, an insulating film containing silicon or germanium as its component, such as a silicon oxide film, a silicon nitride film, a silicon oxynitride film, a silicon nitride oxide film, a germanium oxide film, a germanium nitride film, a germanium oxynitride film, or a germanium nitride oxide film can be used. Further, an insulating film including metal oxide such as aluminum oxide, tantalum oxide, or hafnium oxide; an insulating film including metal nitride such as aluminum nitride; an insulating film including metal oxynitride such as an aluminum oxynitride film; or an insulating film including metal nitride oxide such as an aluminum nitride oxide film can also be used. The insulating film included in the buffer layer 101 can be formed by a CVD method, a sputtering method, a method in which the single crystal semiconductor substrate 110 is oxidized or nitrided, or the like.

The buffer layer 101 preferably includes a barrier layer for preventing sodium from entering the single crystal semiconductor layer 112. The barrier layer may be a single layer or two or more layers. For example, in the case where a substrate containing impurities that may reduce reliability of the semiconductor device, such as an alkali metal, an alkaline earth metal, or the like is used as the supporting substrate 100, such impurities might diffuse into the single crystal semiconductor layer 112 from the supporting substrate 100, such as when the supporting substrate 100 is heated. Therefore, by formation of the barrier layer in the buffer layer 101, such impurities that may reduce reliability of the semiconductor device such as an alkali metal, an alkaline earth metal, or the like can be prevented from being moved to the single crystal semiconductor layer 112. Examples of the film which functions as a barrier layer are as follows: a silicon nitride film, a silicon nitride oxide film, an aluminum nitride film, an aluminum nitride oxide film, and the like. When including such a film, the buffer layer 101 can function as a barrier layer.

For example, in the case where the buffer layer 101 has a single layer structure, the buffer layer 101 is preferably formed of a film which functions as a barrier layer. In this case, the buffer layer 101 having a single layer structure can be formed of a silicon nitride film, a silicon nitride oxide film, an aluminum nitride film, or an aluminum nitride oxide film having a thickness of 5 nm to 200 nm.

When the buffer layer 101 is a film having a two-layer structure including one barrier layer, a film to be in contact with the supporting substrate 100 is formed of a barrier layer for blocking impurities such as sodium or the like. In this embodiment mode, the insulating layer 103 is formed of an insulating film which is formed as a barrier layer. The insulating layer 103 can be formed of a silicon nitride film, a silicon nitride oxide film, an aluminum nitride film, or an aluminum nitride oxide film having a thickness of 5 nm to 200 nm.

These films which function as barrier layers have a high blocking effect for preventing impurity diffusion, but their internal stress is also high. Therefore, as the insulating layer 104 which is in contact with the insulating layer 103, a film with an effect of relieving the stress of the buffer layer 101 is preferable. As the insulating film having such an effect, a silicon oxide film, a silicon oxynitride film, and the like are given. The insulating layer 104 can be formed at a thickness of from 5 nm to 300 nm. Because the upper surface of the insulating layer 104 serves as a bonding surface, the insulating layer 104 preferably has an average surface roughness $R_a$ of 0.7 nm or less, more preferably, 0.4 nm or less. The insulating layer 104 can have a thickness ranging from 10 nm to 200 nm. The insulating layer 104 preferably has a thickness ranging from 5 nm to 500 nm, more preferably 10 nm to 200 nm.

For example, the insulating layer 103 can be formed of a silicon oxynitride film by a PECVD method using $SiH_4$ and $N_2O$ as a process gas. Furthermore, the insulating layer 104 can be formed of a silicon oxide film by a PECVD method using an organosilane gas and oxygen as a process gas.

For example, in the case where the insulating layer 103 using silicon nitride oxide and the insulating layer 104 using silicon oxynitride are formed by a PECVD method, the supporting substrate 100 is carried into a chamber of a PECVD apparatus. Then, $SiH_4$, $N_2O$, $NH_3$, $H_2$, and $N_2O$ are supplied to the chamber as a process gas for formation of the insulating layer 103, and plasma of this process gas is generated, whereby a silicon nitride oxide film is formed over the single crystal semiconductor substrate 110. Next, the gas introduced into the chamber is changed to a process gas for formation of the insulating layer 104. Here, $SiH_4$ and $N_2O$ are used. Plasma of a mixed gas of these is generated, and a silicon nitride oxide film is formed over a silicon oxynitride film in succession. In the case where a PECVD apparatus having a plurality of chambers is used, a silicon oxynitride film and a silicon nitride oxide film can be formed in different chambers. Needless to say, by change of a gas introduced into the chamber, a silicon oxide film can be formed as the lower layer and a silicon nitride film can be formed as the upper layer.

When the insulating layer 103 and the insulating layer 104 are successively formed as described above, the buffer layer 101 can be formed over a plurality of supporting substrates 100 with high throughput. In addition, because the insulating layer 103 and the insulating layer 104 can be formed without exposure to the atmosphere, the interface between the insulating layer 103 and the insulating layer 104 can be prevented from being contaminated by the atmosphere.

Next, a method for treating the single crystal semiconductor substrate 110 is described with reference to FIGS. 9A to 9E. First, similar to Embodiment Mode 1, the single crystal semiconductor substrate 110 is washed and cleaned. Then, a protective film 131 is formed over a surface of the single crystal semiconductor substrate 110. The protective film 131 is formed for purposes of preventing the single crystal semiconductor substrate 110 from being contaminated by an impurity such as a metal, preventing the surface of the single crystal semiconductor substrate 110 from being damaged by impact of ions with which the surface is irradiated, and the like. This protective film 131 can be formed by deposition of an insulating material such as a silicon oxide film, a silicon nitride film, a silicon nitride oxide film, a silicon oxynitride film by a CVD method or the like. Alternatively, the protective film 131 can be formed by oxidation or nitridation of the single crystal semiconductor substrate 110. For example, in order to form the protective film 131 of an oxide film by oxidizing the single crystal semiconductor substrate 110, thermal oxidation treatment (dry oxidation treatment, steam oxidation treatment) or oxidation treatment with ozone-containing water may be performed. In the case of dry oxidation treatment, it is preferable to add a halogen-containing gas to an oxidizing atmosphere. As a halogen-containing gas, one kind or plural kinds of gases selected from HCl, HF, $NF_3$, HBr, $Cl_2$, ClF, $BCl_3$, $F_2$, $Br_2$, and the like can be used.

Figure 9A:
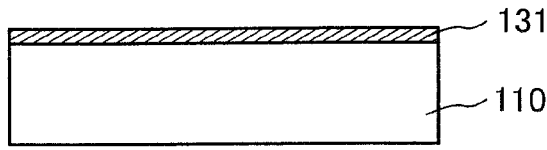
FIGS. 9A to 9E show cross-sectional views illustrating a method for manufacturing a semiconductor substrate.
Figure 9B:
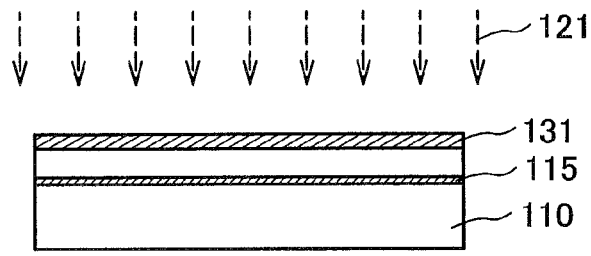

Next, as shown in FIG. 9B, through the protective film 131, the single crystal semiconductor substrate 110 is irradiated with ions 121 that are ions accelerated by an electric field, thereby forming a damaged region 115 in a region at a predetermined depth from the surface of the single crystal semiconductor substrate 110. This step can be conducted similar to the formation step of the damaged region 115 in Embodiment Mode 1.

Figure 9C:
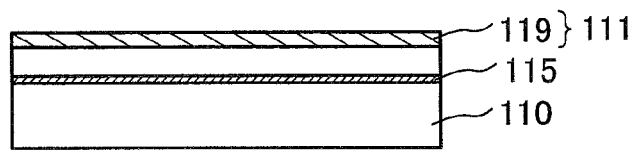

After the damaged region 115 is formed, the protective film 131 is removed. Then, as shown in FIG. 9C, an insulating layer 119 which forms the buffer layer 111 is formed over the surface of the single crystal semiconductor substrate 110. The insulating layer 119 can be formed similar to the second insulating layer 114 of FIG. 4C. The insulating layer 119 can also be formed by oxidation treatment of the single crystal semiconductor substrate 110. Note that oxidation treatment is performed at a process temperature at which an element or a molecule that is added to the damaged region 115 does not precipitate, preferably at 350° C. or lower. As such low-temperature oxidation treatment, oxidation treatment with ozone-containing water, oxidation treatment with plasma treatment or high-density plasma treatment, or the like can be used.

The insulating layer 119 is a layer for forming a smooth hydrophilic bonding surface on the single crystal semiconductor substrate 110. Therefore, the insulating layer 119 preferably has an average roughness $R_a$ of 0.7 nm or less, more preferably, 0.4 nm or less. The insulating layer 119 can have a thickness ranging from 10 nm to 200 nm. The insulating layer 119 preferably has a thickness ranging from 5 nm to 500 nm, more preferably 10 nm to 200 nm.

The insulating layer 119 can be formed of an insulating film by chemical vapor reaction. For example, a silicon oxide film, a silicon oxynitride film, a silicon nitride oxide film, a silicon nitride film, or the like can be formed as the insulating layer 119. In the case where a silicon oxide film is formed as the insulating layer 119 by a PECVD method, it is preferable to use an organosilane gas and an oxygen ($O_2$) gas as a source gas. By using organosilane as the source gas, it is possible to form a silicon oxide film having a smooth surface at a process temperature of 350° C. or lower. Alternatively, the insulating layer 119 can be formed using a low temperature oxide (LTO) which is formed by a thermal CVD method at a heating temperature of from 200° C. to 500° C. LTO can be formed by using monosilane ($SiH_4$), disilane ($Si_2H_6$), or the like as a silicon source gas and using $N_2O$ or the like as an oxygen source gas.

Examples of conditions for formation of the insulating layer 119 of a silicon oxide film by using TEOS and $O_2$ as a source gas are that TEOS is introduced into the chamber at a flow rate of 15 sccm and $O_2$ is introduced into the chamber at a flow rate of 750 sccm and that the film formation pressure is 100 Pa, the film formation temperature is 300° C., the RF output is 300 W, and the power frequency is 13.56 MHz.

Next, the single crystal semiconductor substrate 110 provided with the damaged region 115 and the buffer layer 111 and the supporting substrate 100 provided with the buffer layer 101 are cleaned. This cleaning step can be performed by ultrasonic cleaning with pure water. The ultrasonic cleaning is preferably megahertz ultrasonic cleaning (megasonic cleaning). After the ultrasonic cleaning, it is preferable that one or both of the single crystal semiconductor substrate 110 and the supporting substrate 100 be cleaned with ozone-containing water. By cleaning with ozone-containing water, removal of an organic substance and surface activation treatment to improve hydrophilicity of the buffer layers 101 and 111 can be performed.

The surface activation treatment of the buffer layers 101 and 111 can be performed by irradiation with an atomic beam or an ion beam, plasma treatment, or radical treatment as well as cleaning with ozone-containing water. When an irradiation process with an atomic beam or an ion beam is performed, a noble gas neutral atom beam or noble gas ion beam of argon or the like can be used.

Figure 9D:
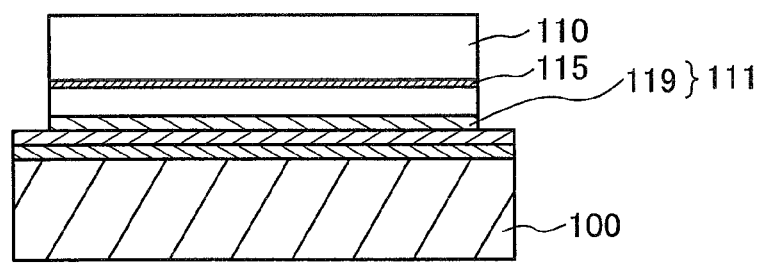

FIG. 9D shows a cross-sectional view illustrating a bonding step. This bonding step can be performed similar to the bonding step of FIG. 4D. The supporting substrate 100 and the single crystal semiconductor substrate 110 are disposed in contact with each other with the buffer layers 101 and 111 interposed therebetween. Accordingly, the surface of the buffer layer 101 and the surface of the buffer layer 111 are bonded to each other, and the single crystal semiconductor substrate 110 is fixed to the supporting substrate 100.

After the single crystal semiconductor substrate 110 is bonded to the supporting substrate 100, heat treatment is preferably performed to increase bonding force at the bonding interface between the buffer layers 101 and 111. This treatment is performed at a temperature where a crack is not generated in the damaged region 115 and can be performed at a temperature in the range from 200° C. to 450° C.

Figure 9E:
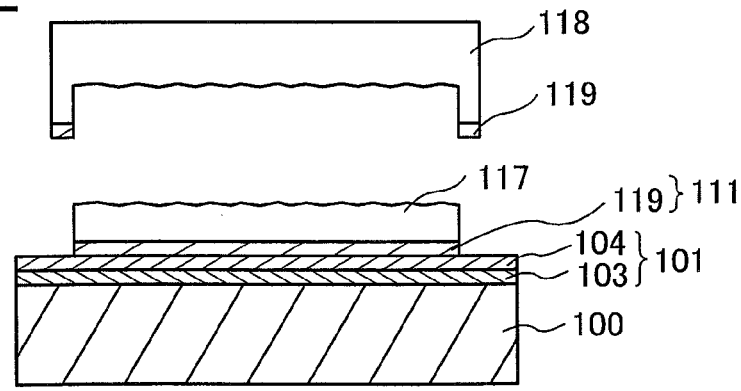

Next, heat treatment is performed to cause separation at the damaged region 115, whereby a single crystal semiconductor layer 117 is separated from the single crystal semiconductor substrate 110. FIG. 9E is a diagram illustrating a separation step where the single crystal semiconductor layer 117 is separated from the single crystal semiconductor substrate 110. This step can be performed similar to the separation step of FIG. 4D.

When heat treatment is performed, a change occurs in the volume of the microvoids in the damaged region 115 to generate a crack in the damaged region 115. As a result, the single crystal semiconductor substrate 110 is cleaved along the damaged region 115, and as shown in FIG. 9E, the single crystal semiconductor layer 117 which is separated from the single crystal semiconductor substrate 110 is fixed to the supporting substrate 100.

Figure 10A:
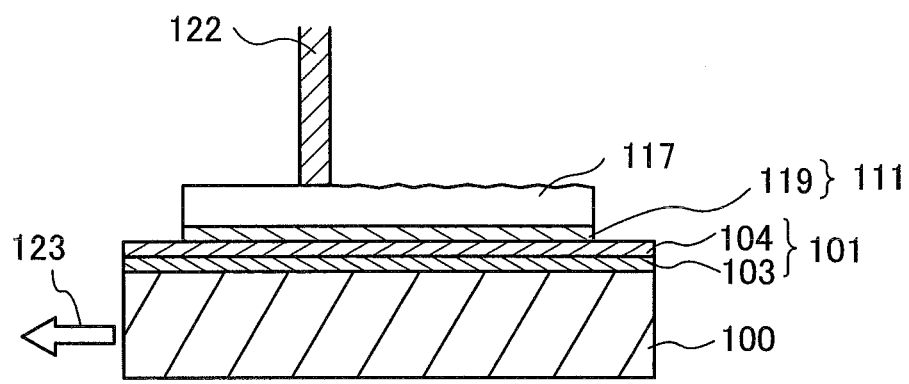
FIGS. 10A and 10B show cross-sectional views illustrating a method for manufacturing a semiconductor substrate.
Figure 10B:
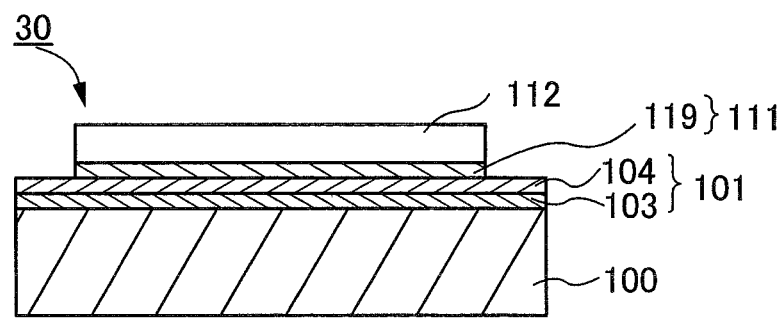

Next, as shown in FIG. 10A, the single crystal semiconductor layer 117 which is in close contact with the supporting substrate 100 is irradiated with the laser beam 122. This laser irradiation step can be performed similar to the laser irradiation step of FIG. 5A. While the single crystal semiconductor layer 117 is heated and scanned with the laser beam 122, the entire separation face of the single crystal semiconductor layer 117 is irradiated with the laser beam 122.

When irradiated with the laser beam 122, the single crystal semiconductor layer 117 absorbs the laser beam 122, and the temperature of a portion irradiated with the laser beam 122 is increased, and the portion is melted. As the supporting substrate 100 is moved, a region irradiated with the laser beam 122 is moved. Thus, the temperature of the melted portion of the single crystal semiconductor layer 117 is decreased, and the melted portion is solidified, and re-single-crystallization thereof is performed. Accordingly, the single crystal semiconductor layer 112 obtained by re-single-crystallization is formed.

When irradiation with the laser beam 122 is performed, the single crystal semiconductor layer 117 which is fixed to the supporting substrate 100 is heated, whereby the temperature of the single crystal semiconductor layer 117 is increased. The heating temperature can be higher than or equal to 250° C. and lower than or equal to the strain point of the supporting substrate 100. The heating temperature is preferably 400° C. or higher, more preferably, 450° C. or higher. Specifically, the heating temperature is preferably 400° C. or higher and 670° C. or lower, more preferably, 450° C. or higher and 650° C. or lower.

By heating of a single crystal semiconductor layer, dangling bonds in the single crystal semiconductor layer or microdefects such as defects at the interface between the single crystal semiconductor layer and a base film can be removed, and a better single crystal semiconductor layer can be obtained. With the use of the semiconductor substrate 30 in which the single crystal semiconductor layer 112 having a small number of crystal defects, such as dislocation, or crystal microdefects, such as dangling bonds, is fixed, a transistor with high on current and high field-effect mobility can be formed.

When the insulating layer 119 which is in contact with the single crystal semiconductor layer 117 is made to contain a halogen, the halogen is diffused from the insulating film because the insulating film is also heated by laser beam irradiation, and the halogen can be segregated at the interface between the single crystal semiconductor layer 112 which is obtained by re-single-crystallization and the insulating layer 119. By segregation of a halogen at the interface between the single crystal semiconductor layer 112 and the insulating layer 119, the halogen can capture mobile ions of sodium or the like which are present at the interface. Thus, in the case where a glass substrate is used as the supporting substrate 100, formation of the insulating layer 119 which contains a halogen and a laser irradiation process while heating is performed are very effective in preventing contamination of the single crystal semiconductor layer 112 by an impurity such as sodium.

When the buffer layer 111 is formed to have two-layer structure, to form an insulating layer containing a halogen in contact with the single crystal semiconductor layer 117 and to form an insulating layer which serves as a barrier layer with a high impurity blocking effect in contact with the insulating layer containing a halogen are effective in increasing the concentration of the halogen that is segregated at the interface between the single crystal semiconductor layer 112 and the buffer layer 111. The reason is that a larger amount of halogen is diffused to the single crystal semiconductor layer 112 side because a halogen is not easily diffused into the barrier layer. Examples of the above-described insulating layer which serves as a barrier layer include a silicon nitride film and a silicon nitride oxide film.

The above-described buffer layer 111 having two-layer structure can be formed by a method where silicon nitride oxide layer or silicon nitride layer is successively formed after silicon oxynitride layer or silicon oxide layer is formed over the single crystal semiconductor substrate 110, in a chamber of a PECVD apparatus after plasma cleaning with, for example, $NF_3$. Successive formation of the two kinds of insulating layers can be achieved by changing a process gas for film formation to be supplied to the chamber.

Note that before the single crystal semiconductor layer 117 is irradiated with the laser beam 122, the single crystal semiconductor layer 117 can be etched. It is preferable that the damaged region 115 which remains on the separation face of the single crystal semiconductor layer 117 be removed by this etching. By removal of the damaged region 115, a surface planarization effect and a crystallinity recovery effect produced by irradiation with the laser beam 122 can be enhanced.

This etching can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a TMAH solution.

After the single crystal semiconductor layer 117 is irradiated with the laser beam 122, the single crystal semiconductor layer 112 may be thinned by etching. The thickness of the single crystal semiconductor layer 112 can be determined in accordance with characteristics of an element to be formed with the single crystal semiconductor layer 112. In order to form a thin gate insulating layer with excellent step coverage over the surface of the single crystal semiconductor layer 112 which is bonded to the supporting substrate 100, the thickness of the single crystal semiconductor layer 112 is preferably 50 nm or less and may be 5 nm or more and 50 nm or less.

The etching for thinning the single crystal semiconductor layer 112 can be performed by using a dry etching method or a wet etching method. Examples of etching gases that can be used in a dry etching method include: chloride gases such as boron chloride, silicon chloride, and carbon tetrachloride; a chlorine gas; fluoride gases such as sulfur fluoride and nitrogen fluoride; an oxygen gas; and the like. An example of an etching solution that can be used in a wet etching method is a TMAH solution.

Because the steps from FIG. 9A to FIG. 10B can be performed at a temperature of 700° C. or lower, a glass substrate having an allowable temperature limit of 700° C. or lower can be used as the supporting substrate 100. Thus, an inexpensive glass substrate can be used, whereby material cost of the semiconductor substrate 30 can be reduced.

Unlike the semiconductor substrate 10 of Embodiment Mode 1 (see FIG. 1), in the semiconductor substrate 30 of this embodiment mode, the surface of the supporting substrate 100 is covered with the buffer layer 101. Thus, when the buffer layer 101 of the semiconductor substrate 30 is provided with a barrier layer, contamination of the single crystal semiconductor layer 112 can be prevented more effectively than in the semiconductor substrate 10.

Note that, by using the method of this embodiment mode, a plurality of single crystal semiconductor layers 112 can also be bonded to one piece of the supporting substrate 100. As shown in FIG. 8, the supporting substrate 100 provided with the buffer layer 101 is prepared. The buffer layer 101 preferably includes a layer that functions as a barrier layer. In addition, the steps from FIGS. 9A to 9C are repeated, thereby preparing a plurality of single crystal semiconductor substrates 110 each provided with the buffer layer 111 and the damaged region 115. Then, the plurality of single crystal semiconductor substrates 110 each having the structure of FIG. 9C is bonded to the supporting substrate 100. After that, through the steps of FIG. 9E to FIG. 10B, it is possible to manufacture a semiconductor substrate 40 including the supporting substrate 100 to which the plurality of single crystal semiconductor layers 112 is bonded as shown in FIG. 7.

In order to manufacture the semiconductor substrate 40, it is preferable that a glass substrate of 300 mm×300 mm or larger be used as the supporting substrate 100. As a large-area glass substrate, a mother glass substrate which is developed for manufacture of liquid crystal panels is preferred. Examples of the size of known mother glass substrates are as follows: the third generation (550 mm×650 mm); the 3.5th generation (600 mm×720 mm); the fourth generation (680 mm×880 mm or 730 mm×920 mm); the fifth generation (1100 mm×1300 mm); the sixth generation (1500 mm×1850 mm); the seventh generation (1870 mm×2200 mm); the eighth generation (2200 mm×2400 mm); and the like.

By the use of a large-area substrate like a mother glass substrate as the supporting substrate 100, an SOI substrate having a larger area can be obtained. If an SOI substrate having a larger area can be obtained, a number of chips such as ICs or LSIs can be manufactured from one piece of SOI substrate and a larger number of chips can be manufactured from one piece of substrate. Accordingly, productivity can be improved drastically.

Figure 7:
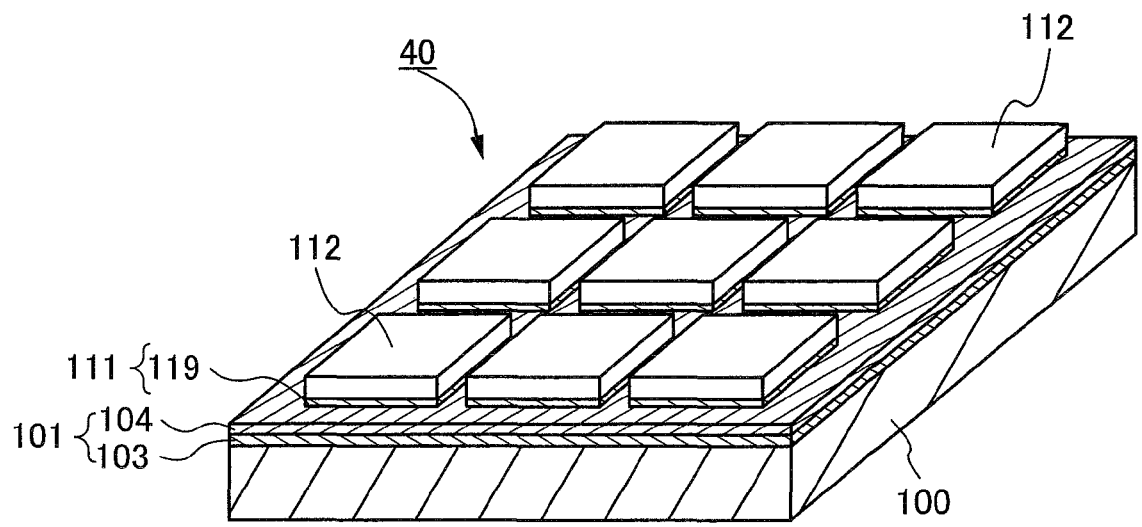
FIG. 7 shows an external view of an example of a structure of a semiconductor substrate.

In the case where the supporting substrate 100 of the semiconductor substrate 40 in FIG. 7 is a supporting substrate which is easily bendable and brittle like a glass substrate, it is very difficult to employ a polishing process for planarization of the plurality of single crystal semiconductor layer 117 which is bonded to one supporting substrate. In this embodiment mode, this planarization process is performed by an irradiation process with the laser beam 122. Accordingly, the single crystal semiconductor layers 117 which are fixed to the supporting substrate 100 can be planarized without applying any force that may damage the supporting substrate 100 and without heating the supporting substrate 100 at a temperature exceeding its strain point. That is, a laser beam irradiation process is a very important process in the manufacturing process of the semiconductor substrate 40 to which a plurality of single crystal semiconductor layers 112 is fixed as shown in FIG. 7.

Embodiment Mode 3

Figure 11:
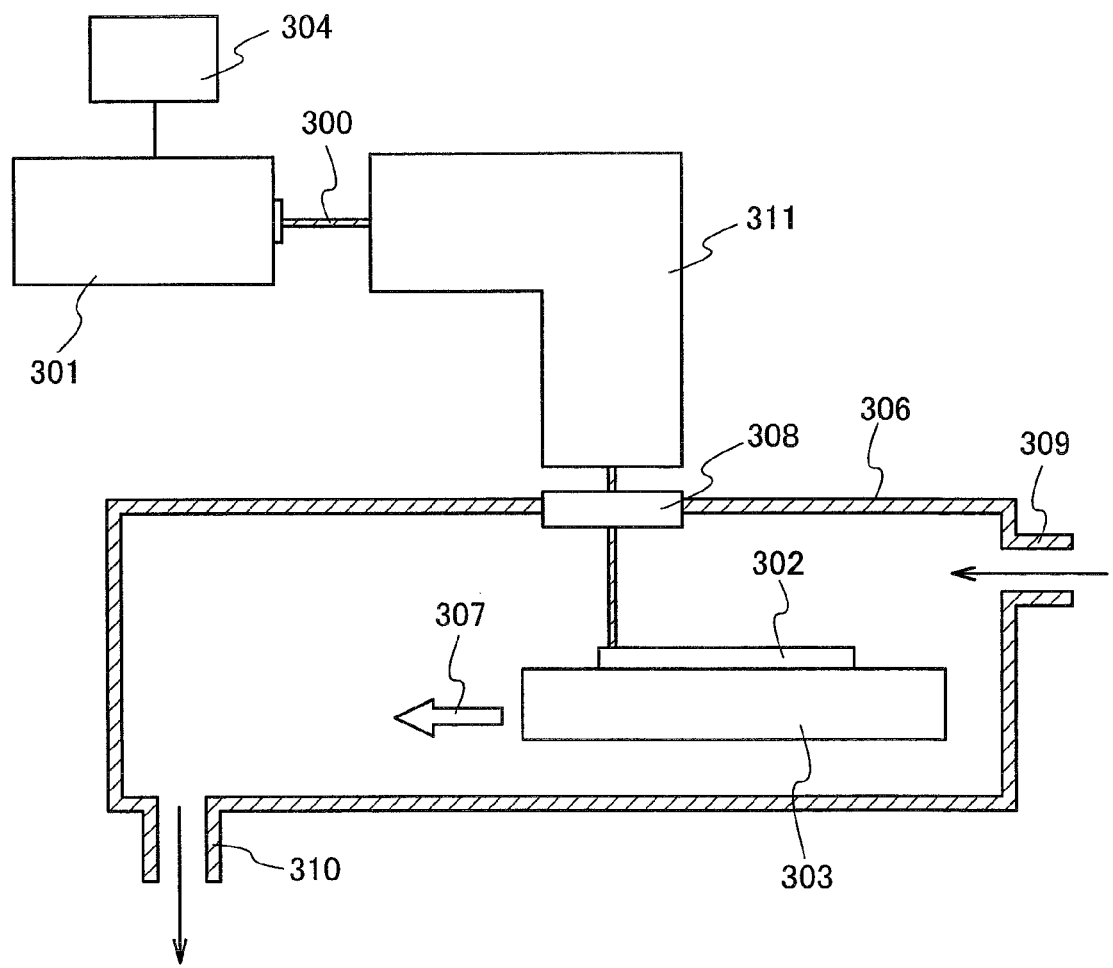
FIG. 11 shows an example of a structure of a laser irradiation apparatus.

In this embodiment mode, a laser irradiation apparatus with which a single crystal semiconductor layer is irradiated with a laser beam while being heated is described. FIG. 11 shows an example of a structure of the laser irradiation apparatus.

As shown in FIG. 11, the laser irradiation apparatus includes a laser 301 that emits a laser beam 300 and a stage 303 where an object 302 is disposed. The laser 301 is connected to a controller 304. By the control of the controller 304, energy of the laser beam 300 emitted from the laser 301, repetition rate, or the like can be changed. The stage 303 is provided with a heating device such as a resistance heating device or the like, with which the object 302 can be heated.

The stage 303 is provided so that the stage 303 can move inside the chamber 306. An arrow 307 indicates a direction of movement of the stage 303.

A window 308 through which the laser beam 300 is guided into the chamber 306 is provided in the wall of the chamber 306. The window 308 is formed using a material having high transmittance for the laser beam 300, for example, quartz. In order to control an atmosphere inside the chamber 306, the chamber 306 is provided with a gas supply port 309 connected to a gas supply device and a gas exhaust port 310 coupled with an exhaust system.

An optical system 311 including a lens, a mirror, or the like is arranged between the laser 301 and the stage 303. The optical system 311 is provided outside the chamber 306. By the optical system 311, the energy distribution of the laser beam 300 emitted from the laser 301 is homogenized and the cross section of the laser beam 300 is formed into a linear or rectangular shape. The laser beam 300 exiting from the optical system 311 enters the chamber 306 through the window 308 and is delivered to the object 302 over the stage 303. While the object 302 is heated with a heater of the stage 303 and the stage 303 is moved, the laser beam 300 is delivered to the object 302. In addition, by supply of an inert gas such as a nitrogen gas from a gas supply port 309, irradiation with the laser beam 300 can be performed in an inert gas atmosphere.

Figure 12A:
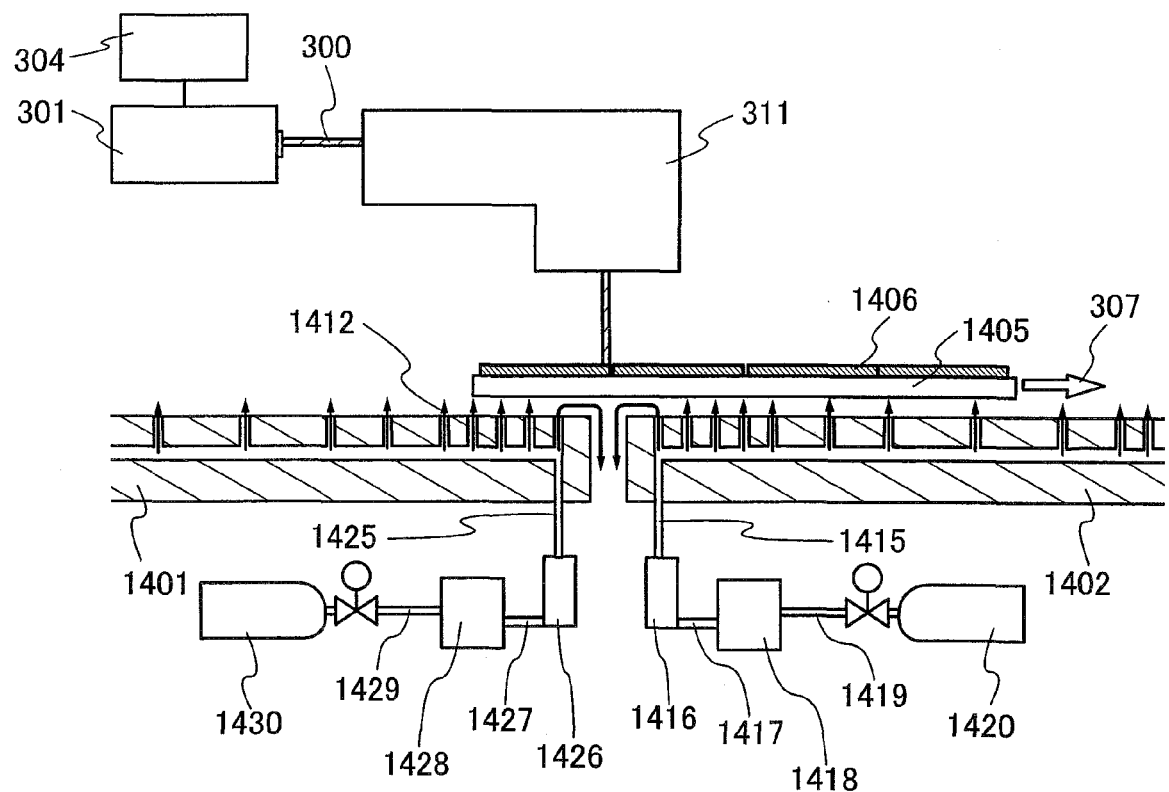
FIG. 12A shows a cross-sectional view of an example of a structure of a laser irradiation apparatus and FIG. 12B shows a top view illustrating positional relationship between a large-area substrate and a laser beam irradiation region.
Figure 13:
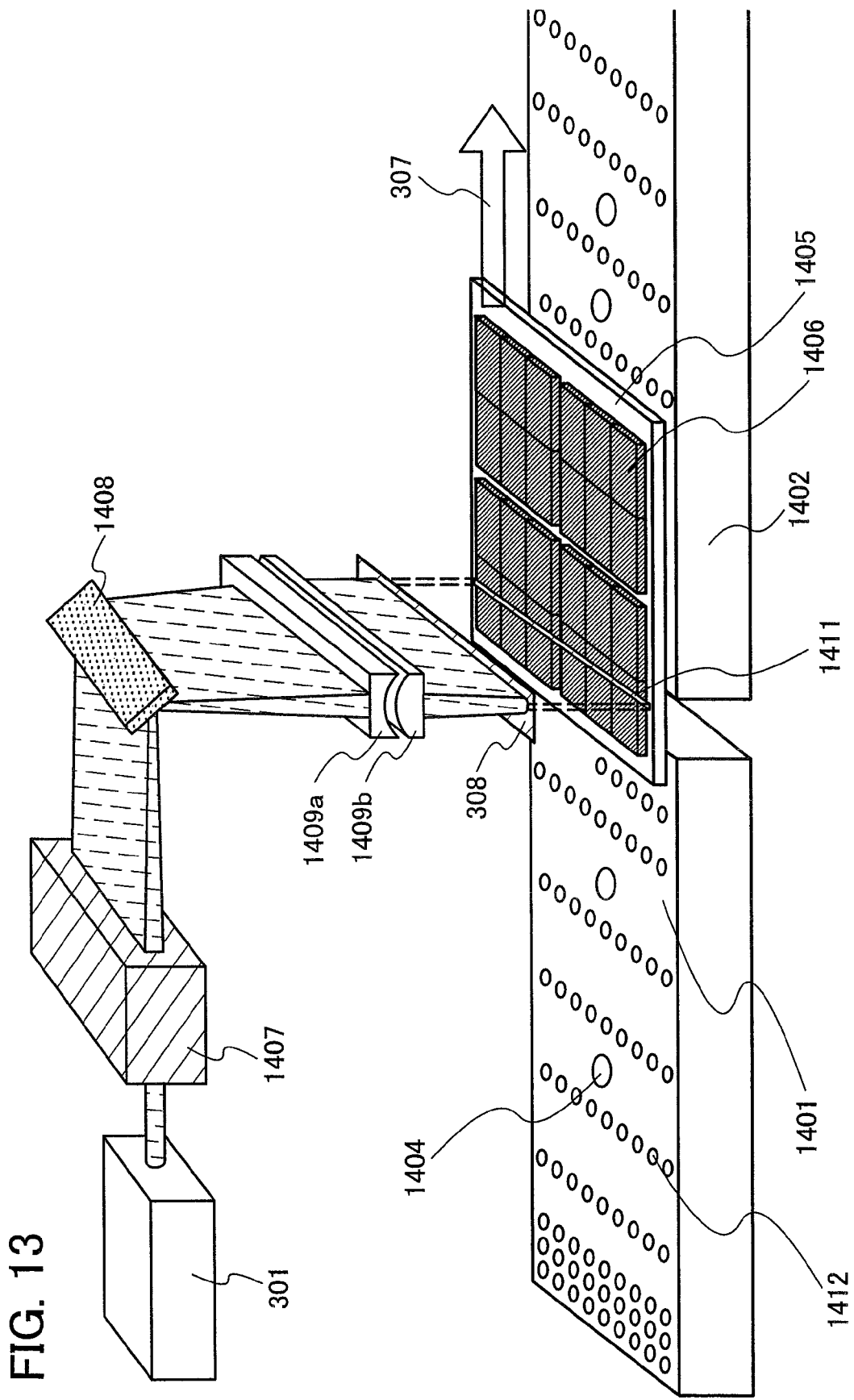
FIG. 13 shows a perspective view of an example of a structure of a laser irradiation apparatus.

In the case where a large-sized substrate is used as the supporting substrate 100, in order to shorten processing time of laser beam irradiation, it is preferable that the length L of a region irradiated with one shot of a laser beam be set long and laser beam irradiation be completed by moving the large-sized substrate in one direction. FIG. 12A shows an example of a structure of a laser irradiation apparatus for processing a large-sized substrate in the above manner. FIG. 12A shows a cross-sectional view of a main portion of the laser irradiation apparatus. This laser irradiation apparatus has a plurality of stages in a chamber and a unit with which a substrate is floated and transferred by blowing of a heated nitrogen gas thereto from gas blowing holes provided in the stage. Note that the chamber is not shown in FIG. 12A. FIG. 13 shows a perspective view of a main portion of the laser irradiation apparatus of FIG. 12A.

By adjustment of the optical system 311 or the like, it is also possible to irradiate a larger area with one shot. If a larger area can be irradiated with one shot, the time it takes to perform a laser irradiation process of each substrate can be shortened. Here, the maximum output energy of the laser 301 is used so that the length L of the region irradiated with a laser beam can be set long.

Figure 12B:
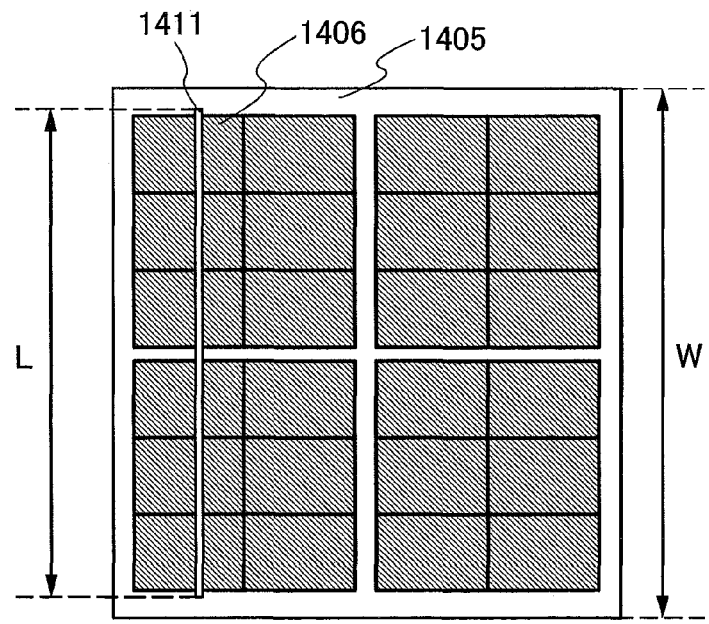

FIG. 12B shows a top view illustrating the positional relationship between a large-sized substrate 1405, a laser beam irradiation region 1411, and a single crystal semiconductor layer 1406 during laser irradiation. As shown in FIG. 12B, the length L of a region irradiated with the laser beam 300 is larger than the total length of sides of six single crystal semiconductor layers 1406 that are arranged in a row. The width of the large-sized substrate 1405 is denoted by W. A side of a region irradiated with a laser beam along a direction perpendicular to the width W of the large-sized substrate is referred to the width of the laser beam. Here, an example is given in which the large-sized substrate 1405 has a size of 600 mm×720 mm and 24 single crystal semiconductor layers 1406 are arranged over one substrate. Each single crystal semiconductor layer 1406 is obtained by being separated from a silicon wafer.

The concentration of oxygen and that of moisture are each 30 ppm or less, preferably, 30 ppb or less. Thus, in order to minimize residual gases such as oxygen and H$_2$O in a chamber (reaction container), after the ultimate pressure is lowered to an ultra-high vacuum (UHV) region of $1\times10^{-7}$ Torr to $1\times10^{-10}$ Torr (about $1\times10^{-5}$ Pa to $1\times10^{-8}$ Pa), a high-purity nitrogen gas is supplied with an extremely low oxygen partial pressure N$_2$ gas generating apparatus, thereby obtaining a nitrogen atmosphere in the chamber. In addition, the laser irradiation apparatus may have a unit with which a high-purity nitrogen gas is evacuated from the chamber and then circulated again into the chamber.

In the case where ultra-high vacuum evacuation is performed to obtain a vacuum lower than $10^{-5}$ Pa in the chamber, it is preferable to use a turbo-molecular pump and a cryopump. Evacuation is performed with the turbo-molecular pump, and vacuum evacuation is performed with the cryopump.

The inner wall of the chamber may have a mirror-like finish, and a heater for baking may be provided to reduce discharge of gas from the inner wall. It is preferable that the chamber be baked (at 200° C. to 300° C.) to remove a residual gas mainly containing moisture, which is present inside the chamber.

A nitrogen gas stored in a gas storage apparatus 1430 is supplied to an extremely low oxygen partial pressure N$_2$ gas generating apparatus 1428 through a valve provided in a tube 1429. Then, the nitrogen gas is supplied from the extremely low oxygen partial pressure N$_2$ gas generating apparatus 1428 to a plurality of gas blowing holes 1412 in the stage 1401 through a tube 1427, a gas heating apparatus 1426, and a tube 1425. The extremely low oxygen partial pressure N$_2$ gas generating apparatus 1428 controls the flow rate and pressure of the nitrogen gas and supplies the nitrogen gas so as to float the large-sized substrate 1405.

Two stages 1401 and 1402 are placed apart from each other so as not to overlap with a laser irradiation region and arranged so as not to be heated by being irradiated with a laser beam. The stage 1402 is also similarly provided with a plurality of gas blowing holes 1412. A nitrogen gas stored in a gas storage apparatus 1420 is supplied to an extremely low oxygen partial pressure N$_2$ gas generating apparatus 1418 through a valve provided in a tube 1419. Then, the concentration of oxygen in the nitrogen gas is lowered by the extremely low oxygen partial pressure N$_2$ gas generating apparatus 1418. The nitrogen gas processed by the extremely low oxygen partial pressure N$_2$ gas generating apparatus 1418 is supplied to the plurality of gas blowing holes 1412 in the stage 1402 through a tube 1417, a gas heating apparatus 1416, and a tube 1415.

In order to make each of the concentration of oxygen and that of moisture in the chamber 30 ppm or less, preferably, 30 ppb or less, a high-purity gas is preferably used as the nitrogen gas to be blown from the plurality of gas blowing holes 1412. Note that although the gas heating apparatuses, the gas storage apparatus, and the like are shown under the stages in FIG. 12A, the structure is merely an example for explanation and there is no particular limitation on the present invention. It is needless to say that these apparatuses and the like can be placed in other places by increasing the length of each tube.

With the plurality of gas blowing holes 1412 provided in the stages 1401 and 1402, the large-sized substrate 1405 can be floated and transferred to a direction indicated by an arrow 307.

Note that other components of the laser irradiation apparatus are similar to those of FIG. 11; thus, description thereof is omitted here.

As shown in FIG. 13, the stage 1402 is provided with gas evacuating holes 1404, and a flow rate controller (not shown) is provided to control the flow rate of a gas evacuated through the gas evacuating holes 1404. A lager number of gas blowing holes are provided in an end portion of the stage than in a central portion, thereby preventing the substrate from bending.

A laser irradiation unit shown in FIG. 13 has the laser 301, an optical device 1407 incorporating a homogenizer, a reflecting mirror 1408, a doublet lens 1409a, and a doublet lens 1409b. Note that to make the energy distribution of a laser beam even is generally referred to as "to homogenize", and a homogenizing optical system is referred to as a homogenizer. A laser beam emitted from the laser 301 is expanded by a spherical lens. Note that the spherical lens is not required when the beam shape of a beam emitted from the laser 301 is sufficiently large. Then, the laser beam is split in a long-side (long-axis) direction of a linear spot by a cylindrical lens array. After that, the laser beams are synthesized into a single beam on the large-sized substrate 145 by a cylindrical lens which is located posterior to the cylindrical lens array. Thus, the large-sized substrate 1405 is irradiated with a laser beam having a linear beam shape. In addition, the energy distribution along the long-side direction of a beam shape is homogenized (long-axis homogenization) on the surface of the large-sized substrate 1405, and the length along the long-side direction is determined.

With the use of the manufacturing apparatus shown in FIG. 12A and FIG. 13, a laser irradiation process can be performed in a shorter time.

Embodiment Mode 4

A single crystal semiconductor substrate from which a single crystal semiconductor layer has been separated can be reprocessed and then reused as the single crystal semiconductor substrate 110. In this embodiment mode, a reprocessing method is described. In this embodiment mode, a reprocessing method is described using as an example the single crystal semiconductor substrate 118 which is employed in Embodiment Mode 1.

As shown in FIG. 4E, a portion which is not bonded to the supporting substrate 100 is left remaining at the periphery of the single crystal semiconductor substrate 118. Portions of the first insulating layer 113b, the first insulating layer 113a, and the second insulating layer 114 which are not bonded to the supporting substrate 100 remain in this portion.

First, etching treatment is performed to remove the first insulating layer 113a, the first insulating layer 113a, and the second insulating layer 114. For example, when these films are formed of silicon oxide, silicon oxynitride, or silicon nitride oxide, the first insulating layer 113b, the first insulating layer 113a, and the second insulating layer 114 can be removed by wet etching treatment using an aqueous hydrogen fluoride solution (hydrofluoric acid).

Next, the single crystal semiconductor substrate 118 is etched, thereby removing this peripheral projecting portion and the surface from which the single crystal semiconductor layer 117 has been separated. The etching treatment for the single crystal semiconductor substrate 118 is preferably wet etching treatment, and tetramethylammonium hydroxide (abbr.: TMAH) can be used as an etchant.

After the single crystal semiconductor substrate 118 is subjected to etching treatment, the surface thereof is polished and planarized. For the polishing treatment, mechanical polishing, chemical mechanical polishing (abbr.: CMP), or the like can be used. In order to smooth the surface of the single crystal semiconductor substrate, it is preferable that the surface be polished approximately 1 μm to 10 μm. After the polishing, hydrofluoric acid cleaning or RCA cleaning is performed because abrasive particles and the like are left on the surface of the single crystal semiconductor substrate.

Through the above-mentioned process, the single crystal semiconductor substrate 118 can be reused as the single crystal semiconductor substrate 110 which is shown in FIG. 3. By reuse of the single crystal semiconductor substrate 118, material cost of the semiconductor substrate 10 can be reduced.

The single crystal semiconductor substrates 118 which are used for manufacture of the semiconductor substrate 30 and the semiconductor substrate 40 can also be reprocessed in the same manner.

Embodiment Mode 5

In this embodiment mode, a semiconductor device using the semiconductor substrate according to the present invention and a manufacturing method thereof will be described. As an example of a semiconductor device using the semiconductor substrate according to the present invention, a transistor will be described in this embodiment mode. By combining a plurality of transistors, various types of semiconductor devices are formed. A method for manufacturing a transistor will be described with reference to cross-sectional views of FIGS. 14A to 14D, FIGS. 15A to 15C, and FIG. 16. Note that in this embodiment mode, a method for manufacturing an n-channel transistor and a p-channel transistor at the same time will be described.

A semiconductor substrate is prepared. In this embodiment mode, the semiconductor substrate 10 in FIG. 1 is used. That is, a semiconductor substrate in which the single crystal semiconductor layer 112 is fixed to the supporting substrate 100 having an insulating surface with the buffer layer 111 interposed therebetween is used. Note that a semiconductor substrate that forms a transistor is not limited to the structure in FIG. 1, and a semiconductor substrate according to the present invention can be used.

Figure 14A:
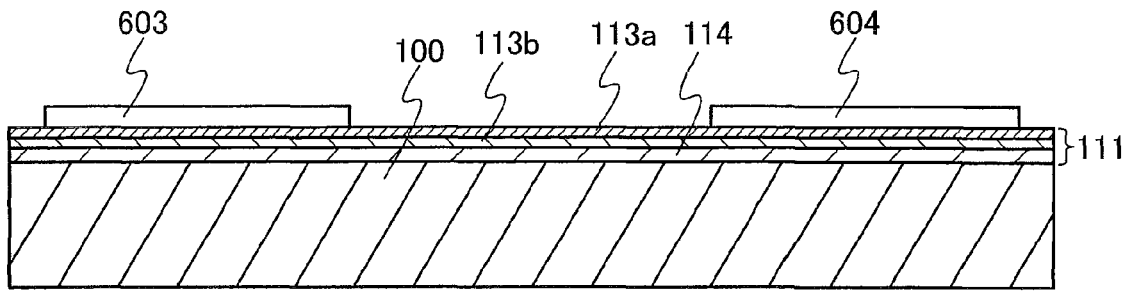
FIGS. 14A to 14D show cross-sectional views illustrating a method for manufacturing a semiconductor device.

As shown in FIG. 14A, the single crystal semiconductor layer 112 over the supporting substrate 100 is processed (patterned) into a desired shape by etching, so that a single crystal semiconductor layer 603 and a single crystal semiconductor layer 604 are formed. A p-channel transistor is formed using the single crystal semiconductor layer 603, and an n-channel transistor is formed using the single crystal semiconductor layer 604.

In order to control threshold voltages, a p-type impurity element such as boron, aluminum, or gallium or an n-type impurity element such as phosphorus or arsenic may be added to the single crystal semiconductor layer 603 and the single crystal semiconductor layer 604. For example, in the case of adding boron as an impurity element imparting p-type conductivity, boron may be added at a concentration of $5\times10^{16}$ $cm^{-3}$ to $1\times10^{17}$ $cm^{-3}$. The addition of the impurity element for controlling the threshold voltages may be performed to the single crystal semiconductor layer 112 or to the single crystal semiconductor layer 603 and the single crystal semiconductor layer 604. Alternatively, the addition of the impurity element for controlling the threshold voltages may be performed to the single crystal semiconductor substrate 110. Further alternatively, the addition of the impurity element may be performed to the single crystal semiconductor substrate 110, and then the addition of the impurity element may be further performed to the single crystal semiconductor layer 112 for finely adjusting the threshold voltages. Still alternatively, the addition of the impurity element may be performed to the single crystal semiconductor layer 603 and the single crystal semiconductor layer 604 after forming the single crystal semiconductor layer 603 and the single crystal semiconductor layer 604 from the single crystal semiconductor layer 112.

For example, taking as an example the case of using a weak p-type single crystal silicon substrate as the single crystal semiconductor substrate 110, an example of a method for adding such an impurity element is described. First, before etching the single crystal semiconductor layer 112, boron is added to the entire single crystal semiconductor layer 112. This addition of boron aims at adjusting the threshold voltage of a p-channel transistor. Using $B_2H_6$ as a dopant gas, boron is added at a concentration of $1\times10^{16}/cm^3$ to $1\times10^{17}/cm^3$. The concentration of boron is determined in consideration of the activation rate or the like. For example, the concentration of boron can be $6\times10^{16}/cm^3$. Next, the single crystal semiconductor layer 112 is etched to form the single crystal semiconductor layers 603 and 604. Then, boron is only added to the single crystal semiconductor layer 604. The second addition of boron aims at adjusting the threshold voltage of an n-channel transistor. Using $B_2H_6$ as a dopant gas, boron is added at a concentration of $1\times10^{16}/cm^3$ to $1\times10^{17}/cm^3$. For example, the concentration of boron can be $6\times10^{16}/cm^3$.

Note that in the case where a substrate having a conductivity type and resistance suitable for the threshold voltage of either the p-channel transistor or the n-channel transistor can be used as the single crystal semiconductor substrate 110, the required number of steps for adding an impurity element for controlling the threshold voltage can be one; and an impurity element for controlling the threshold voltage may be added to one of the single crystal semiconductor layer 603 and the single crystal semiconductor layer 604.

Figure 14B:
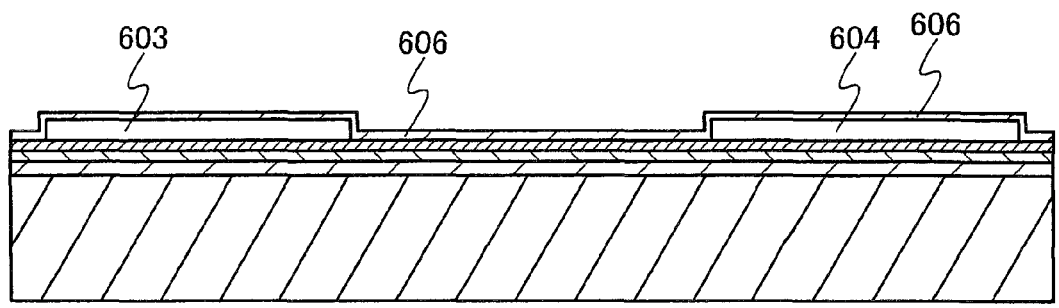

As shown in FIG. 14B, a gate insulating layer 606 is formed to cover the single crystal semiconductor layers 603 and 604. The gate insulating layer 606 can be formed with a single layer or a stacked layer of two or more layers of a silicon oxide film, a silicon oxynitride film, a silicon nitride oxide film, and/or a silicon nitride film by a PECVD method at a process temperature of 350° C. or lower. In addition, the gate insulating layer 606 can be formed with an oxide film or a nitride film obtained by oxidizing or nitriding surfaces of the single crystal semiconductor layers 603 and 604 by high-density plasma treatment. The high-density plasma treatment is performed using, for example, a mixed gas of a noble gas such as He, Ar, Kr, or Xe with oxygen, nitrogen oxide, ammonia, nitrogen, hydrogen, or the like. In this case, when plasma excitation is performed by introduction of a microwave, high density plasma with a low electron temperature can be generated. The surfaces of the single crystal semiconductor layers are oxidized or nitrided by oxygen radicals (which may include OH radicals) or nitrogen radicals (which may include NH radicals) which are generated by such high-density plasma, whereby an insulating film is formed to a thickness of 1 nm to 20 nm, preferably 5 nm to 10 nm so as to be in contact with the single crystal semiconductor layers. Thus, a thin insulating film with a thickness of 5 nm to 10 nm can be used as the gate insulating layer 606.

Figure 14C:
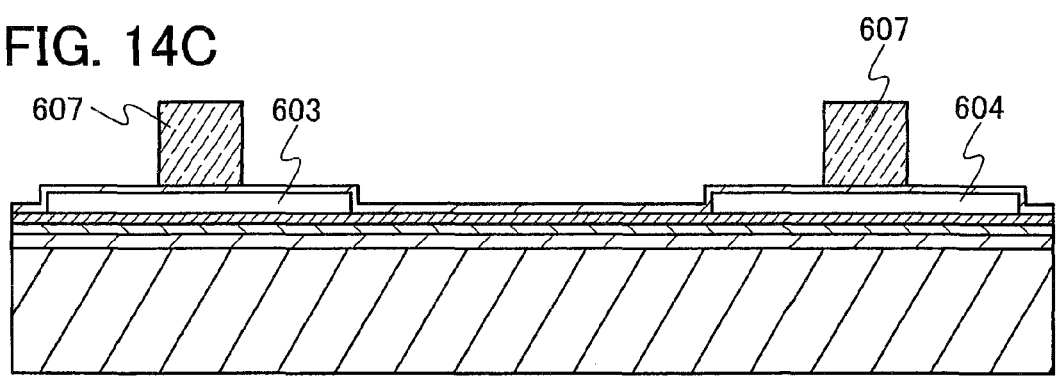

Then, after forming a conductive film over the gate insulating layer 606, the conductive film is processed (patterned) into a predetermined shape, thereby forming an electrode 607 over each of the single crystal semiconductor layers 603 and 604 as shown in FIG. 14C. The conductive film can be formed by a CVD method, a sputtering method, or the like. The conductive film can be formed of tantalum (Ta), tungsten (W), titanium (Ti), molybdenum (Mo), aluminum (Al), copper (Cu), chromium (Cr), niobium (Nb), or the like. Alternatively, the conductive film may be formed using an alloy containing the above-mentioned metal as its main component or a compound containing the above-mentioned metal. Further alternatively, the conductive film may be formed of a semiconductor film of polycrystalline silicon or the like which is doped with an impurity element imparting a conductivity type, such as phosphorus.

Although each of the electrodes 607 is formed of a single-layer conductive film in this embodiment mode, this embodiment mode is not limited to this structure. The electrodes 607 may be formed by stacking a plurality of conductive films. When the electrodes 607 are formed to have two-layer structure, as an example of a combination of two conductive films, a tantalum nitride film or a tantalum (Ta) film can be used for a first layer, and a tungsten (W) film can be used for a second layer. Other examples are as follows: a tungsten nitride film and a tungsten film; a molybdenum nitride film and a molybdenum film; an aluminum film and a tantalum film; an aluminum film and a titanium film; a silicon film containing an impurity imparting n-type conductivity and a nickel silicide film; a silicon film containing an impurity imparting n-type conductivity and a tungsten silicide film; and the like. Because a tungsten film and a tantalum nitride film have high heat resistance, heat treatment for thermal activation can be performed after the two conductive films are formed.

When the electrodes 607 are formed to have a three-layer structure, a stacked-layer film of a molybdenum film, an aluminum film, and a molybdenum film may be employed.

Note that when the electrodes 607 are formed by etching of a conductive film, a silicon oxide film, a silicon nitride oxide film, or the like may be used as masks used for etching, instead of resist. In this case, an additional step of etching a silicon oxide film, a silicon nitride oxide film, or the like is needed; however, a reduction in film thickness of the masks at the time of etching is less than that in the case of using a resist mask. Accordingly, the electrodes 607 each having a desired width can be formed easily. Alternatively, the electrodes 607 may be selectively formed by a droplet discharge method without using the masks.

Note that a droplet discharge method means a method in which droplets containing a predetermined composition are discharged or ejected from fine pores to form a predetermined pattern, and includes an ink-jet method and the like.

As an etching method of the conductive film, it is preferable to use an inductively coupled plasma (ICP) etching method. This is because the conductive film can be etched into a desired tapered shape by appropriately controlling etching conditions (e.g., the amount of electric power applied to a coiled electrode layer, the amount of electric power applied to an electrode layer on the substrate side, or the electrode temperature on the substrate side). Further, the angle and the like of the tapered shape can also be controlled depending on the shape of the masks. Note that as an etching gas, a chlorine-based gas such as chlorine, boron chloride, silicon chloride, or carbon tetrachloride; a fluorine-based gas such as carbon tetrafluoride, sulfur fluoride, or nitrogen fluoride; or oxygen can be used as appropriate.

Figure 14D:
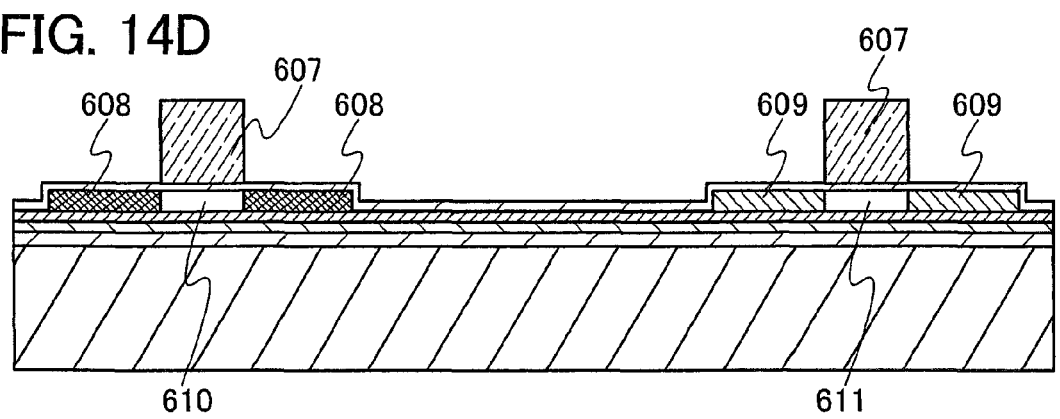

Next, as shown in FIG. 14D, an impurity element imparting one conductivity type is added to the single crystal semiconductor layers 603 and 604 with use of the electrodes 607 as masks. In this embodiment mode, an impurity element imparting p-type conductivity (e.g., boron) is added to the single crystal semiconductor layer 603, and an impurity element imparting n-type conductivity (e.g., phosphorus or arsenic) is added to the single crystal semiconductor layer 604. This step is a step for forming impurity regions serving as a source region and a drain region in the single crystal semiconductor layer 603 and forming impurity regions serving as high-resistance regions in the single crystal semiconductor layer 604.

Note that when the impurity element imparting p-type conductivity is added to the single crystal semiconductor layer 603, the single crystal semiconductor layer 604 is covered with a mask or the like so that the impurity element imparting p-type conductivity is not added to the single crystal semiconductor layer 604. On the other hand, when the impurity element imparting n-type conductivity is added to the single crystal semiconductor layer 604, the single crystal semiconductor layer 603 is covered with a mask or the like so that the impurity element imparting n-type conductivity is not added to the single crystal semiconductor layer 603. Alternatively, after an impurity element imparting one of p-type and n-type conductivity is added to the single crystal semiconductor layers 603 and 604, an impurity element imparting the other conductivity may be selectively added to one of the single crystal semiconductor layers 603 and 604 at a higher concentration than that of the previously added impurity element. By this step of adding impurity elements, p-type high-concentration impurity regions 608 are formed in the single crystal semiconductor layer 603, and n-type low-concentration impurity regions 609 are formed in the single crystal semiconductor layer 604. The regions overlapping with the electrodes 607 in the single crystal semiconductor layer 603 and the single crystal semiconductor layer 604 are a channel formation region 610 and a channel formation region 611, respectively.

Figure 15A:
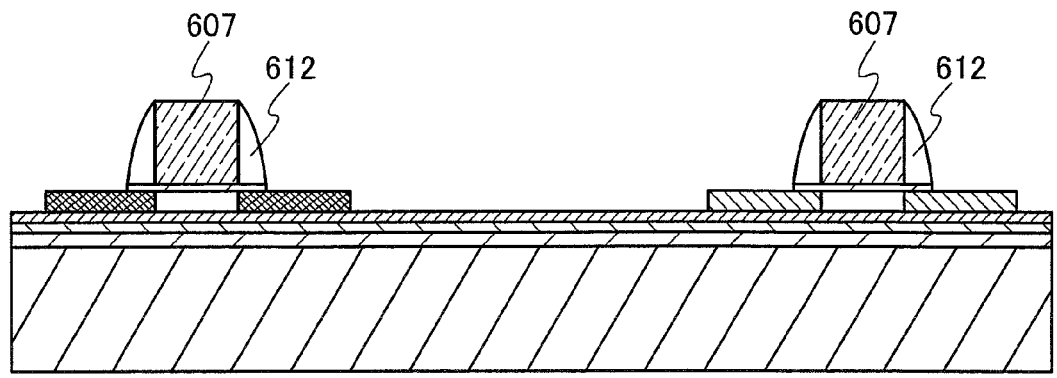
FIGS. 15A to 15C show cross-sectional views illustrating steps subsequent to FIG. 14D.

Next, as shown in FIG. 15A, sidewalls 612 are formed on side surfaces of the electrodes 607. For example, the sidewalls 612 can be formed in such a manner that an insulating film is newly formed so as to cover the gate insulating layer 606 and the electrodes 607, and the newly formed insulating film is partially etched by anisotropic etching in which etching proceeds mainly in a perpendicular direction. The newly formed insulating film is partially etched by the above-described anisotropic etching, whereby the sidewalls 612 are formed on the side surfaces of the electrodes 607. Note that the gate insulating layer 606 is also partially etched by this anisotropic etching. The insulating film for forming the sidewalls 612 can be formed with a single layer or a stack of two or more layers of a silicon oxide film, a silicon oxynitride film, a silicon nitride oxide film, or a film including an organic material such as an organic resin by a PECVD method, a sputtering method, or the like. In this embodiment mode, a silicon oxide film is formed to a thickness of 100 nm by a PECVD method. As an etching gas of the silicon oxide film, a mixed gas of $CHF_3$ and helium can be used. It is to be noted that the steps for formation of the sidewalls 612 are not limited to the steps given here.

Figure 15B:
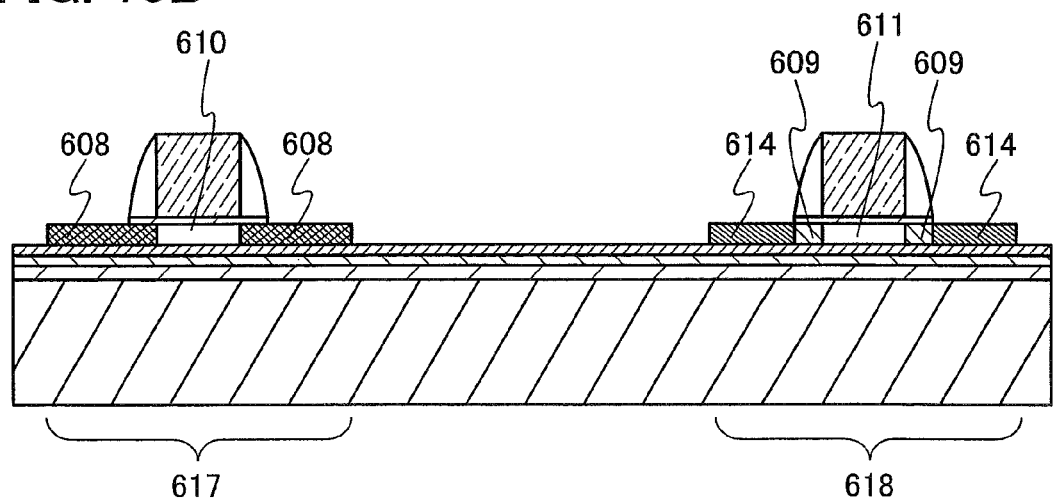

Then, as shown in FIG. 15B, an impurity element imparting n-type conductivity is added to the single crystal semiconductor layer 604 by using the electrode 607 and the sidewall 612 as masks. This step is a step for forming impurity regions serving as a source region and a drain region in the single crystal semiconductor layer 604. In this step, the impurity element imparting n-type conductivity is added to the single crystal semiconductor layer 604 while the single crystal semiconductor layer 603 is covered with a mask or the like.

In the above-described addition of the impurity element, the electrode 607 and the sidewall 612 serve as masks; accordingly, a pair of n-type high-concentration impurity regions 614 are formed in the single crystal semiconductor layer 604 in a self-aligned manner. Next, the mask covering the single crystal semiconductor layer 603 is removed, and then heat treatment is performed to activate the impurity element imparting p-type conductivity that has been added to the single crystal semiconductor layer 603 and the impurity element imparting n-type conductivity that has been added to the single crystal semiconductor layer 604. Through a series of the steps shown in FIGS. 14A to 14D and FIGS. 15A and 15B, a p-channel transistor 617 and an n-channel transistor 618 are formed.

In order to reduce the resistance of the source region and the drain region, silicide layers may be formed by siliciding the high-concentration impurity regions 608 in the single crystal semiconductor layer 603 and the high-concentration impurity regions 614 in the single crystal semiconductor layer 604. The silicidation can be performed by placing a metal in contact with the single crystal semiconductor layers 603 and 604 and causing reaction between the metal and silicon in the single crystal semiconductor layers through heat treatment; in this manner, a silicide compound is produced. As the metal, cobalt or nickel is preferable, or the following can be used: titanium (Ti), tungsten (W), molybdenum (Mo), zirconium (Zr), hafnium (Hf), tantalum (Ta), vanadium (V), neodymium (Nd), chromium (Cr), platinum (Pt), palladium (Pd), or the like. In the case where the single crystal semiconductor layers 603 and 604 are thin, the silicide reaction may be advanced to the bottoms of the single crystal semiconductor layers 603 and 604 in these regions. As the heat treatment for silicidation, a resistance heating furnace, an RTA apparatus, a microwave heating apparatus, or a laser irradiation apparatus can be used.

Figure 15C:
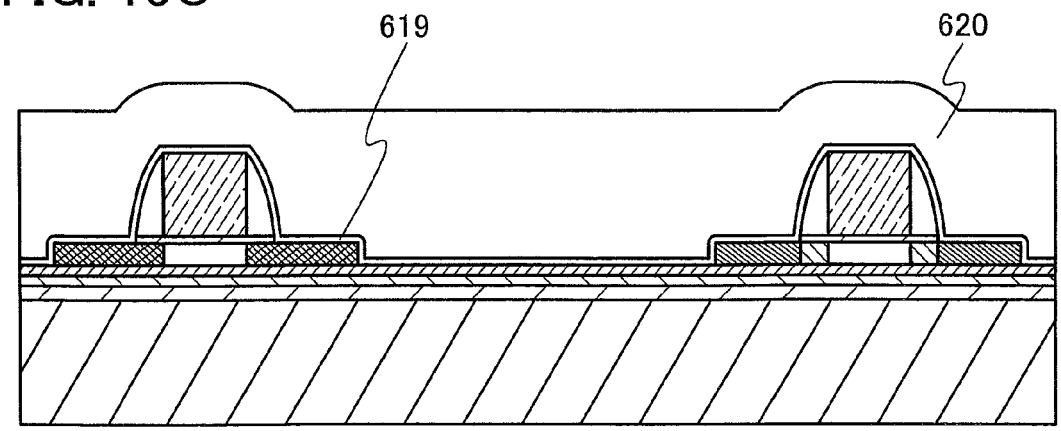

Next, as shown in FIG. 15C, an insulating layer 619 is formed to cover the p-channel transistor 617 and the n-channel transistor 618. As the insulating layer 619, an insulating film containing hydrogen is formed. In this embodiment mode, a silicon nitride oxide film with a thickness of about 600 nm is formed by a PECVD method using a source gas including monosilane, ammonia, and $N_2O$. The reason why the insulating layer 619 is made to contain hydrogen is that hydrogen can be diffused from the insulating layer 619 so that dangling bonds in the single crystal semiconductor layers 603 and 604 can be terminated. The formation of the insulating layer 619 can prevent impurities such as an alkali metal and an alkaline earth metal from entering the p-channel transistor 617 and the n-channel transistor 618. Specifically, it is preferable to use silicon nitride, silicon nitride oxide, aluminum nitride, aluminum oxide, silicon oxide, or the like for the insulating layer 619.

Next, an insulating layer 620 is formed over the insulating layer 619 so as to cover the p-channel transistor 617 and the n-channel transistor 618. The insulating layer 620 can be formed using an organic material having heat resistance, such as polyimide, acrylic, benzocyclobutene, polyamide, or epoxy. Other than such organic materials, it is also possible to use a low-dielectric-constant material (a low-k material), a siloxane resin, silicon oxide, silicon nitride, silicon nitride oxide, PSG (phosphosilicate glass), BPSG (borophosphosilicate glass), alumina, or the like. A siloxane resin may include as a substituent at least one of fluorine, an alkyl group, and an aryl group, as well as hydrogen. Note that the insulating layer 620 may be formed by stacking a plurality of insulating films formed of these materials. The insulating layer 620 may have its surface planarized by a CMP method or the like.

Note that the siloxane resin corresponds to a resin including a Si—O—Si bond formed using a siloxane-based material as a starting material. The siloxane resin may include as a substituent at least one of fluorine, an alkyl group, and an aryl group, as well as hydrogen.

The insulating layer 620 can be formed by any of the following methods and means depending on the material of the insulating layer 620: a CVD method, a sputtering method, an SOG method, a spin coating method, a dip coating method, a spray coating method, a droplet discharge method (e.g., an inkjet method, screen printing, or offset printing), a doctor knife, a roll coater, a curtain coater, a knife coater, and the like.

Next, heat treatment at about 400° C. to 450° C. (e.g., 410° C.) is performed in a nitrogen atmosphere for about one hour, so that hydrogen is diffused from the insulating layer 619 and dangling bonds in the single crystal semiconductor layers 603 and 604 are terminated with hydrogen. Note that because the single crystal semiconductor layer 112 has a much lower defect density than a polycrystalline silicon film which is formed by crystallizing an amorphous silicon film, this termination treatment with hydrogen can be performed in a shorter time.

Figure 16:
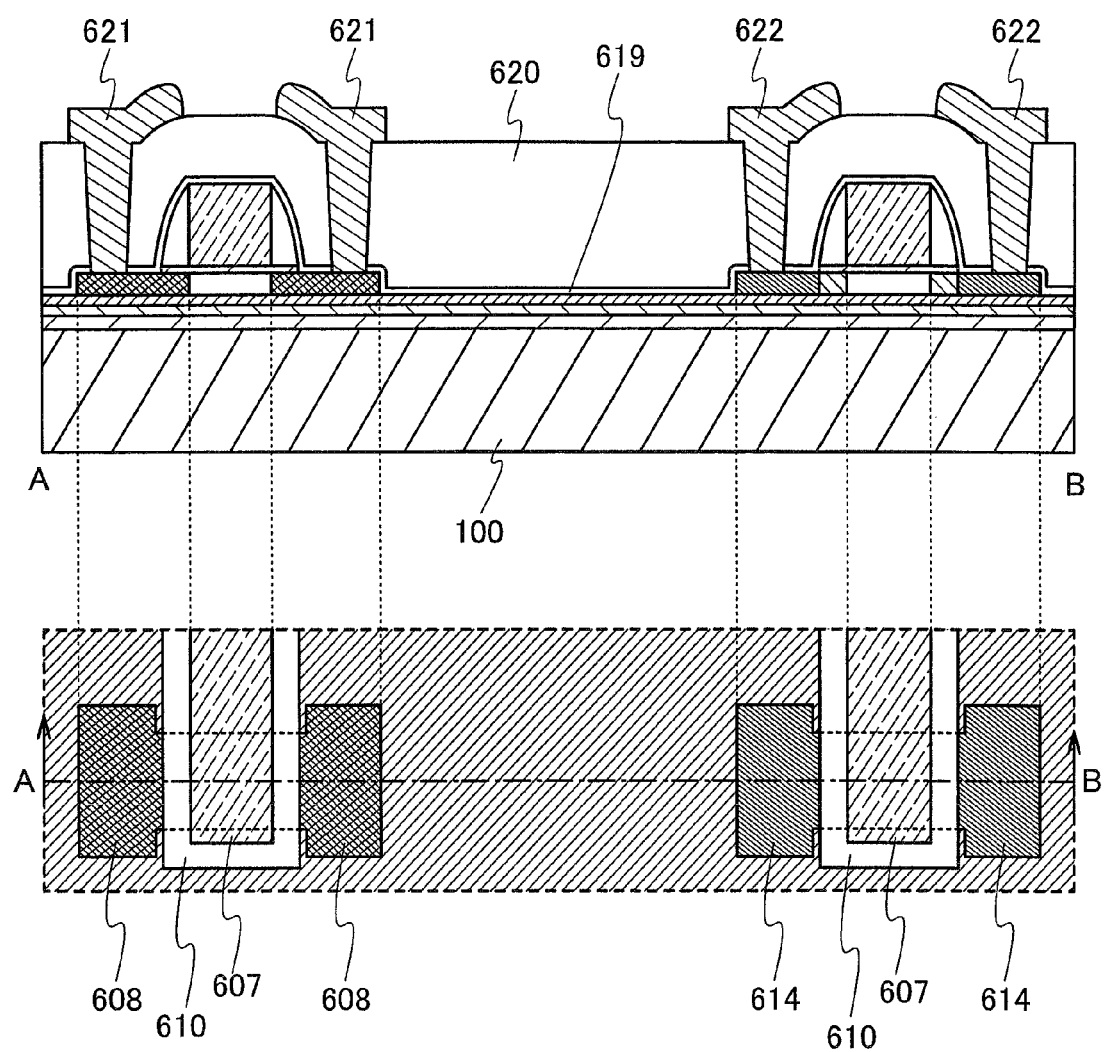
FIG. 16 shows a top view illustrating a step subsequent to FIG. 15C and a cross-sectional view taken along a section line A-B of the top view.

Next, as shown in FIG. 16, contact holes are formed in the insulating layer 619 and the insulating layer 620 so that each of the single crystal semiconductor layers 603 and 604 is partially exposed. The contact holes can be formed by a dry etching method using a mixed gas of $CHF_3$ and He; however, the present invention is not limited to this. Then, conductive layers 621 and 622 are formed to be in contact with the single crystal semiconductor layers 603 and 604 through the contact holes. The conductive layers 621 are connected to the high-concentration impurity regions 608 of the p-channel transistor 617. The conductive layers 622 are connected to the high-concentration impurity regions 614 of the n-channel transistor 618.

The conductive layers 621 and 622 can be formed by a CVD method, a sputtering method, or the like. Specifically, the conductive layers 621 and 622 can be formed using aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), silicon (Si), or the like. Alternatively, an alloy containing the above-mentioned metal as its main component or a compound containing the above-mentioned metal can be used. The conductive layers 621 and 622 can be formed with a single layer or a plurality of layers of a film formed of the above-mentioned metal.

An example of an alloy containing aluminum as its main component is an alloy containing aluminum as its main component and also containing nickel. Another example is an alloy which contains aluminum as its main component and contains nickel and one or both of carbon and silicon. Aluminum and aluminum silicon are suitable as materials for forming the conductive layers 621 and 622 because aluminum and aluminum silicon have low resistance and are inexpensive. In particular, when the shape of an aluminum silicon (Al—Si) film is processed by etching, generation of hillocks in the aluminum silicon (Al—Si) film during resist baking in forming an etching mask can be prevented more than in an aluminum film. Instead of silicon (Si), Cu may be mixed into an aluminum film at about 0.5%.

For example, a stacked structure including a barrier film, an aluminum silicon (Al—Si) film, and a barrier film or a stacked structure including a barrier film, an aluminum silicon (Al—Si) film, a titanium nitride film, and a barrier film may be used for the conductive layers 621 and 622. Note that the barrier film refers to a film formed using titanium, a nitride of titanium, molybdenum, or a nitride of molybdenum. When barrier films are formed to sandwich an aluminum silicon (Al—Si) film therebetween, generation of hillocks of aluminum or aluminum silicon can be prevented more effectively. Moreover, when the barrier film is formed using titanium that is a highly reducible element, even if a thin oxide film is formed over the single crystal semiconductor layers 603 and 604, the oxide film is reduced by titanium contained in the barrier film, whereby desirable contact between the conductive layers 621 and 622 and the single crystal semiconductor layers 603 and 604 can be obtained. Further, it is also possible to stack a plurality of barrier films. In that case, for example, the conductive layers 621 and 622 may each have a five-layer structure in which titanium, titanium nitride, aluminum silicon, titanium, and titanium nitride are stacked in this order from the lowest layer.

For the conductive layers 621 and 622, a tungsten silicide film formed by a chemical vapor deposition method using a $WF_6$ gas and a $SiH_4$ gas may be used. Alternatively, a tungsten film formed by hydrogen reduction of $WF_6$ may be used for the conductive layers 621 and 622.

FIG. 16 shows a top view of the p-channel transistor 617 and the n-channel transistor 618 and a cross-sectional view taken along a line A-B of the top view. Note that the conductive layers 621 and 622, the insulating layer 619, and the insulating layer 620 are omitted in the top view of FIG. 16.

Although the case where each of the p-channel transistor 617 and the n-channel transistor 618 has the electrode 607 functioning as a gate is described in this embodiment mode, the present invention is not limited to this structure. The transistor manufactured according to the present invention may have a multi-gate structure in which a plurality of electrodes functioning as gates are provided and electrically connected to one anotheL Moreover, the transistor may have a gate planar structure.

Note that a semiconductor layer included in the semiconductor substrate of the present invention is obtained by slicing a single crystal semiconductor substrate; thus, its orientation does not vary. Consequently, variation in electric characteristics such as threshold voltage and mobility among a plurality of transistors manufactured using the semiconductor substrate of the present invention can be made small. Further, there are almost no crystal grain boundaries in the semiconductor layer included in the semiconductor substrate of the present invention, a leakage current of a transistor due to a crystal grain boundary can be suppressed, and power saving of the semiconductor device can be realized. Accordingly, a highly reliable semiconductor device can be manufactured.

In the case of manufacturing a transistor from a polycrystalline semiconductor film that is obtained by laser crystallization, it has been necessary to determine a layout of the semiconductor film of the transistor taking into consideration a laser beam scanning direction in order to obtain high mobility. However, in the case of using the semiconductor substrate of the present invention, there is no need for such layout determination, and there are less restrictions in designing a semiconductor device.

Embodiment Mode 6

In this embodiment mode, a semiconductor device using the semiconductor substrate according to the present invention and a manufacturing method thereof will be described. As an example of a semiconductor device using the semiconductor substrate according to the present invention, a transistor will be described in this embodiment mode. By combining a plurality of transistors, various types of semiconductor devices are formed. A method for manufacturing a transistor will be described with reference to cross-sectional views of FIGS. 17A to 17E, FIGS. 18A to 18C, and FIGS. 19A and 19B. Note that in this embodiment mode, a method for manufacturing an n-channel transistor and a p-channel transistor at the same time will be described.

Figure 17A:
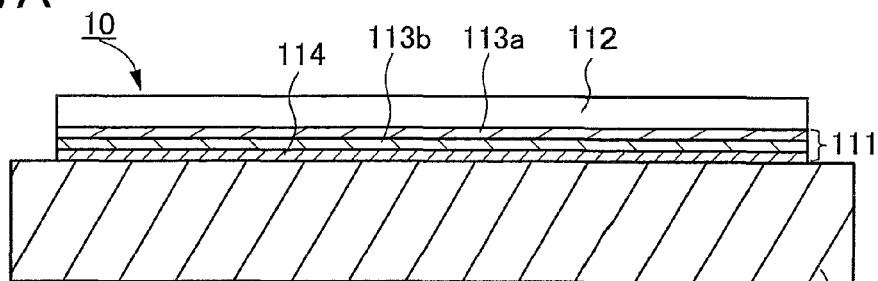
FIGS. 17A to 17E show cross-sectional views illustrating a method for manufacturing a semiconductor device.

First, as shown in FIG. 17A, a semiconductor substrate is prepared. In this embodiment mode, the semiconductor substrate 10 in FIG. 1 is used. That is, a semiconductor substrate in which the single crystal semiconductor layer 112 is fixed to the supporting substrate 100 having an insulating surface with the buffer layer 111 interposed therebetween is used. Note that a semiconductor substrate that forms a transistor is not limited to the structure in FIG. 1, and a semiconductor substrate according to the present invention can be used.

Note that a p-type impurity element such as boron, aluminum, or gallium or an n-type impurity element such as phosphorus or arsenic is preferably added to the single crystal semiconductor layer 112 in accordance with a formation region of an n-channel field-effect transistor or a p-channel field-effect transistor. In other words, a p-type impurity element is added to a formation region of an n-channel field-effect transistor and an n-type impurity element is added to a formation region of a p-channel field-effect transistor, whereby so-called well regions are formed. The dose of impurity ions may be approximately $1\times10^{12}$ ions/cm$^2$ to $1\times10^{14}$ ions/cm$^2$. Furthermore, in order to control threshold voltage of a field effect transistor, a p-type impurity element or an n-type impurity element is added to these well regions.

Figure 17B:
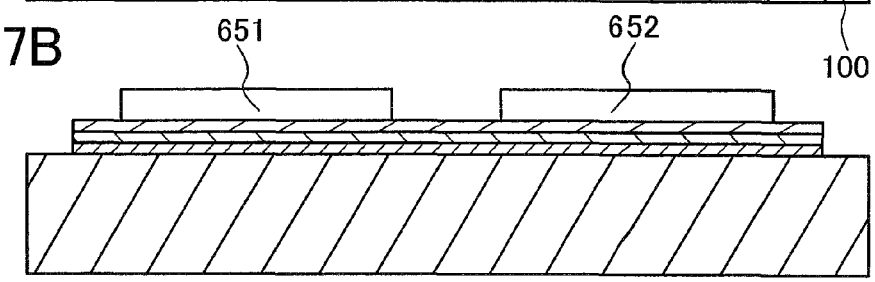

Then, as shown in FIG. 17B, the single crystal semiconductor layer 112 is etched to form single crystal semiconductor layers 651 and 652 which are separated from each other in island shapes to correspond to the arrangement of semiconductor elements. In this embodiment mode, an n-channel transistor is formed with the single crystal semiconductor layer 651, and a p-channel transistor is formed with the single crystal semiconductor layer 652.

Figure 17C:
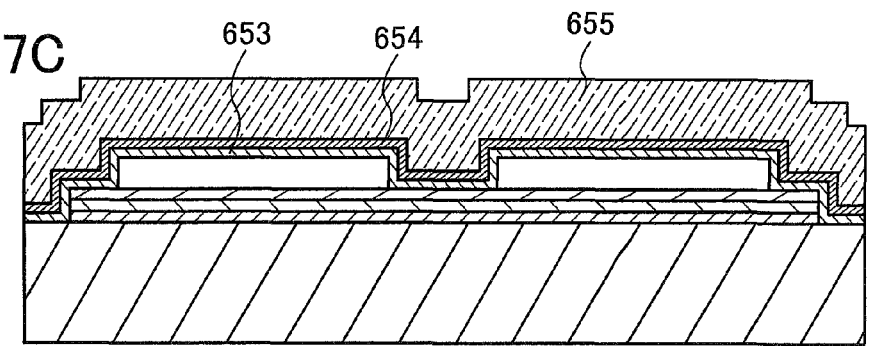

Next, as shown in FIG. 17C, a gate insulating layer 653, a conductive layer 654 and a conductive layer 655 which form a gate electrode are sequentially formed over the single crystal semiconductor layers 651 and 652.

The gate insulating layer 653 is formed as a single layer structure or a stacked layer structure using an insulating layer such as a silicon oxide layer, a silicon oxynitride layer, a silicon nitride layer, or a silicon nitride oxide layer by a CVD method, a sputtering method, an ALE method, or the like.

Alternatively, the gate insulating layer 653 may be formed in such a manner that plasma treatment is performed on the single crystal semiconductor layers 651 and 652 to oxidize or nitride the surfaces thereof. Plasma treatment in this case also includes that with plasma excited using microwaves (a typical frequency is 2.45 GHz). For example, the plasma treatment includes treatment with plasma that is excited by microwaves and has an electron density of $1\times10^{11}$/cm$^3$ to $1\times10^{13}$/cm$^3$ and an electron temperature of 0.5 eV to 1.5 eV. Oxidation treatment or nitridation treatment of the surfaces of the single crystal semiconductor layers 651 and 652 with such plasma treatment makes it possible to form a thin and dense film. In addition, the surfaces of the single crystal semiconductor layers 651 and 652 are directly oxidized; thus, a film which has good interface characteristics can be obtained. Further alternatively, the gate insulating layer 653 may be formed by conducting plasma treatment using microwaves to a film formed by a CVD method, a sputtering method, or an ALE method.

Note that the gate insulating layer 653 forms an interface with the single crystal semiconductor layers 651 and 652; thus, the gate insulating layer 653 is preferably formed so that a silicon oxide layer or a silicon oxynitride layer is located at the interface. This is because, if a film in which the amount of nitrogen is higher than that of oxygen, such as a silicon nitride layer or a silicon nitride oxide layer, is formed, there might occur a problem in interface characteristics due to generation of trap levels.

The conductive layer which forms the gate electrode is formed by a CVD method or a sputtering method with a single layer film or a stacked layer film of a film of an element selected from tantalum, tungsten, titanium, molybdenum, aluminum, copper, chromium, niobium and the like, an alloy material or a compound material containing the element as its main component, or a semiconductor material typified by polycrystalline silicon doped with an impurity element such as phosphorus. When the conductive layer is formed as a stacked layer film, it can be formed using different conductive materials or using the same conductive material. In this embodiment mode, an example is described in which the conductive layer which forms the gate electrode is formed with a two-layer structure including the conductive layer 654 and the conductive layer 655.

If the conductive layer for forming the gate electrode has a two-layer structure of the conductive layer 654 and the conductive layer 655, the conductive layer can be formed with a stacked layer film of a tantalum nitride layer and a tungsten layer, a tungsten nitride layer and a tungsten layer, or a molybdenum nitride layer and a molybdenum layer, for example. Note that a stacked layer film of a tantalum nitride layer and a tungsten layer is preferable because high selectivity of etching between both layers can be obtained. Note that it is preferable that the first mentioned film of the two-layer film which is exemplified be formed over the gate insulating layer 653. In this embodiment mode, the conductive layer 654 is formed with a thickness of from 20 nm to 100 nm. The conductive layer 655 is formed with a thickness of 100 nm to 400 nm. The gate electrode can also have a stacked structure of three or more layers; in that case, it is preferable to employ a stacked structure of a molybdenum layer, an aluminum layer, and a molybdenum layer.

Next, resist masks 656 and 657 are selectively formed over the conductive layer 655. Then, first etching treatment and second etching treatment are performed using the resist masks 656 and 657.

Figure 17D:
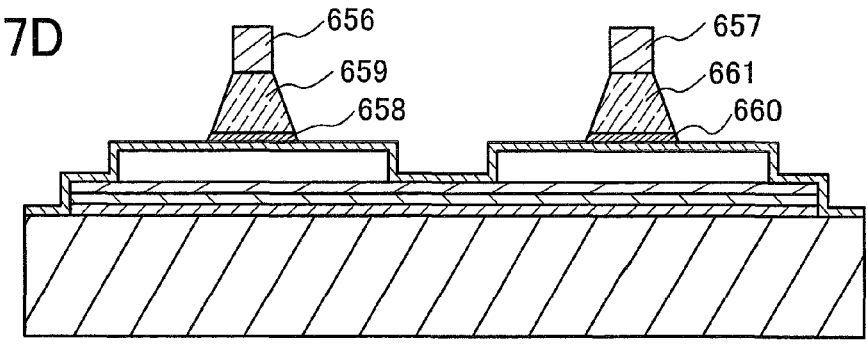

First, by the first etching treatment using the resist masks 656 and 657, the conductive layers 654 and 655 are selectively etched, and thus a conductive layer 658 and a conductive layer 659 are formed over the single crystal semiconductor layer 651 and a conductive layer 660 and a conductive layer 661 are formed over the single crystal semiconductor layer 652 (see FIG. 17D).

Figure 17E:
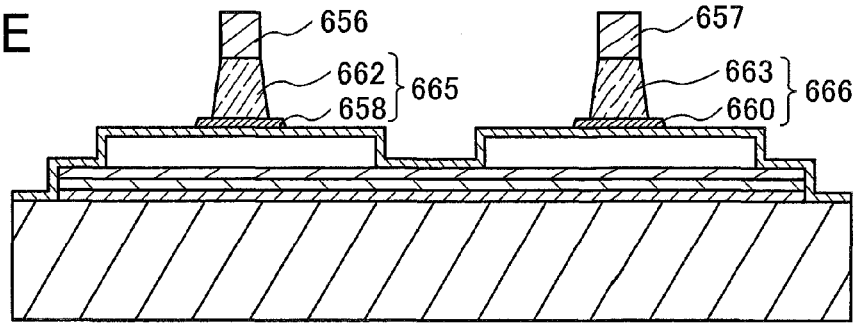
Figure 18A:
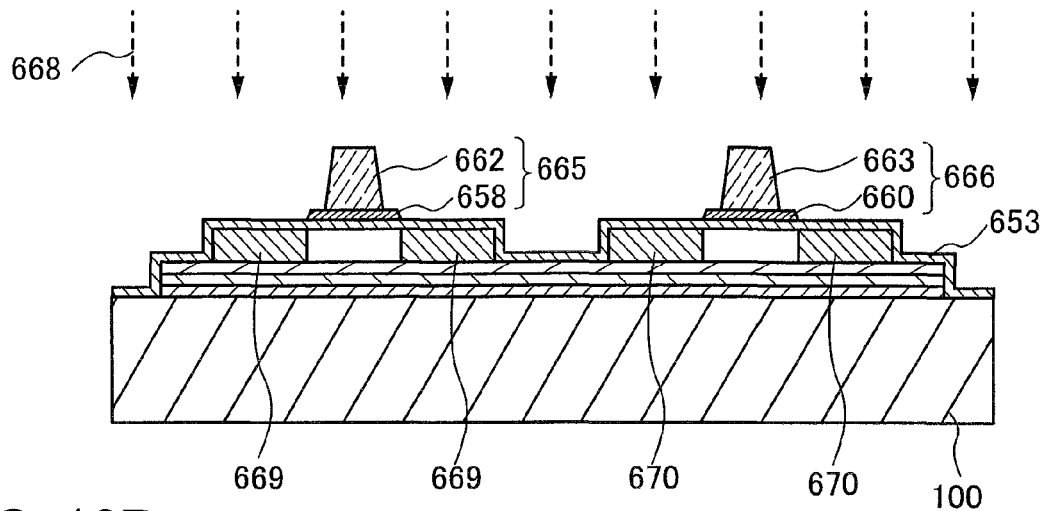
FIGS. 18A to 18C show cross-sectional views illustrating steps subsequent to FIG. 17E.
Figure 18B:
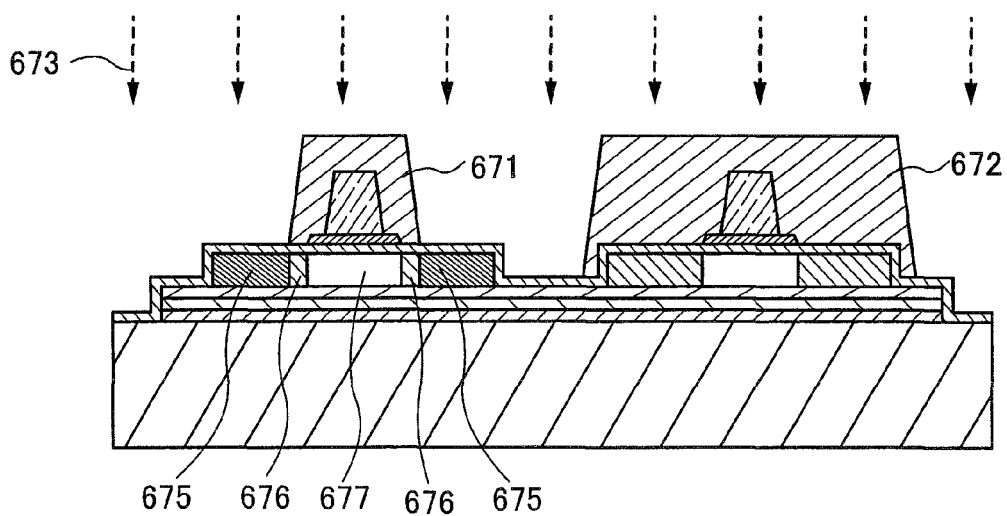
Figure 18C:
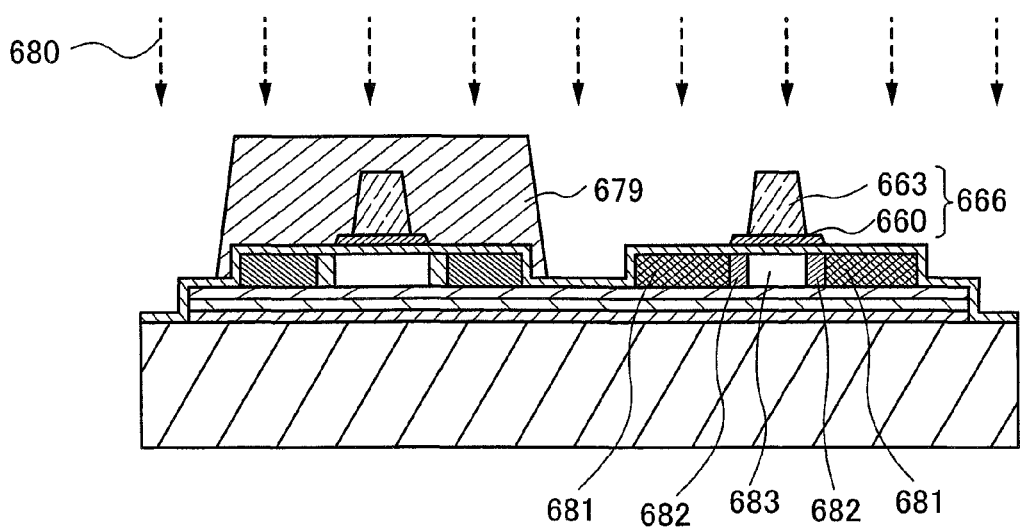

Next, by the second etching treatment using the resist masks 656 and 657, end portions of the conductive layers 659 and 661 are etched, and thus a conductive layer 662 and a conductive layer 663 are formed (see FIG. 17E). Note that the conductive layers 662 and 663 are formed so as to have smaller widths (lengths along a direction parallel to a direction along which carriers flow in channel formation regions (a direction connecting a source region and a drain region)) than the conductive layers 658 and 660. In this manner, a gate electrode 665 having a two-layer structure of the conductive layers 658 and 662 and a gate electrode 666 having a two-layer structure of the conductive layers 660 and 663 are formed.

An etching method employed for the first etching treatment and the second etching treatment may be selected as appropriate. In order to increase etching rate, a dry etching apparatus using a high-density plasma source such as an electron cyclotron resonance (ECR) source or an inductive coupled plasma (ICP) source may be used. With appropriate control of the etching conditions for the first etching treatment and the second etching treatment, side surfaces of the conductive layers 658 and 660 and the conductive layers 662 and 663 can each be formed into a desired tapered shape. After the gate electrodes 665 and 666 are formed as desired, the resist masks 656 and 657 may be removed.

Next, an impurity element 668 is added to the single crystal semiconductor layers 651 and 652 with the use of the gate electrodes 665 and 666 as masks. The conductive layers 658 and 662 serve as masks; thus, a pair of impurity regions 669 are formed in the single crystal semiconductor layer 651 in a self-aligned manner. As well, the conductive layers 660 and 663 serve as masks; thus, a pair of impurity regions 670 are formed in the single crystal semiconductor layer 652 in a self-aligned manner (see FIG. 18A).

As the impurity element 668, a p-type impurity element such as boron, aluminum, or gallium or an n-type impurity element such as phosphorus or arsenic is added. Here, in order to form a high-resistance region of the n-channel transistor, phosphorus which is an n-type impurity element is added as the impurity element 668. In addition, phosphorus is added such that it is contained in the impurity region 669 at a concentration of about $1\times10^{17}$ atoms/cm$^3$ to $5\times10^{18}$ atoms/cm$^3$.

Then, in order to form impurity regions which serve as source and drain regions of the n-channel transistor, a resist mask 671 is formed to partially cover the single crystal semiconductor layer 651, and a resist mask 672 is formed to cover the single crystal semiconductor layer 652. Then, an impurity element 673 is added to the single crystal semiconductor layer 651 with the use of the resist mask 671 as a mask, thereby forming a pair of impurity regions 675 in the single crystal semiconductor layer 651 (see FIG. 18B).

As the impurity element 673, phosphorus which is an n-type impurity element is added to the single crystal semiconductor layer 651 such that phosphorus is added at a concentration of $5\times10^{19}$ atoms/cm$^3$ to $5\times10^{20}$ atoms/cm$^3$. The impurity regions 675 each serve as a source region or a drain region. The impurity regions 675 are formed in regions that do not overlap with the conductive layers 658 and 662.

The impurity regions 676 are regions of the impurity regions 669 to which the impurity element 673 is not added. The impurity regions 676 have a lower impurity concentration than the impurity regions 675 and function as high-resistance regions or LDD regions. In a region of the single crystal semiconductor layer 651 which overlaps with the conductive layers 658 and 662, a channel formation region 677 is formed.

Note that an LDD region means a region to which an impurity element is added at a low concentration and which is formed between a channel formation region and a source or drain region that is formed by adding the impurity element at a high concentration. When an LDD region is provided, there is an advantageous effect in that an electric field in the vicinity of a drain region is reduced to prevent deterioration due to hot carrier injection. Further, a structure in which an LDD region overlaps with a gate electrode with a gate insulating layer interposed therebetween (also called a "gate-drain overlapped LDD (GOLD) structure") may also be employed in order to prevent a reduction of an on-current value due to hot carriers.

Next, after the resist masks 671 and 672 are removed, a resist mask 679 is formed to cover the single crystal semiconductor layer 651 in order to form a source region and a drain region of a p-channel transistor. Then, an impurity element 680 is added with the use of the resist mask 679 and the conductive layers 660 and 663 as masks, thereby forming a pair of impurity regions 681, a pair of impurity regions 682, and a channel formation region 683 in the single crystal semiconductor layer 652 (see FIG. 18C).

As the impurity element 680, a p-type impurity element such as boron, aluminum, or gallium is used. Here, boron which is a p-type impurity element is added so as to be contained at a concentration of about $1 \times 10^{20}$ atoms/cm$^3$ to $5 \times 10^{21}$ atoms/cm$^3$.

In the single crystal semiconductor layer 652, the impurity regions 681 are each formed in a region that does not overlap with the conductive layers 660 and 663, and each function as a source region or a drain region. The impurity regions 670 have n-type conductivity, and thus the impurity element 673 is added to the single crystal semiconductor layer 652 such that the impurity regions 681 have p-type conductivity. Here, boron which is a p-type impurity element is added to the impurity regions 681 so as to be contained at a concentration of about $1 \times 10^{20}$ atoms/cm$^3$ to $5 \times 10^{21}$ atoms/cm$^3$.

The impurity regions 682 are formed in regions which overlap with the conductive layer 660 and do not overlap with the conductive layer 663, and the impurity regions 682 are formed by adding the impurity element 680 to the single crystal semiconductor layer 652 through the conductive layer 660. Furthermore, by control of the concentration of the impurity element 673 contained in the impurity region 682, the impurity regions 682 can each be made to serve as a source region or a drain region or to serve as an LDD region.

In a region of the single crystal semiconductor layer 652 which overlaps with the conductive layers 660 and 663, the channel formation region 683 is formed.

Next, an interlayer insulating layer is formed. The interlayer insulating layer can be formed as a single layer structure or a stacked layer structure; in this embodiment mode, the interlayer insulating layer is formed of a two-layer stacked film of an insulating layer 684 and an insulating layer 685 (see FIG. 19A).

As the interlayer insulating layer, a silicon oxide layer, a silicon oxynitride layer, a silicon nitride layer, a silicon nitride oxide layer, or the like can be formed by a CVD method or a sputtering method. Further, the interlayer insulating film can also be formed by an application method such as a spin coating method using an organic material such as polyimide, polyamide, polyvinylphenol, benzocyclobutene, acrylic, or epoxy, a siloxane material such as a siloxane resin, an oxazole resin, or the like. It is to be noted that a siloxane material is a material including a Si—O—Si bond. Siloxane has a skeleton structure formed by the bond of silicon (Si) and oxygen (O). As a substituent, an organic group including at least hydrogen (such as an alkyl group or an aryl group) is used. In addition, a fluoro group may be contained in the organic group. An organic group containing at least hydrogen and a fluoro group may also be used as a substituent. An oxazole resin is, for example, photosensitive polybenzoxazole or the like. Photosensitive polybenzoxazole is a material which has a low dielectric constant (a dielectric constant of 2.9 at 1 MHz at room temperature), high heat resistance (a thermal decomposition temperature of 550° C. at a rate of temperature increase of 5° C./min according to thermogravimetry differential thermal analysis (TG-DTA)), and a low water absorption percentage (0.3% at room temperature over 24 hours). An oxazole resin has a lower specific dielectric constant (approximately, 2.9) than polyimide or the like (approximately 3.2 to 3.4); thus, when an oxazole resin is used, generation of parasitic capacitance can be suppressed and high-speed operation of a semiconductor device is possible.

For example, a silicon nitride oxide layer is formed to a thickness of 100 nm as the insulating layer 684, and a silicon oxynitride layer is formed to a thickness of 900 nm as the insulating layer 685. The insulating layers 684 and 685 are successively formed by a plasma CVD method. Note that the interlayer insulating layer may also have a stacked structure including three or more layers. Alternatively, the interlayer insulating layer may have a stacked structure of a silicon oxide layer, a silicon oxynitride layer, or a silicon nitride layer and an insulating layer formed using an organic material such as polyimide, polyamide, polyvinyl phenol, benzocyclobutene, acrylic, or epoxy, a siloxane material such as a siloxane resin, or an oxazole resin.

Figure 19A:
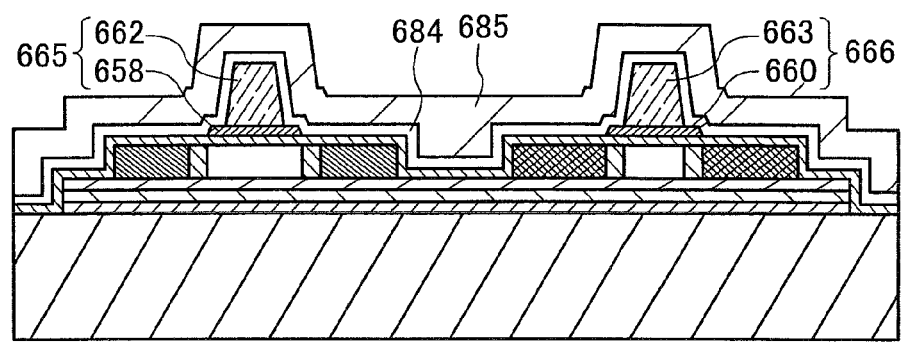
FIGS. 19A and 19B show cross-sectional views illustrating steps subsequent to FIG. 18C.
Figure 19B:
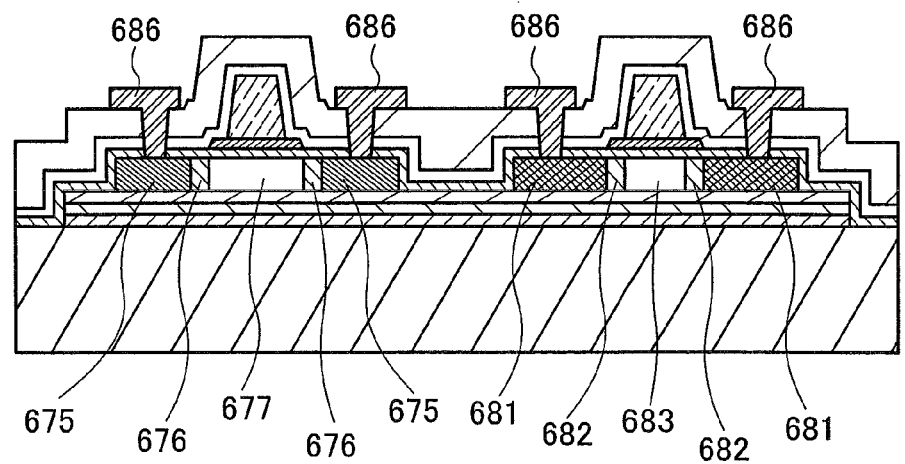

Next, contact holes are formed in the interlayer insulating layer (in this embodiment mode, the insulating layers 684 and 685), and conductive layers 686 which each function as a source electrode or a drain electrode are formed in the contact holes (see FIG. 19B).

The contact holes are selectively formed in the insulating layers 684 and 685 so as to reach the impurity regions 675 that are formed in the single crystal semiconductor layer 651 and the impurity regions 681 that are formed in the single crystal semiconductor layer 652.

The conductive layers 686 can be formed using a single layer film or a stacked layer film of one element selected from aluminum, tungsten, titanium, tantalum, molybdenum, nickel, and neodymium or an alloy containing a plurality of above elements. For example, a conductive layer that is formed using an alloy that contains a plurality of the elements given above can be formed using an aluminum alloy that contains titanium, an aluminum alloy that contains neodymium, or the like. If the conductive layers 686 are each formed using a stacked layer film, a structure can be employed in which an aluminum layer or an aluminum alloy layer as described above is sandwiched between titanium layers, for example.

As shown in FIG. 19B, the n-channel transistor and the p-channel transistor can be manufactured using the semiconductor substrate 10.

Embodiment Mode 7

In this embodiment mode, a semiconductor device using the semiconductor substrate according to the present invention and a manufacturing method thereof will be described. By combining a plurality of transistors, various types of semiconductor devices are formed. As an example of a method for manufacturing a semiconductor device using the semiconductor substrate 10, a method for manufacturing a transistor will be described in this embodiment mode with reference to FIGS. 20A to 20E. Note that in this embodiment mode, a method for manufacturing an n-channel transistor and a p-channel transistor at the same time will be described.

Figure 20A:
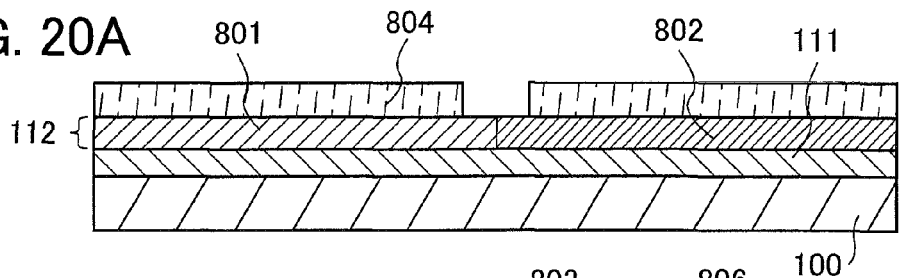
FIGS. 20A to 20E show cross-sectional views illustrating a method for manufacturing a semiconductor device.
Figure 20B:
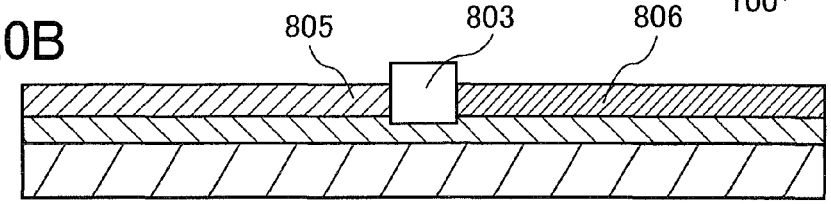
Figure 20C:
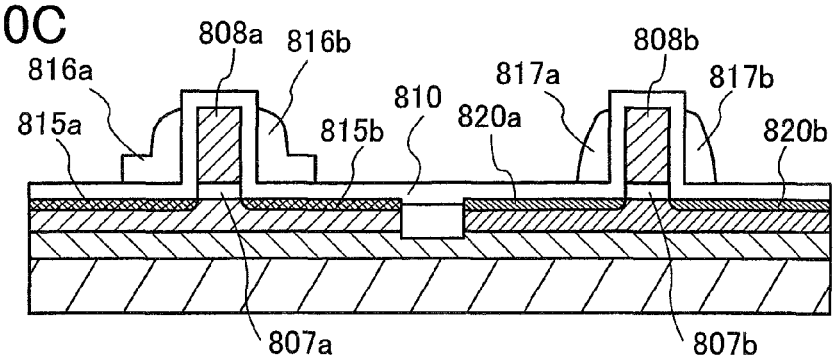
Figure 20D:
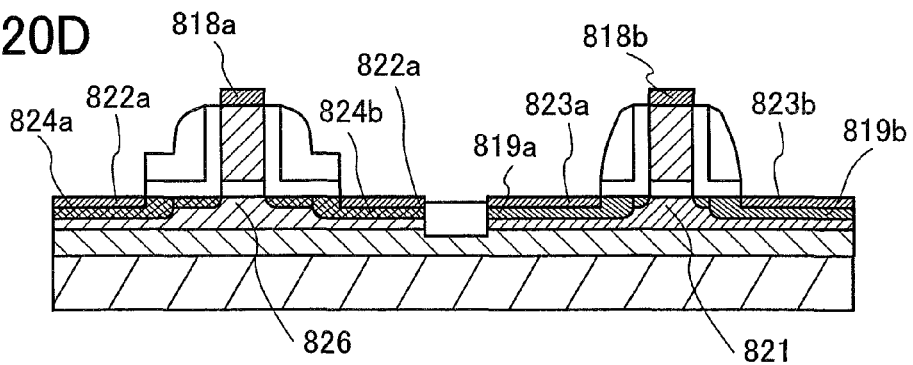

As shown in FIG. 20A, a semiconductor substrate in which a buffer layer 111 and a single crystal semiconductor layer 112 are formed over a supporting substrate 100 is prepared. Although an example in which the semiconductor substrate 10 having the structure shown in FIG. 1 is used as the semiconductor substrate is described in this embodiment mode, a semiconductor substrate having another structure shown in this specification can also be used. The buffer layer 111 may have either a single layer structure or a multilayer structure and may have, for example, a three-layer structure including a first insulating layer 113b that serves as a barrier layer.

The single crystal semiconductor layer 112 has impurity regions (channel-doped regions) to which a p-type impurity element such as boron, aluminum, or gallium or an n-type impurity element such as phosphorus or arsenic is added in accordance with formation regions of an n-channel field-effect transistor (hereinafter referred to as an nFET) and a p-channel field-effect transistor (hereinafter referred to as a pFET). Here, an n-type impurity region 801 is formed in a region where a pFET is to be formed, and a p-type impurity region 802 is formed in a region where an nFET is to be formed. Next, a protective layer 804 having an opening is formed over the single crystal semiconductor layer 112.

Etching is conducted using the protective layer 804 as a mask to remove an exposed portion of the single crystal semiconductor layer 112 and a portion of the buffer layer 111 thereunder. Then, a silicon oxide film is deposited using organosilane as a source gas by a PECVD method. This silicon oxide film is deposited thick enough to fill the portion where the single crystal semiconductor layer 112 and the buffer layer 111 are removed. Next, after a portion of the silicon oxide film superposed over the single crystal semiconductor layer 112 is removed by polishing, the protective layer 804 is removed, whereby an element isolating insulating layer 803 is left. The element isolating insulating layer 803 divides the single crystal semiconductor layer 112 into an element region 805 and an element region 806 (see FIG. 20B).

Next, a first insulating film is formed over the single crystal semiconductor layer 112, and gate electrode layers 808a and 808b are formed over the first insulating film. Then, the first insulating film is etched using the gate electrode layers 808a and 808b as masks to form gate insulating layers 807a and 807b.

The gate insulating layers 807a and 807b may be formed with a silicon oxide film or a stacked structure of a silicon oxide film and a silicon nitride film. A silicon oxynitride film, a silicon nitride oxide film, or the like can be used as the gate insulating layer. The gate insulating layers 807a and 807b may be formed by depositing an insulating film by a PECVD method or a low pressure CVD method or may be formed by solid phase oxidation or solid phase nitridation by plasma treatment. This is because a gate insulating layer which is formed by oxidation or nitridation of a semiconductor layer by plasma treatment is dense, has high dielectric strength, and is excellent in reliability. For example, dinitrogen monoxide ($N_2O$) is diluted one- to three-fold (flow rate) with Ar and is introduced into a reaction chamber. With a pressure of 10 Pa to 30 Pa, a microwave (2.45 GHz) electric power of 3 kW to 5 kW is applied to the mixed gas of $N_2O$ and Ar, which is thus excited. Accordingly, the surface of the single crystal semiconductor layer 112 (element regions 805 and 806) is oxidize or nitrided. By this treatment, an insulating film having a thickness of 1 nm to 10 nm (preferably, 2 nm to 6 nm) is formed. Further, dinitrogen monoxide ($N_2O$) and silane ($SiH_4$) are introduced into a reaction chamber, to which a microwave (2.45 GHz) electric power of 3 kW to 5 kW is applied under a pressure of 10 Pa to 30 Pa. Thus, a silicon oxynitride film as a gate insulating layer is formed by a PECVD method. By combination of solid-phase reaction and reaction by vapor deposition, a gate insulating layer having low interface state density and excellent dielectric strength can be formed.

For the gate insulating layers 807a and 807b, a high-dielectric-constant material such as zirconium dioxide, hafnium oxide, titanium dioxide, or tantalum pentoxide may be used. By using a high-dielectric-constant material for the gate insulating layers 807a and 807b, gate leakage current can be reduced.

The gate electrode layers 808a and 808b can be formed by a sputtering method, an evaporation method, a CVD method, or the like. The gate electrode layers 808a and 808b may be formed using a film of a metal selected from tantalum (Ta), tungsten (W), titanium (Ti), molybdenum (Mo), aluminum (Al), copper (Cu), chromium (Cr), and neodymium (Nd) or an alloy material or a compound material containing the metal as its main component. Moreover, the gate electrode layers 808a and 808b may be formed using a semiconductor film typified by a polycrystalline silicon film which is doped with an impurity element such as phosphorus or using an AgPdCu alloy. Here, the gate electrode layers 808a and 808b are formed using a polycrystalline silicon film containing an impurity element.

Next, a second insulating film 810 is formed to cover the gate electrode layers 808a and 808b. Then, a sidewall insulating layer 816a and 816b which forms a sidewall of the gate electrode layer 808a and a sidewall insulating layer 817a and 817b which forms a sidewall of the gate electrode layer 808b are formed. The width of the sidewall insulating layer 816a and 816b which is included in a pFET is larger than that of the sidewall insulating layer 817a and 817b which is included in an nFET. Then, arsenic (As) or the like is added to the region where an nFET is to be formed, thereby forming first impurity regions 820a and 820b which each have a shallow junction depth. On the other hand, boron (B) or the like is added to the region where a pFET is to be formed, thereby forming second impurity regions 815a and 815b which each have a shallow junction depth (see FIG. 20C).

Next, the second insulating film 810 is partially etched to expose the first impurity regions 820a and 820b, the second impurity regions 815a and 815b, and the top surfaces of the gate electrode layers 808a and 808b. After that, the region where an nFET is to be formed is doped with As or the like to form third impurity regions 819a and 819b which each have a deep junction depth, and the region where a pFET is to be formed is doped with B or the like to form fourth impurity regions 824a and 824b which each have a deep junction depth. Next, heat treatment for activation is performed. Then, a cobalt film is formed as a metal film for forming silicide. Then, heat treatment (500° C., 1 minute) such as RTA is performed to silicide silicon in portions in contact with the cobalt film, thereby forming silicides 822a, 822b, 823a, and 823b. In addition, silicides 818a and 818b are formed over the gate electrode layers 808a and 808b by reaction of the cobalt film and polycrystalline silicon films which form these layers. After that, the cobalt film is selectively removed. Next, heat treatment is performed at a temperature higher than that of the heat treatment for silicidation to decrease the resistance of the silicide portions (see FIG. 20D). In the element regions 805 and 806, channel formation regions 826 and 821 are formed, respectively.

Next, an interlayer insulating layer 827 is formed, and with the use of a resist mask, contact holes (openings), which reach the third impurity regions 819a and 819b having a deep junction depth and the fourth impurity regions 824a and 824b having a deep junction depth, are formed in the interlayer insulating layer 827. Etching may be performed once or a plurality of times depending on selectivity of etching between materials to be used.

An etching method and its conditions may be set as appropriate depending on the material of the interlayer insulating layer 827. Either wet etching or dry etching, or both of them can be used as appropriate. In this embodiment mode, dry etching is used. An etching gas can be selected as appropriate from among a chlorine-based gas typified by $Cl_2$, $BCl_3$, $SiCl_4$, or $CCl_4$; a fluorine-based gas typified by $CF_4$, $SF_6$, or $NF_3$; and $O_2$. In addition, a noble gas may be added to an etching gas to be used. As a noble gas element to be added, one or a plurality of elements selected from He, Ne, Ar, Kr, and Xe can be used. A hydrofluoric acid-based solution such as a mixed solution of ammonium hydrogen fluoride and ammonium fluoride may be used as an etchant in wet etching.

A conductive film is formed to cover the contact holes, and the conductive film is etched to form wiring layers 840a, 840b, 840c, and 840d which are connected to parts of the source and drain regions. Each of these wiring layers 840a, 840b, 840c, and 840d also functions as a source electrode layer or a drain electrode layer. The wiring layers 840a, 840b, 840c, and 840d can be formed in such a manner that a conductive film is formed by a PVD method, a CVD method, an evaporation method, or the like and is then etched into a desired shape with the use of a mask. Alternatively, they can be formed by selective formation of a conductive layer into a desired shape in a predetermined position by a droplet discharge method, a printing method, an electrolytic plating method, or the like. A reflow method or a damascene method may also be used. The wiring layers can be formed using a metal such as Ag, Au, Cu, Ni, Pt, Pd, Ir, Rh, W, Al, Ta, Mo, Cd, Zn, Fe, Ti, Zr, or Ba or an alloy or a nitride thereof. The wiring layers may each have either a single layer structure or a stacked layer structure.

In this embodiment mode, the wiring layers 840a, 840b, 840c, and 840d are formed as embedded wiring layers to fill the contact holes formed in the interlayer insulating layer 827. The wiring layers 840a, 840b, 840c, and 840d, which are the embedded wiring layers, are formed by forming a conductive film having an enough thickness to fill the contact holes and by removing an unnecessary portion of the conductive film so that the conductive film is left remaining only in the contact hole portions.

An insulating layer 828 and wiring layers 841a, 841b, and 841c which function as lead wiring layers are formed over the wiring layers 840a, 840b, 840c, and 840d which are embedded.

Figure 20E:
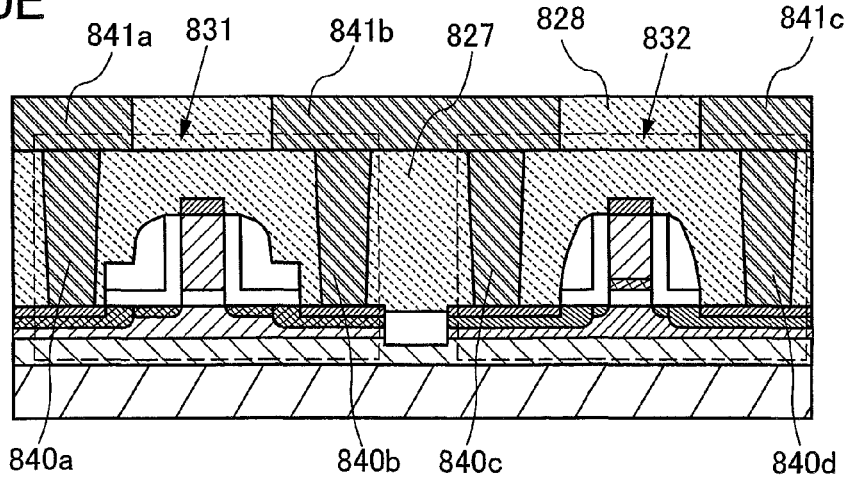

Through the above-described steps, an n-channel field-effect transistor 832 can be formed using the element region 806 of the single crystal semiconductor layer 112 that is bonded to the supporting substrate 100 and a p-channel field-effect transistor 831 can be formed using the element region 805 similarly (see FIG. 20E). Note that in this embodiment mode, the n-channel field-effect transistor 832 and the p-channel field-effect transistor 831 are electrically connected to each other by the wiring layer 841b.

Although the cases where each of the p-channel transistor and the n-channel transistor has a single electrode functioning as a gate are described in Embodiment Modes 5 to 7, the present invention is not limited to these structures. The transistor manufactured according to the present invention may have a multi-gate structure in which a plurality of electrodes functioning as gates are provided and electrically connected to one another. For example, the transistor may have a double-gate structure where two channel formation regions are formed or a triple-gate structure where three channel formation regions are formed. Moreover, the transistor may have a gate planar structure.

Note that a semiconductor layer included in the semiconductor substrate of the present invention is obtained by slicing a single crystal semiconductor substrate; thus, its orientation does not vary. Consequently, as described in Embodiment Modes 5 to 7, variation in electric characteristics such as threshold voltage and mobility among a plurality of transistors manufactured using the semiconductor substrate of the present invention can be made small. Further, there are almost no crystal grain boundaries, a leakage current of a transistor due to a crystal grain boundary can be suppressed, and power saving of a semiconductor device can be realized. Accordingly, a highly reliable semiconductor device can be manufactured.

In the case of manufacturing a transistor from a polycrystalline semiconductor film that is obtained by laser crystallization, it has been necessary to determine a layout of the semiconductor film of the transistor taking into consideration a laser beam scanning direction in order to obtain high mobility. However, in the case of using the semiconductor substrate of the present invention, there is no need for such layout determination, and there are less restrictions in designing the semiconductor devices of Embodiment Modes 5 to 7 and the like.

As described in Embodiment Modes 5 to 7, an n-channel transistor and a p-channel transistor can be formed in a semiconductor substrate at the same time. Thus, a variety of circuits can be formed using these transistors. For example, a circuit having a CMOS structure can be formed by a complementary combination of an n-channel transistor and a p-channel transistor.

When a wiring, an element, and the like are further stacked over this circuit having a CMOS structure, a variety of semiconductor devices such as a microprocessor can be manufactured. Note that a microprocessor has an arithmetic logic unit (also referred to as an ALU), an ALU controller, an instruction decoder, an interrupt controller, a timing controller, a register, a register controller, a bus interface (Bus I/F), a read-only memory, and a memory interface (ROM I/F).

When a microprocessor is formed with an integrated circuit including a CMOS structure, not only an increase in processing speed but also a reduction in power consumption can be achieved.

A variety of semiconductor devices can be manufactured by a combination of a plurality of transistors that are manufactured using the semiconductor substrate according to the present invention. Hereinafter, in Embodiment Modes 8 to 11, semiconductor devices having circuits including transistors, capacitors, and the like will be described.

Embodiment Mode 8

Figure 21:
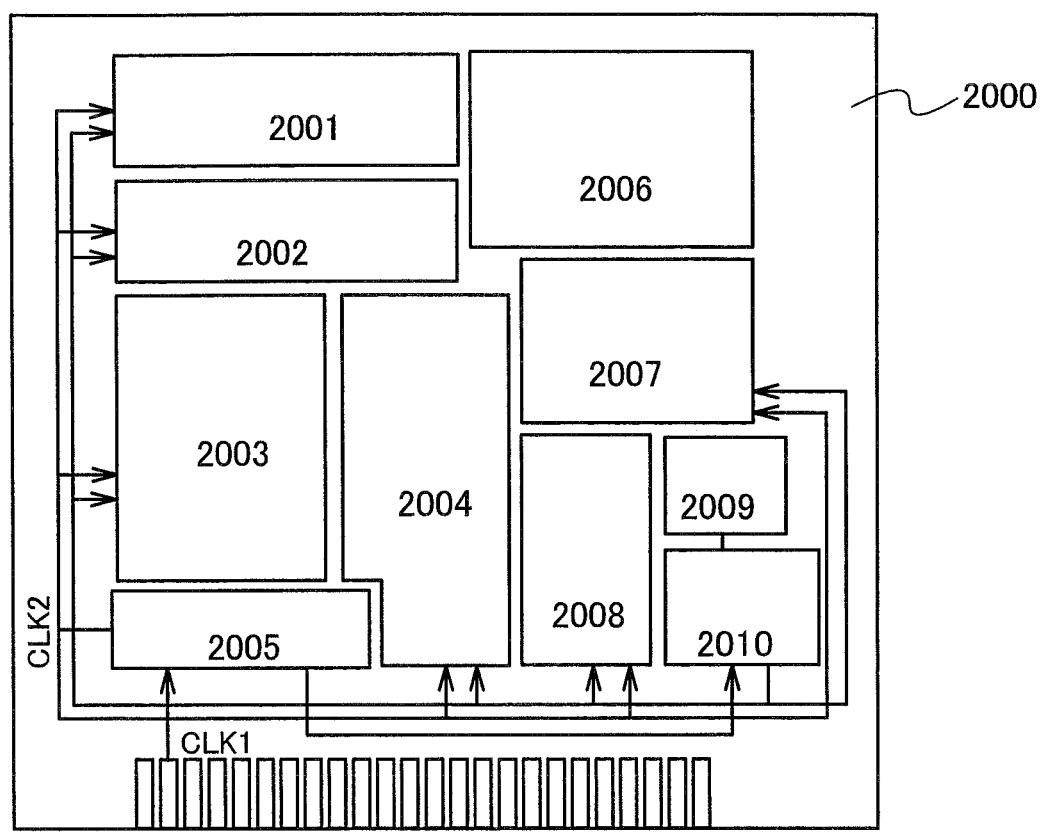
FIG. 21 is a block diagram showing an example of a structure of a microprocessor.

In this embodiment mode, a microprocessor is described as an example of a semiconductor device. FIG. 21 is a block diagram showing an example of a structure of a microprocessor 2000.

The microprocessor 2000 has an arithmetic logic unit (also referred to as an ALU) 2001, an ALU controller 2002, an instruction decoder 2003, an interrupt controller 2004, a timing controller 2005, a register 2006, a register controller 2007, a bus interface (Bus I/F) 2008, a read-only memory 2009, and a ROM interface 2010.

An instruction input to the microprocessor 2000 through the bus interface 2008 is input to the instruction decoder 2003, decoded therein, and then input to the ALU controller 2002, the interrupt controller 2004, the register controller 2007, and the timing controller 2005. The ALU controller 2002, the interrupt controller 2004, the register controller 2007, and the timing controller 2005 conduct various controls based on the decoded instruction.

The ALU controller 2002 generates signals for controlling the operation of the ALU 2001. The interrupt controller 2004 is a circuit which processes an interrupt request from an external input/output device or a peripheral circuit while the microprocessor 2000 is executing a program, and the interrupt controller 2004 processes an interrupt request based on its priority or a mask state. The register controller 2007 generates an address of the register 2006, and reads and writes data from and to the register 2006 in accordance with the state of the microprocessor 2000. The timing controller 2005 generates signals for controlling timing of operation of the ALU 2001, the ALU controller 2002, the instruction decoder 2003, the interrupt controller 2004, and the register controller 2007. For example, the timing controller 2005 is provided with an internal clock generator for generating an internal clock signal CLK2 based on a reference clock signal CLK1. As shown in FIG. 21, the internal clock signal CLK2 is input to other circuits.

Embodiment Mode 9

Figure 22:
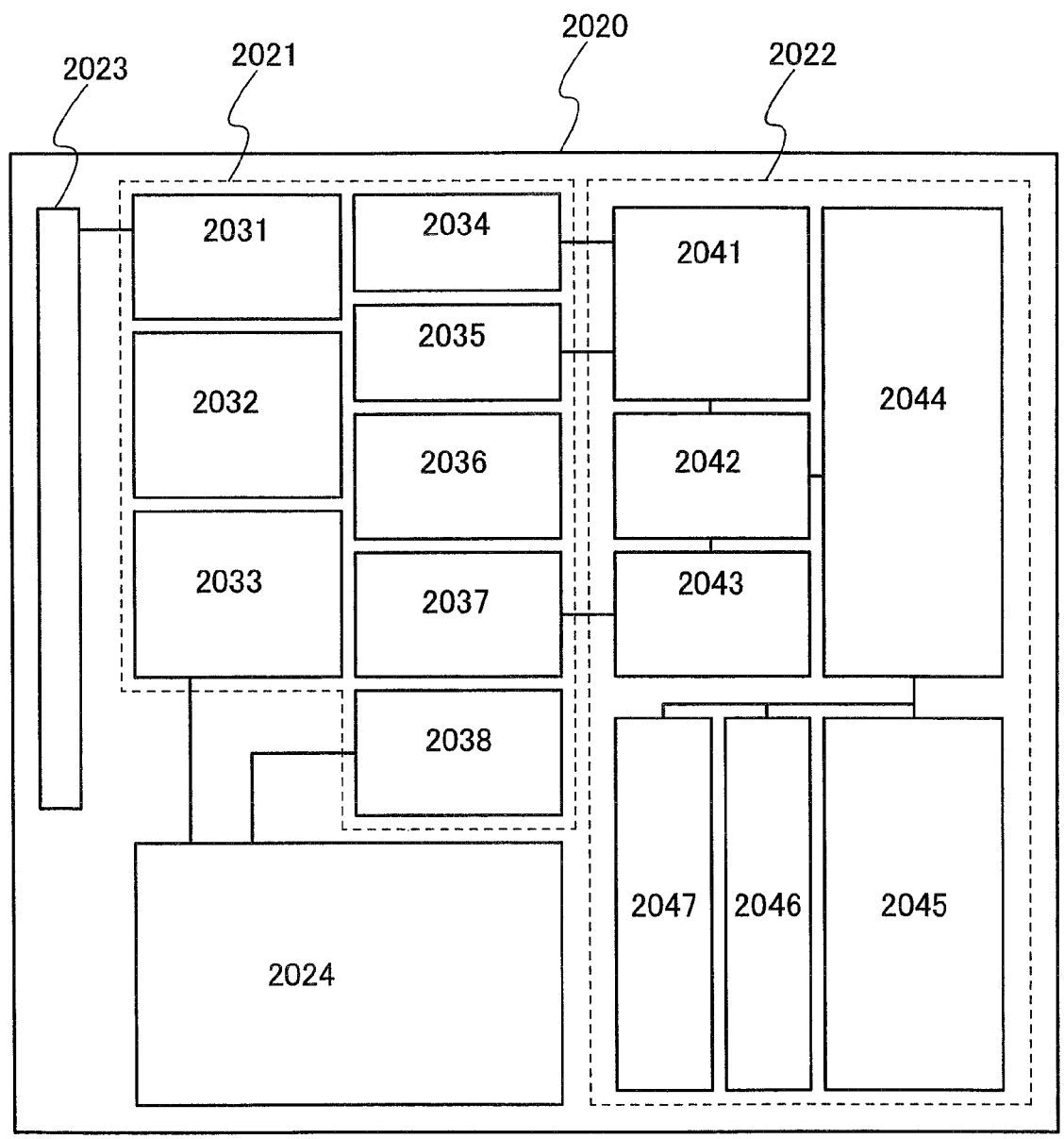
FIG. 22 is a block diagram showing an example of a structure of an RFCPU.

In this embodiment mode, an example of a semiconductor device having an arithmetic function and a function for contactless data transmission and reception is described. FIG. 22 is a block diagram showing an example of a structure of such a semiconductor device. A semiconductor device 2020 shown in FIG. 22 functions as an arithmetic processing unit that operates to transmit and receive signals to and from an external device by wireless communication.

As shown in FIG. 22, the semiconductor device 2020 has an analog circuit portion 2021, a digital circuit portion 2022, an antenna 2023, and a capacitor portion 2024. The analog circuit portion 2021 has a resonance circuit 2031 with a resonance capacitor, a constant voltage circuit 2032, a rectifier circuit 2033, a demodulator circuit 2034, a modulator circuit 2035, a reset circuit 2036, an oscillator circuit 2037, and a power supply control circuit 2038. The digital circuit portion 2022 has an RF interface 2041, a control register 2042, a clock controller 2043, a CPU interface 2044, a central processing unit (CPU) 2045, a random-access memory (RAM) 2046, and a read-only memory (ROM) 2047.

The operation of the semiconductor device 2020 is roughly as follows. The resonance circuit 2031 generates an induced electromotive force based on a signal received by the antenna 2023. The induced electromotive force is stored in the capacitor portion 2024 through the rectifier circuit 2033. This capacitor portion 2024 is preferably formed using a capacitor such as a ceramic capacitor or an electric double layer capacitor. The capacitor portion 2024 does not need to be integrated with a substrate included in the semiconductor device 2020 and can also be incorporated in the semiconductor device 2020 as a separate component.

The reset circuit 2036 generates a signal for resetting and initializing the digital circuit portion 2022. For example, the reset circuit 2036 generates a signal which rises after rise in the power supply voltage with delay as a reset signal. The oscillator circuit 2037 changes the frequency and duty ratio of a clock signal in response to a control signal generated by the constant voltage circuit 2032. The demodulator circuit 2034 is a circuit which demodulates a received signal, and the modulator circuit 2035 is a circuit which modulates data to be transmitted.

For example, the demodulator circuit 2034 is formed using a low-pass filter and binarizes a received amplitude-modulated (ASK) signal based on its amplitude. In order to vary the amplitude of an amplitude-modulated (ASK) transmission signal and transmit the signal, the modulator circuit 2035 changes the amplitude of a communication signal by changing a resonance point of the resonance circuit 2031.

The clock controller 2043 generates a control signal for changing the frequency and duty ratio of a clock signal in accordance with the power supply voltage or a consumption current of the central processing unit 2045. The power supply voltage is managed by the power supply control circuit 2038.

A signal input from the antenna 2023 to the semiconductor device 2020 is demodulated by the demodulator circuit 2034 and then decomposed into a control command, data, and the like by the RF interface 2041. The control command is stored in the control register 2042. The control command includes reading of data stored in the read-only memory 2047, writing of data to the random-access memory 2046, an arithmetic instruction to the central processing unit 2045, and the like.

The central processing unit 2045 accesses the read-only memory 2047, the random-access memory 2046, and the control register 2042 via the CPU interface 204. The CPU interface 2044 has a function of generating an access signal for any of the read-only memory 2047, the random-access memory 2046, and the control register 2042 based on an address the central processing unit 2045 requests.

As an arithmetic method of the central processing unit 2045, a method may be employed in which the read-only memory 2047 stores an operating system (OS) and a program is read and executed at the time of starting operation. Alternatively, a method may be employed in which a dedicated arithmetic circuit is provided and arithmetic processing is conducted using hardware. In a method in which both hardware and software are used, part of processing is conducted by a dedicated arithmetic circuit and the other part of the arithmetic processing is conducted by the central processing unit 2045 using a program.

Embodiment Mode 10

In this embodiment mode, a display device is described as an example of a structure of a semiconductor device.

First, a structure of a display device of this embodiment mode is described with reference to FIGS. 23 to 25. In this embodiment mode, an active matrix display device is described as the display device.

Figure 23:
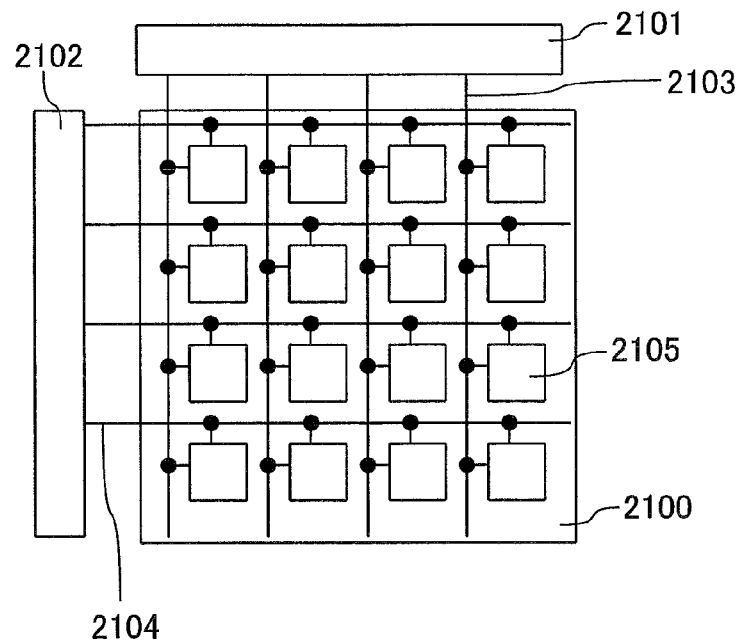
FIG. 23 is a block diagram showing an example of a structure of an active matrix display device.
Figure 24:
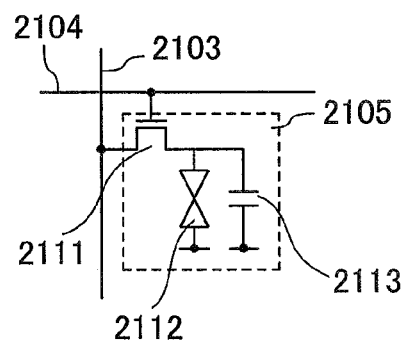
FIG. 24 is a circuit diagram showing an example of a structure of a pixel of a liquid crystal display device.

FIG. 23 is a block diagram showing an example of a structure of the active matrix display device of this embodiment mode. The active matrix display device of this embodiment mode has a pixel portion 2100, a signal line driver circuit 2101, a scan line driver circuit 2102, a plurality of signal lines 2103 that are connected to the signal line driver circuit 2101, and a plurality of scan lines 2104 that are connected to the scan line driver circuit 2102.

The plurality of signal lines 2103 is arranged in a column direction, and the plurality of scan lines 2104 is arranged in a row direction to intersect with the signal lines 2103. In the pixel portion 2100, a plurality of pixels 2105 is arranged in a grid corresponding to a grid formed by the signal lines 2103 and the scan lines 2104. The pixels 2105 are connected to the signal lines 2103 and the scan lines 2104. The pixels 2105 each include a switching element and a display element. The switching element controls whether or not the pixel is selected depending on a signal which is input to the scan line 2104. The grayscale of the display element is controlled depending on a video signal which is input from the signal line 2103.

Examples of structures of the pixel 2105 are described with reference to FIGS. 24 and 25. FIG. 24 shows an example of a structure of the pixel 2105 when the present invention is applied to an active matrix liquid crystal display device. The pixel 2105 has a switching transistor 2111 as a switching element and has a liquid crystal element 2112 as a display element. A gate of the switching transistor 2111 is connected to the scan line 2104; one of a source and a drain thereof is connected to the signal line 2103; and the other is connected to the liquid crystal element 2112.

The liquid crystal element 2112 includes a pixel electrode, a counter electrode, and liquid crystal. The orientation of liquid crystal is controlled with an electric field which is applied between the pixel electrode and the counter electrode. The liquid crystal is encapsulated between two substrates of the active matrix liquid crystal display device. A storage capacitor 2113 is an element used to retain the electric potential of the pixel electrode of the liquid crystal element 2112 and is connected to the pixel electrode of the liquid crystal element 2112.

Figure 25:
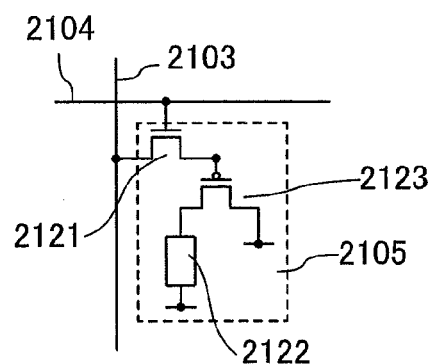
FIG. 25 is a circuit diagram showing an example of a structure of a pixel of an electroluminescence device.

FIG. 25 shows an example of a structure of the pixel 2105 when the present invention is applied to an active matrix electroluminescent display device. The pixel 2105 has a selecting transistor 2121 as a switching element and has a light emitting element 2122 as a display element. In addition, the pixel 2105 has a display control transistor 2123 a gate of which is connected to the selecting transistor 2121. The light emitting element 2122 has a pair of electrodes and a light emitting material which is interposed between the pair of electrodes.

Figure 26:
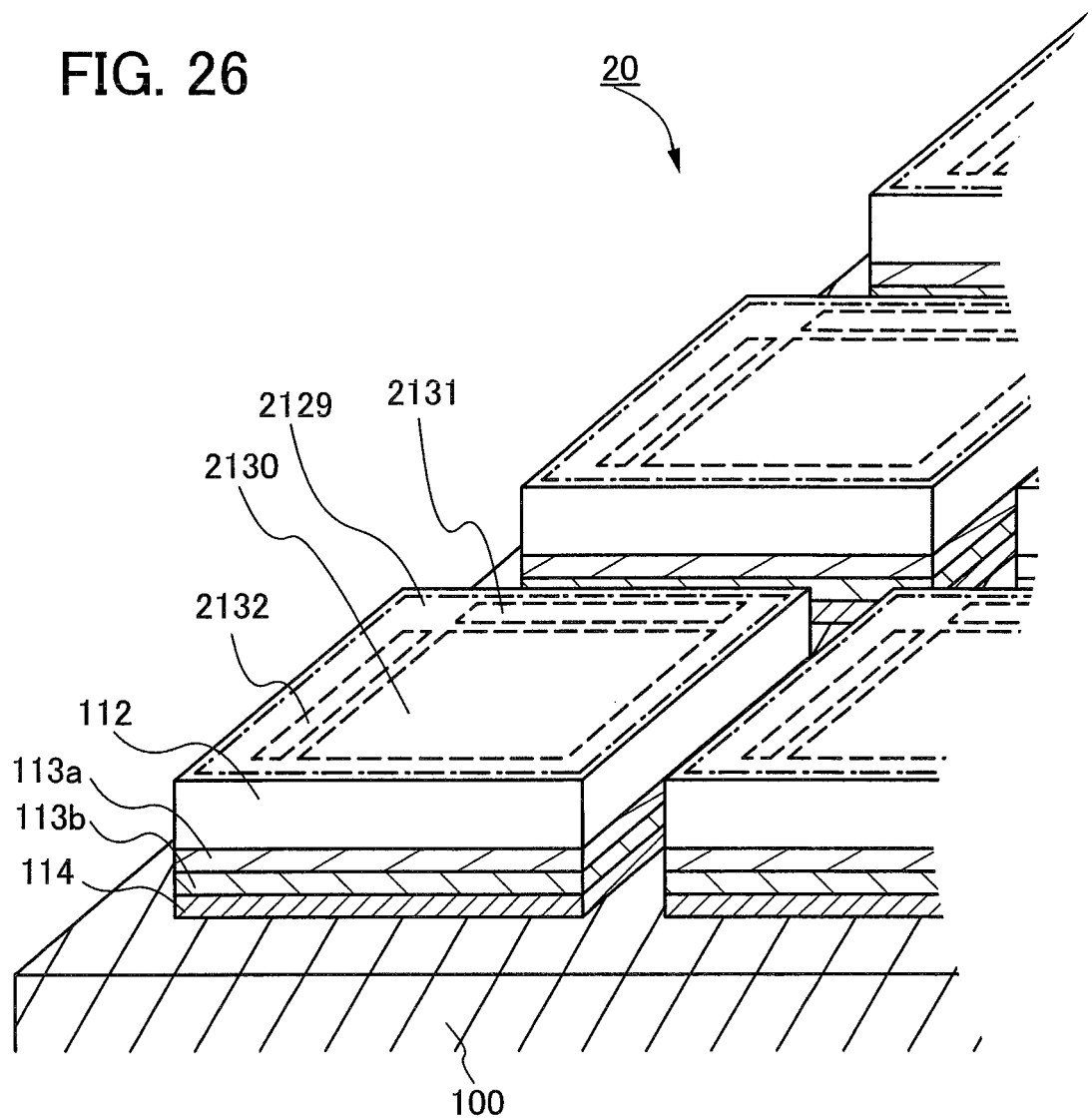
FIG. 26 shows a perspective view of an example of arrangement of a circuit in a semiconductor substrate.

Next, a circuit layout method for manufacture of a display device using the semiconductor substrate of the present invention is described. FIG. 26 is a diagram showing a main portion of the semiconductor substrate 20 which is manufactured by the manufacturing method of Embodiment Mode 1 (see FIG. 2). A plurality of substrates each included in a display device can be manufactured from one semiconductor substrate 20. FIG. 26 shows a circuit layout example for manufacture of one display device from one single crystal semiconductor layer 112. In each single crystal semiconductor layer 112, one display panel formation region 2129 is formed. The display device has a pixel portion 2100, a signal line driver circuit 2101, and a scan line driver circuit 2102. Thus, each display panel formation region 2129 has regions in which these are formed (a pixel formation region 2130, a signal line driver circuit formation region 2131, and a scan line driver circuit formation region 2132).

Note that one single crystal semiconductor layer 112 can be provided with a plurality of display panel formation regions 2129. In addition, a semiconductor substrate used for manufacture of the display device is not limited to the semiconductor substrate 20, and another semiconductor substrate of the present invention can also be used.

Figure 27A:
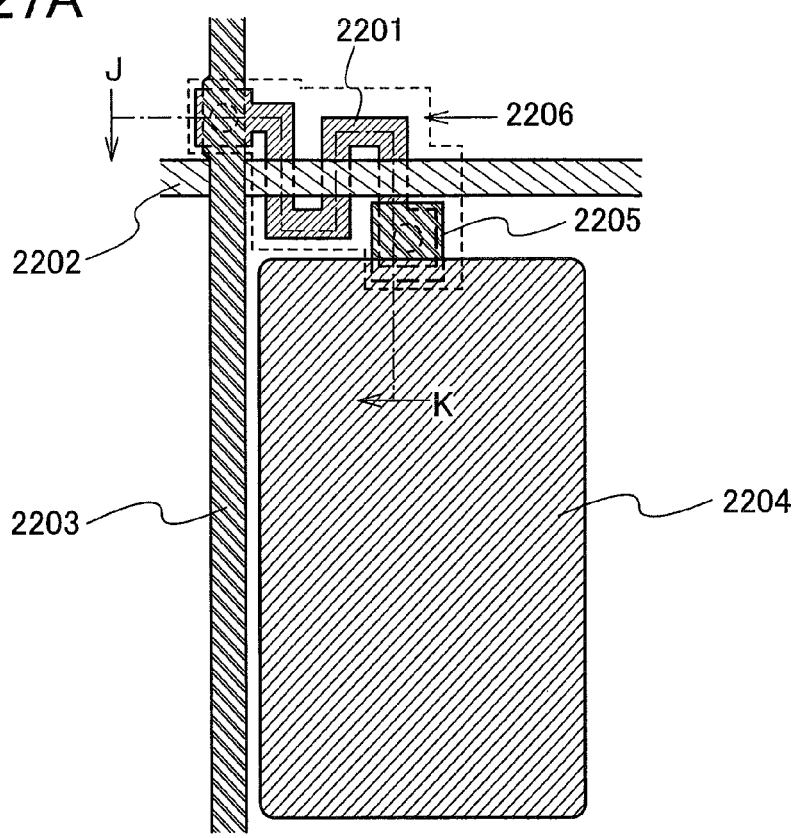
FIG. 27A shows a plan view of a pixel of a liquid crystal display device and FIG. 27B shows a cross-sectional view of FIG. 27A taken along a section line J-K.
Figure 27B:
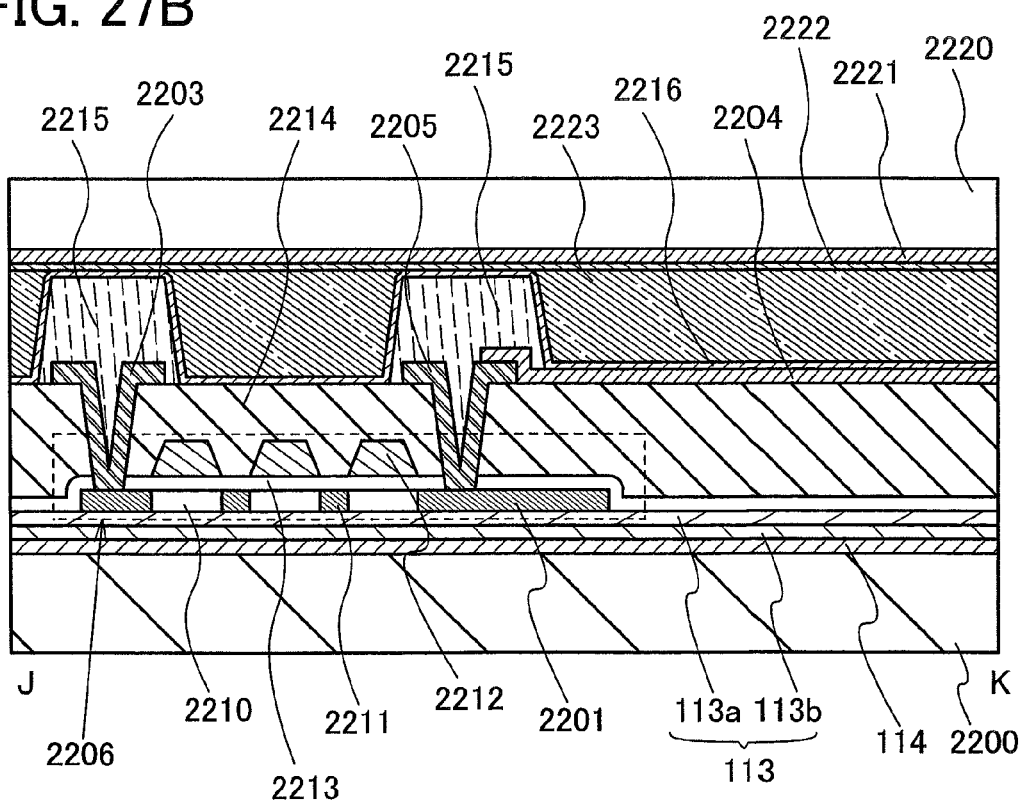

FIGS. 27A and 27B are diagrams illustrating an example of a structure of a liquid crystal display device. FIG. 27A shows a plan view of a pixel of the liquid crystal display device, and FIG. 27B shows a cross-sectional view of the diagram of FIG. 27A along a section line J-K. As shown in FIG. 27A, a pixel includes: a semiconductor layer 2201; a scan line 2202 that crosses the semiconductor layer 2201; a signal line 2203 that crosses the scan line 2202; a pixel electrode 2204; and an electrode 2205 that electrically connects the pixel electrode 2204 and the semiconductor layer 2201. The semiconductor layer 2201 is a layer that is formed from the semiconductor layer 2201 bonded to an SOI substrate, and forms a transistor 2206 of the pixel.

As shown in FIG. 27B, the second insulating layer 114, the first insulating layer 113 including the first insulating layer 113b and the first insulating layer 113a, and the semiconductor layer 2201 are stacked over a substrate 2200. The substrate 2200 is obtained by dividing the supporting substrate 100. The semiconductor layer 2201 is a layer formed by element isolation of the single crystal semiconductor layer 112 by etching. In the semiconductor layer 2201, a channel formation region 2210 and an n-type high-concentration impurity region 2211 are formed. A gate electrode 2212 of the transistor 2206 is included in the scan line 2202. One of a source electrode and a drain electrode of the transistor 2206 is included in the signal line 2203, and the other is formed by the electrode 2205. Between the semiconductor layer 2201 and the gate electrode 2212, a gate insulating layer 2213 is formed.

An interlayer insulating film 2214 is formed to cover the semiconductor layer 2201, the gate insulating layer 2213, and the scan line 2202. Over the interlayer insulating film 2214, the signal line 2203, the pixel electrode 2204, and the electrode 2205 are provided. In addition, over the interlayer insulating film 2214, a columnar spacer 2215 is formed. An orientation film 2216 is formed to cover the signal line 2203, the pixel electrode 2204, the electrode 2205, and the columnar spacer 2215. Over a counter substrate 2220, a counter electrode 2221 and an orientation film 2222 that covers the counter electrode 2221 are formed. The columnar spacer 2215 is formed to maintain a space between the substrate 2200 and the counter substrate 2220. In the space formed by the columnar spacer 2215, a liquid crystal layer 2223 is formed. At connection portions of the signal line 2203 and the electrode 2205 with the high-concentration impurity region 2211, because there are steps formed in the interlayer insulating film 2214 due to formation of contact holes, orientation of liquid crystal in the liquid crystal layer 2223 in these connection portions becomes disordered easily. Accordingly, the columnar spacer 2215 formed at these connection portions can prevent orientation disorder of liquid crystal.

Figure 28A:
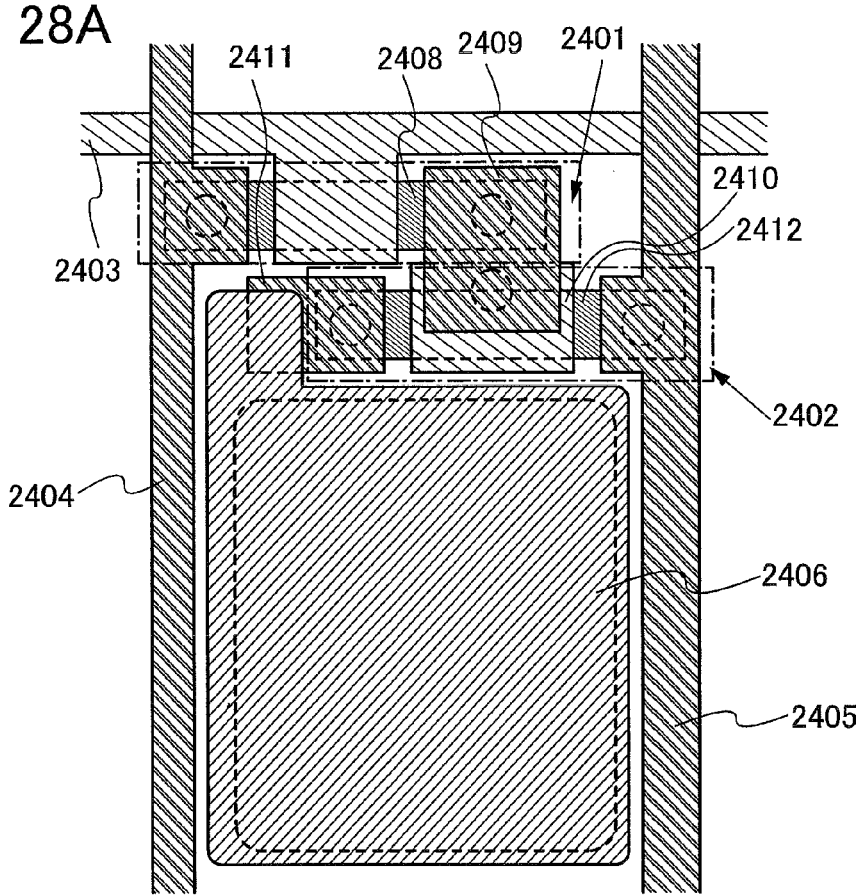
FIG. 28A shows a plan view of a pixel of an electroluminescent display device and FIG. 28B shows a cross-sectional view of the pixel.
Figure 28B:
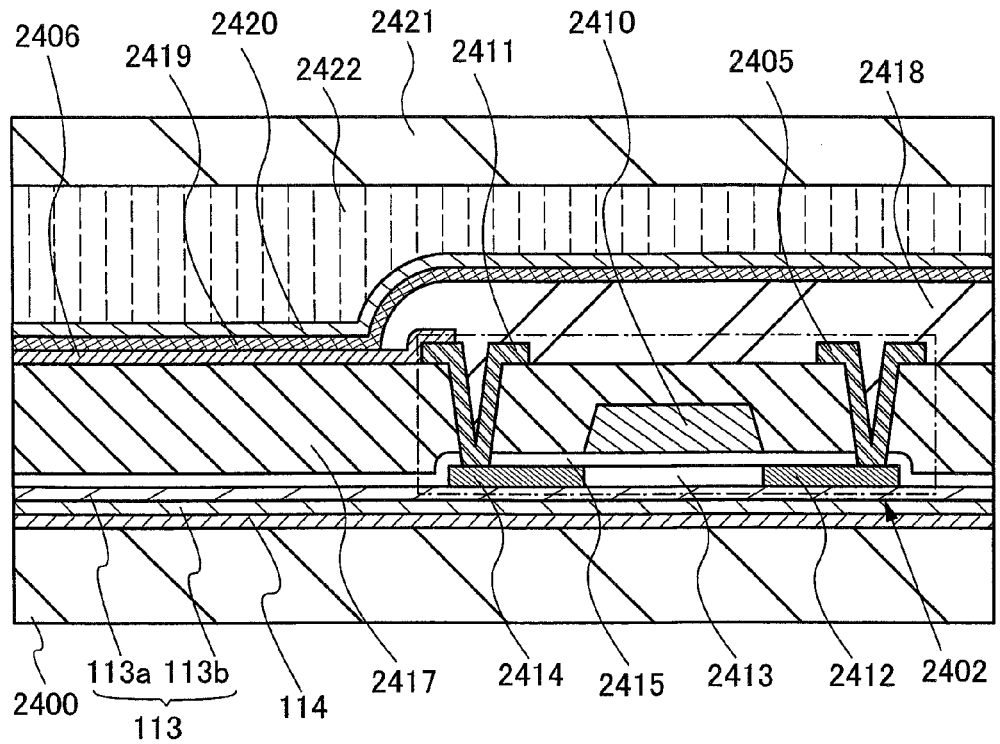

Next, an electroluminescent display device (hereinafter referred to as an "EL display device") is described. FIGS. 28A and 28B are diagrams for illustrating an EL display device that is manufactured by the method of Embodiment Mode 3. FIG. 28A shows a plan view of a pixel of the EL display device, and FIG. 28B shows a cross-sectional view of the pixel. As shown in FIG. 28A, a pixel includes a selecting transistor 2401, a display control transistor 2402, a scan line 2403, a signal line 2404, a current supply line 2405, and a pixel electrode 2406, which are formed over a substrate 2400. Each pixel is provided with a light emitting element having a structure in which a layer containing an electroluminescent material (EL layer) is interposed between a pair of electrodes. One of the electrodes of the light emitting element is the pixel electrode 2406.

The selecting transistor 2401 includes a semiconductor layer 2408 that is formed from the single crystal semiconductor layer 112. In the selecting transistor 2401, a gate electrode is included in the scan line 2403, one of two electrodes serving as source and drain electrodes is included in the signal line 2404, and the other is formed as an electrode 2409. In the display control transistor 2402, a gate electrode 2410 is electrically connected to the electrode 2409, and one of two electrodes serving as source and drain electrodes is formed as an electrode 2411 that is electrically connected to the pixel electrode 2406, and the other is included in the current supply line 2405.

The display control transistor 2402 is a p-channel transistor and includes a semiconductor layer 2412 that is formed from the single crystal semiconductor layer 112. As shown in FIG. 28B, in the semiconductor layer 2412, a channel formation region 2413 and a p-type high-concentration impurity region 2414 are formed. An insulating layer 2415 between the semiconductor layer 2412 and the gate electrode 2410 forms gate insulating layers of the selecting transistor 2401 and the display control transistor 2402.

An interlayer insulating film 2417 is formed to cover the semiconductor layers 2408 and 2411, the scan line 2403, and the gate electrode 2410 of the display control transistor 2402. Over the interlayer insulating film 2417, the signal line 2404, the current supply line 2405, the electrodes 2409 and 2411, and the like are formed. In addition, over the interlayer insulating film 2417, the pixel electrode 2406 that is electrically connected to the electrode 2411 is formed. A peripheral portion of the pixel electrode 2406 is surrounded by an insulating partition layer 2418. An EL layer 2419 is formed over the pixel electrode 2406, and a counter electrode 2420 is formed over the EL layer 2419. A counter substrate 2421 is provided as a reinforcing plate, and the counter substrate 2421 is fixed to a substrate 2400 with a resin layer 2422. The substrate 2400 corresponds to the supporting substrate 100.

The pixel electrode 2406, the EL layer 2419, and the counter electrode 2420 constitutes a part of the light emitting element 2122 (see FIG. 25). One of the pixel electrode 2406 and the counter electrode 2420 functions as an anode, and the other functions as a cathode. EL display devices are classified into three structures according to how light emission of a light emitting element is extracted: (1) a structure in which light from a light emitting element is extracted through the substrate 2400 (also called a bottom emission structure), (2) a structure in which the light is emitted from a side opposite to the supporting substrate 100 side (also called a top emission structure), and (3) a structure in which the light is emitted both through the substrate 2400 and from the side opposite to the substrate 2400 (also called a dual emission structure). The EL display device of this embodiment mode may have any of these three structures.

In the case of a bottom emission structure, it is preferable that the pixel electrode 2406 be a light transmitting electrode and the counter electrode 2420 be a reflective electrode. On the other hand, in the case of a top emission structure, it is preferable that the pixel electrode 2406 be a reflective electrode and the counter electrode 2420 be a light transmitting electrode. In the case of a dual emission structure, it is preferable that each of the pixel electrode 2406 and the counter electrode 2420 be a light transmitting electrode.

Each of the pixel electrode 2406 and the counter electrode 2420 may be formed as a reflective electrode by using a reflective conductive material, for example, a metal element such as tantalum, tungsten, titanium, molybdenum, aluminum, chromium, or silver, an alloy material or a compound material containing the above-described metal element, or the like.

Each of the pixel electrode 2406 and the counter electrode 2420 may be formed as a light transmitting electrode by using a light transmitting conductive material such as indium tin oxide (ITO), zinc oxide (ZnO), indium zinc oxide (IZO), or zinc oxide to which gallium is added (GZO). A light transmitting electrode can also be formed by formation of a film of the above-mentioned reflective conductive material to a thickness of several nanometers to several tens of nanometers. When the film of the above-mentioned reflective conductive material is formed to have such a small thickness, the film can transmit visible light.

A light transmitting electrode can be formed using a conductive composition which contains a conductive high molecular compound (also referred to as a conductive polymer). It is preferable that an electrode formed using a conductive composition have a sheet resistance of 10000 $\Omega$/square or less and a light transmittance of 70% or more at a wavelength of 550 nm. In addition, it is preferable that the conductive high molecular compound which is contained in the conductive composition have a resistance of 0.1 $\Omega\cdot$cm or less.

As the conductive high molecular compound, a so-called n-electron conjugated conductive high molecular compound can be used. Examples include: polyaniline and derivatives thereof; polypyrrole and derivatives thereof; polythiophene and derivatives thereof; copolymers of two or more kinds of those materials; and the like.

Specific examples of conjugated conductive high molecular compounds are as follows: polypyrrole; poly(3-methylpyrrole); poly(3-butylpyrrole); poly(3-octylpyrrole); poly(3-decylpyrrole); poly(3-dimethylpyrrole); poly(3,4-dibutylpyrrole); poly(3-hydroxypyrrole); poly(3-methyl-4-hydroxypyrrole); poly(3-methoxypyrrole); poly(3-ethoxypyrrole); poly(3-octoxypyrrole); poly(3-carboxylpyrrole); poly(3-methyl-4-carboxylpyrrole); poly(N-methylpyrrole); polythiophene; poly(3-methylthiophene); poly(3-butylthiophene); poly(3-octylthiophene); poly(3-decylthiophene); poly(3-dodecylthiophene); poly(3-methoxythiophene); poly(3-ethoxythiophene); poly(3-octoxythiophene); poly(3-carboxylthiophene); poly(3-methyl-4-carboxylthiophene); poly(3,4-ethylenedioxythiophene); polyaniline; poly(2-methylaniline); poly(2-octylaniline); poly(2-isobutylaniline); poly(3-isobutylaniline); poly(2-anilinesulfonic acid); poly(3-anilinesulfonic acid); and the like.

A light transmitting electrode may be formed using any of the above-mentioned conductive high molecular compounds alone as the conductive composition. Furthermore, an organic resin can be added to any of the above-mentioned conductive high molecular compounds in order to adjust film characteristics such as film quality or film strength of a light transmitting electrode formed of the conductive composition.

Examples of organic resins that can be used include thermosetting resins, thermoplastic resins, photocurable resins, and the like each of which is compatible with or can be mixed and dispersed into a conductive high molecular compound. Examples of such resins include: polyester-based resins such as polyethylene terephthalate, polybutylene terephthalate, and polyethylene naphthalate; polyimide-based resins such as polyimide and polyamide imide; polyamide resins such as polyamide 6, polyamide 6,6, polyamide 12, and polyamide 11; fluorine resins such as polyvinylidene fluoride, polyvinyl fluoride, polytetrafluoroethylene, ethylene tetrafluoroethylene copolymer, and polychlorotrifluoroethylene; vinyl resins such as polyvinyl alcohol, polyvinyl ether, polyvinyl butyral, polyvinyl acetate, and polyvinyl chloride; epoxy resins; xylene resins; aramid resins; polyurethane-based resins; polyurea-based resins; melamine resins; phenol-based resins; polyether; acrylic-based resins; copolymers of any of those resins; and the like.

Furthermore, a conductive composition may be doped with an acceptor dopant or a donor dopant so that oxidation-reduction potential of a conjugated electron in a conjugated conductive high molecular compound may be changed in order to adjust conductivity of the conductive composition.

Examples of acceptor dopants that can be used include: halogen compounds; Lewis acids; proton acids; organic cyano compounds; organometallic compounds; and the like. Examples of halogen compounds include chlorine, bromine, iodine, iodine chloride, iodine bromide, iodine fluoride, and the like. Examples of Lewis acids include phosphorus pentafluoride, arsenic pentafluoride, antimony pentafluoride, boron trifluoride, boron trichloride, boron tribromide, and the like. Examples of proton acids include: inorganic acids such as hydrochloric acid, sulfuric acid, nitric acid, phosphoric acid, fluoroboric acid, hydrofluoric acid, and perchloric acid; and organic acids such as organic carboxylic acid and organic sulfonic acid. As an organic carboxylic acid and an organic sulfonic acid, the above-mentioned carboxylic acid compound and sulfonic acid compound can be used. Examples of organic cyano compounds are compounds that include two or more cyano groups in a conjugated bond. Examples include: tetracyanoethylene; tetracyanoethylene oxide; tetracyanobenzene; tetracyanoquinodimethane; tetracyanoazanaphthalene; and the like.

Examples of donor dopants include: alkali metals, alkaline earth metals, quaternary amine compounds, and the like.

Alternatively, a thin film which serves as a light transmitting electrode can be formed by a wet method using the conductive composition which is dissolved in water or an organic solvent (such as an alcohol-based solvent, a ketone-based solvent, an ester-based solvent, a hydrocarbon-based solvent, or an aromatic-based solvent).

There is no particular limitation on a solvent in which the conductive composition is dissolved. Any solvent that allows the above-mentioned conductive high molecular compounds and high molecular resin compounds such as organic resins to be dissolved therein may be used. For example, the conductive composition may be dissolved in a single or mixed solvent of water, methanol, ethanol, propylene carbonate, N-methylpyrrolidone, dimethylformamide, dimethylacetamide, cyclohexanone, acetone, methyl ethyl ketone, methyl isobutyl ketone, toluene, and the like.

The conductive composition is dissolved in a solvent as described above and then a film thereof is formed over the interlayer insulating film 2417 by a wet method such as an application method, a coating method, a droplet discharge method (also referred to as an inkjet method), or a printing method, whereby the pixel electrode 2406 can be obtained. The solvent may be dried through heat treatment or may be dried by decreasing pressure. Moreover, when an organic resin is a thermosetting resin, heat treatment may be performed, and when a photocurable resin, light irradiation treatment may be performed.

The partition layer 2418 can be formed in such a manner that an insulating layer is formed over the entire surface of the substrate by a CVD method, a sputtering method, an application method, or the like and then the insulating layer is selectively etched. Alternatively, the partition film 2418 can be formed selectively by a droplet discharge method, a printing method, or the like. Further alternatively, the partition layer 2418 can be formed into a desired shape in such a manner that an insulating layer is formed using a positive photosensitive resin over the entire surface and is then exposed to light and developed.

As the EL layer 2419, at least a light emitting layer is formed, and a hole injecting layer, a hole transporting layer, an electron transporting layer, or an electron injecting layer may be formed as appropriate in addition to the light emitting layer. The EL layer can be formed by an application method such as an inkjet method, or an evaporation method.

Next, the counter substrate 2421 is disposed to face the substrate 2400 (see FIG. 28B). A space between the counter substrate 2421 and the counter electrode 2420 may be provided with a resin layer 2422 or may be filled with an inert gas. Note that a protective layer may be formed to cover the counter electrode 2420.

Through the above-described steps, the EL display device of this embodiment mode is completed.

By manufacture of a display device which includes a transistor with the use of the semiconductor substrate of the present invention, a channel formation region can be formed with the single crystal semiconductor layer 112. Thus, variation of electric characteristics (such as a threshold voltage value) of transistors among pixels can be reduced as compared to a display device which includes a transistor whose channel formation region is formed of polycrystalline silicon. Therefore, display unevenness of the display device can be suppressed.

Note that there is no particular limitation on the structure of the transistor used in the display device of this embodiment mode. For example, any of the transistors having the structures described in Embodiment Modes 5 to 7 can be used.

This embodiment mode can be combined as appropriate with any of the other embodiment modes described in this specification.

Embodiment Mode 11

A wide variety of electronic devices can be manufactured using the semiconductor substrate 10. Examples of the electronic devices include: cameras such as video cameras and digital cameras; navigation systems; sound reproduction systems (a car audio system, audio components, and the like); computers; game machines; mobile information terminals (mobile computers, mobile phones, mobile game machines, electronic book readers, and the like); display devices that display image data, such as image reproduction devices provided with a recording medium (specifically, digital versatile disc (DVD)); and the like.

Figure 29A:
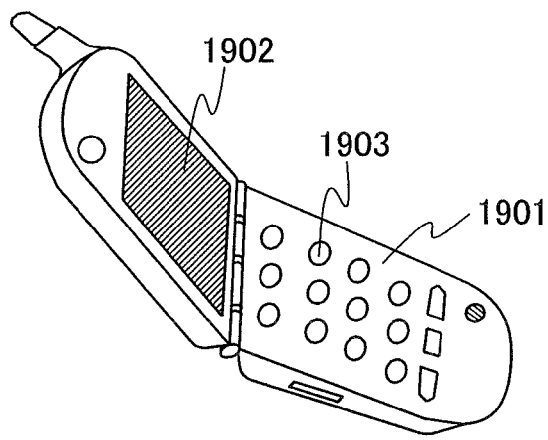
FIGS. 29A to 29C show external views of a mobile phone, a digital player, and an electronic book reader, respectively.

In this embodiment mode, specific modes of the electronic devices are described with reference to FIGS. 29A to 29C and FIGS. 30A to 30C. FIG. 29A shows an external view of an example of a mobile phone 1901. This mobile phone 1901 has a structure including a display portion 1902, an operation switch 1903, and the like. By applying the liquid crystal display device described with FIGS. 27A and 27B or the EL display device described with FIGS. 28A and 28B to the display portion 1902, the display portion 1902 can display high-quality images with little display unevenness.

Figure 29B:
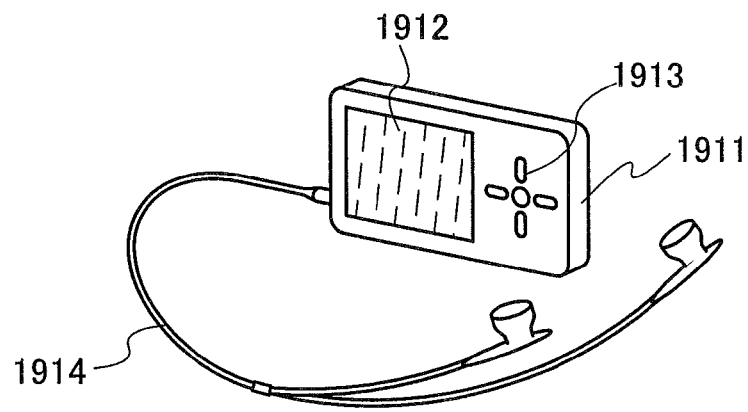

FIG. 29B shows an external view of an example of a structure of a digital player 1911. The digital player 1911 includes a display portion 1912, an operation portion 1913, an earpiece 1914, and the like. Instead of the earpiece 1914, headphones or a wireless earpiece can also be used. By applying the liquid crystal display device described with FIGS. 27A and 27B or the EL display device described with FIGS. 28A and 28B to the display portion 1912, even in the case where the screen size is about 0.3 inches to 2 inches, a high-definition image and a large amount of text information can be displayed.

Figure 29C:
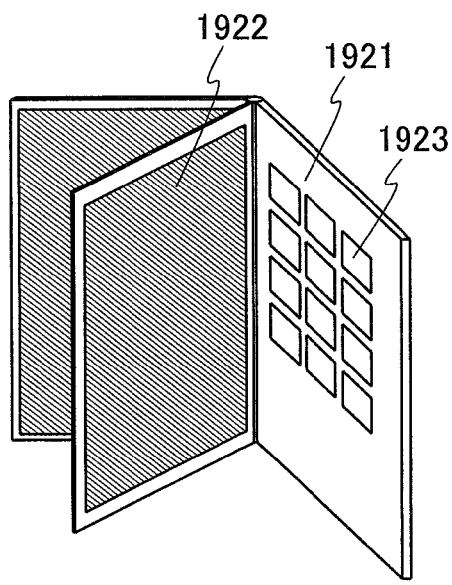

FIG. 29C shows an external view of an electronic book reader 1921. This electronic book reader 1921 includes a display portion 1922 and an operation switch 1923. A modem may be incorporated in the electronic book reader 1921, or the semiconductor device in FIG. 21 may be incorporated so that the electronic book reader 1921 has a structure by which information can be transmitted and received wirelessly. By applying the liquid crystal display device described with FIGS. 27A and 27B or the EL display device described in FIGS. 28A and 28B to the display portion 1922, high-quality images can be displayed.

Figures 30A, 30B, 30C:
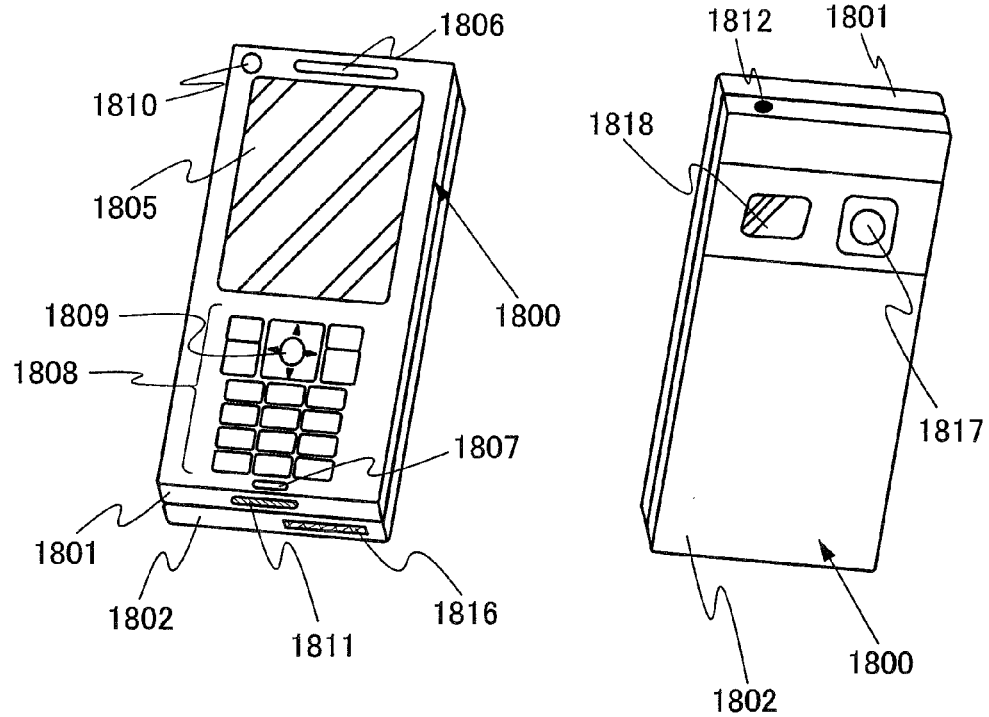
FIGS. 30A to 30C show a front view, a rear view, and a development view of a mobile phone, respectively.

FIGS. 30A to 30C show an example of a structure of the mobile phone 1800 to which the present invention is applied. FIG. 30A shows a front view; FIG. 30B, a rear view; and FIG. 30C, a development view. The mobile phone 1800 is a so-called smartphone that has both a function as a mobile phone and a function as a portable information terminal and incorporates a computer provided to conduct a variety of data processing besides voice calls. The mobile phone 1800 has a built-in camera, with which a still image and a moving image can be taken.

The mobile phone 1800 has two housings 1801 and 1802. The housing 1801 includes a display portion 1805, a speaker 1806, a microphone 1807, operation keys 1808, a pointing device 1809, a camera lens 1810, an external connection terminal 1811, an earphone terminal 1812, and the like. By applying the liquid crystal display device described with FIGS. 27A and 27B or the EL display device described in FIGS. 28A and 28B to the display portion 1922, high-quality images can be displayed.

The housing 1802 includes a keyboard 1815, an external memory slot 1816, a camera lens 1817, a light 1818, and the like. In addition, an antenna is incorporated in the housing 1801.

Further, in addition to the above structure, the mobile phone 1800 may incorporate a non-contact IC chip, a small size memory device, or the like.

The display portion 1805 changes the direction of display as appropriate depending on a use mode. Because the camera lens 1810 is provided in the same plane as the display portion 1805, the mobile phone can be used as a videophone. A still image and a moving image can be taken with the camera lens 1817 and the light 1818 by using the display portion 1805 as a viewfinder. The speaker 1806 and the microphone 1807 can be used for uses of video calls, recording, playback, and the like without being limited to voice calls. With use of the operation keys 1808, operation of incoming and outgoing calls, simple information input for electronic mail or the like, scrolling of a screen, cursor motion, and the like are possible. Further, the housings 1801 and 1802 which are put together to be lapped with each other (FIG. 30A) are developed by sliding as shown in FIG. 30C. In the developed state, the mobile phone 1800 can be used as a portable information terminal. In this state, smooth operation can be conducted by using the keyboard 1815 or the pointing device 1809. The external connection terminal 1811 can be connected to an AC adaptor and various types of cables such as a USB cable, and charging and data communication with a personal computer or the like are possible. Moreover, a storage medium can be inserted into the external memory slot 1816 so that a large amount of data can be stored and can be moved.

Further, in addition to the above-described functions, the mobile phone may also have an infrared communication function, a television reception function, or the like.

Embodiment 1

The present inventors have confirmed that the single crystal semiconductor layer 117 is melted by being irradiated with the laser beam 122. The present inventors have also confirmed that the crystallinity of the single crystal semiconductor layer can be recovered by irradiation with a laser beam to about the same degree as the single crystal semiconductor substrate before the process. Furthermore, the present inventors have confirmed that planarization of the surface of the single crystal semiconductor layer 117 can be possible.

In this embodiment, a method for manufacturing a semiconductor substrate including a glass substrate to which a single crystal semiconductor silicon layer is fixed is described.

Figure 31:
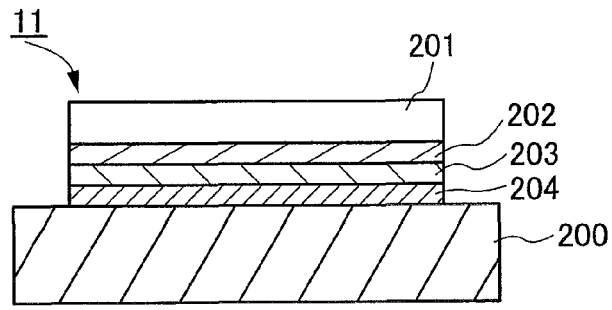
FIG. 31 shows a cross-sectional view of a semiconductor substrate.

First, a method for manufacturing a semiconductor substrate of this embodiment is described. FIG. 31 shows a cross-sectional view of a stacked layer structure of a semiconductor substrate 11 that is manufactured in this embodiment. The semiconductor substrate 11 is manufactured through the steps of FIGS. 4A to 4E. A single crystal silicon layer 201 is fixed to a glass substrate 200 with a buffer layer 111 that includes films 202 to 204 interposed therebetween.

To manufacture the semiconductor substrate 11, a single crystal silicon wafer is used as the single crystal semiconductor substrate 110. The single crystal silicon wafer is a square substrate having a size of 5 inches on each side. The conductivity type is a p type, and the resistivity is about 10 Ω·cm. In addition, the crystal orientation on its main surface is (100) and that on its side surface is <110>. The glass substrate 200 which is the supporting substrate 100 is a non-alkali glass substrate (product name: AN100) having a thickness of 0.7 mm.

As the first insulating layer 113, an insulating film having a two-layer structure including a silicon oxynitride film 202 with a thickness of 50 nm and a silicon nitride oxide film 203 with a thickness of 50 nm was formed by a PECVD method. A process gas for the silicon oxynitride film 202 was $SiH_4$ and $N_2O$, and the flow ratio was $SiH_4\backslash N_2O=4\backslash 800$. The substrate temperature in the film formation step was 400° C. A process gas for the silicon nitride oxide film 203 was $SiH_4$, $NH_3$, $N_2O$, and $H_2$, and the flow ratio was $SiH_4\backslash NH_3\backslash N_2O\backslash H_2=10\backslash 100\backslash 20\backslash 400$. The substrate temperature in the film formation step was 350° C.

In order to form a damaged region in the single crystal silicon wafer, hydrogen ions are added to the single crystal silicon wafer by using an ion doping apparatus. A 100% hydrogen gas was used as a source gas, and the single crystal silicon wafer was irradiated with ions in plasma that was generated by excitation of the hydrogen gas and accelerated by an electric field without any mass separation. Accordingly, the damaged region 115 was formed. This doping was performed under the following conditions: the power supply output was 100 W; the acceleration voltage, 40 kV; and the dose, $2.0 \times 10^{16}$ ions/cm$^2$ or $2.2 \times 10^{16}$ ions/cm$^2$.

In the ion doping apparatus, when the hydrogen gas is excited, three kinds of ion species, $H^+$, $H_2^+$, and $H_3^+$, are generated, and all of the ion species are accelerated, with which the single crystal silicon wafer is irradiated. About 80% of the ion species that were generated from the hydrogen gas was $H_3^+$. Under these doping conditions, a single crystal silicon layer having a thickness of about 100 nm to 120 nm is separated from the single crystal silicon wafer.

After the glass substrate 200 and the single crystal silicon wafer provided with the films 202 to 204 were subjected to ultrasonic cleaning in pure water and were then cleaned with ozone-containing pure water, a bonding step was performed. In order to cause cleavage in the damaged region 115, heating was performed to 600° C. in a diffusion furnace. Accordingly, the single crystal silicon wafer was cleaved and the single crystal silicon layer 201 was separated from the single crystal silicon wafer.

After the damaged region 115 was formed, the silicon oxide film 204 was formed as the second insulating layer 114 over the single crystal silicon wafer by a PECVD method. A process gas for formation of the silicon oxide film 204 was TEOS and $O_2$, and the flow ratio was TEOS\$O_2$=15\750. The substrate temperature in the film formation step was 300° C.

The thickness of the buffer layer of the semiconductor substrate 11 is as follows.
Silicon oxynitride film 202: 50 nm
Silicon nitride oxide film 203: 50 nm
Silicon oxide film 204: 50 nm After the glass substrate 200 and the single crystal silicon wafer provided with the films 202 to 204 were subjected to ultrasonic cleaning in pure water and were then cleaned with ozone-containing pure water, the surface of the glass substrate 200 and the silicon oxide film 204 formed over the surface of the single crystal silicon wafer were disposed in contact with each other and bonded to each other (see FIG. 4D). Next, in order to cause cleavage along the damaged region 115, heat treatment was at 200° C. for 2 hours in a heating furnace to increase bonding strength between the glass substrate 200 and the silicon oxide film 204. Heating was successively performed at 600° C. for 4 hours in the heating furnace. Accordingly, the single crystal silicon wafer was cleaved, and the single crystal silicon layer 201 was separated from the single crystal silicon wafer.

Next, after the glass substrate 200 to which the single crystal silicon layer 201 was fixed was cleaned with pure water in order to perform a laser irradiation process, the single crystal silicon layer 201 was treated with a 100-fold diluted hydrofluoric acid to remove a natural oxide film that was formed on the surface. Then, the single crystal silicon layer 201 was irradiated with a laser beam. As a laser, a XeCl excimer laser which emits a beam at a wavelength of 308 nm was used. The pulse width of the laser beam is 25 nsec and the repetition rate is 30 Hz.

Through an optical system, the laser beam was collected such that it has a linear beam shape on an irradiation surface, and scanning with the laser beam was performed in a width direction (a short-axis direction of the beam shape). The semiconductor substrate 11 was disposed on a stage of a laser irradiation apparatus and scanned with a beam by moving the stage. For example, the beam width was 350 µm, and the scanning rate was 1.0 mm/sec.

In the laser irradiation step, the single crystal silicon layer 201 was heated. This heating was performed by heating the stage of the laser irradiation apparatus with a heater which was provided in the stage. Stage temperatures were 250° C. and 500° C. In addition, the laser irradiation process is also performed without heating with the stage. Note that, when the stage temperature is 250° C., the temperature of the single crystal silicon layer 201 is increased to 230° C., and when 500° C., the temperature of the single crystal silicon layer 201 is increased to 420° C. In addition, the stage temperature and the temperature of the single crystal silicon layer 201 when heating with the stage is not performed are each referred to as room temperature.

Embodiment 2

In this embodiment, it is described that a single crystal semiconductor layer which is fixed to a supporting substrate is melted by being irradiated with a laser beam.

The single crystal silicon layer 201 of the semiconductor substrate 11 was irradiated with a laser beam, and melting time of the single crystal silicon layer 201 was measured by a spectroscopic method. Specifically, a region irradiated with a laser beam in the single crystal silicon layer 201 is irradiated with probe light, and change in intensity of reflected light thereof is measured. It can be determined from the intensity of reflected light whether the single crystal silicon layer 201 is in a solid phase state or in a liquid phase state. When silicon changes from a solid phase state into a liquid phase state, the refractive index thereof is drastically increased and the reflectance thereof for visible light is drastically increased. Thus, a laser beam having a wavelength of a visible light range is used as probe light, and a change in intensity of reflected light of the probe light is measured. Accordingly, a phase change of the single crystal silicon layer from a solid phase to a liquid phase and a phase change from a liquid phase to a solid phase can be detected.

Figure 32:
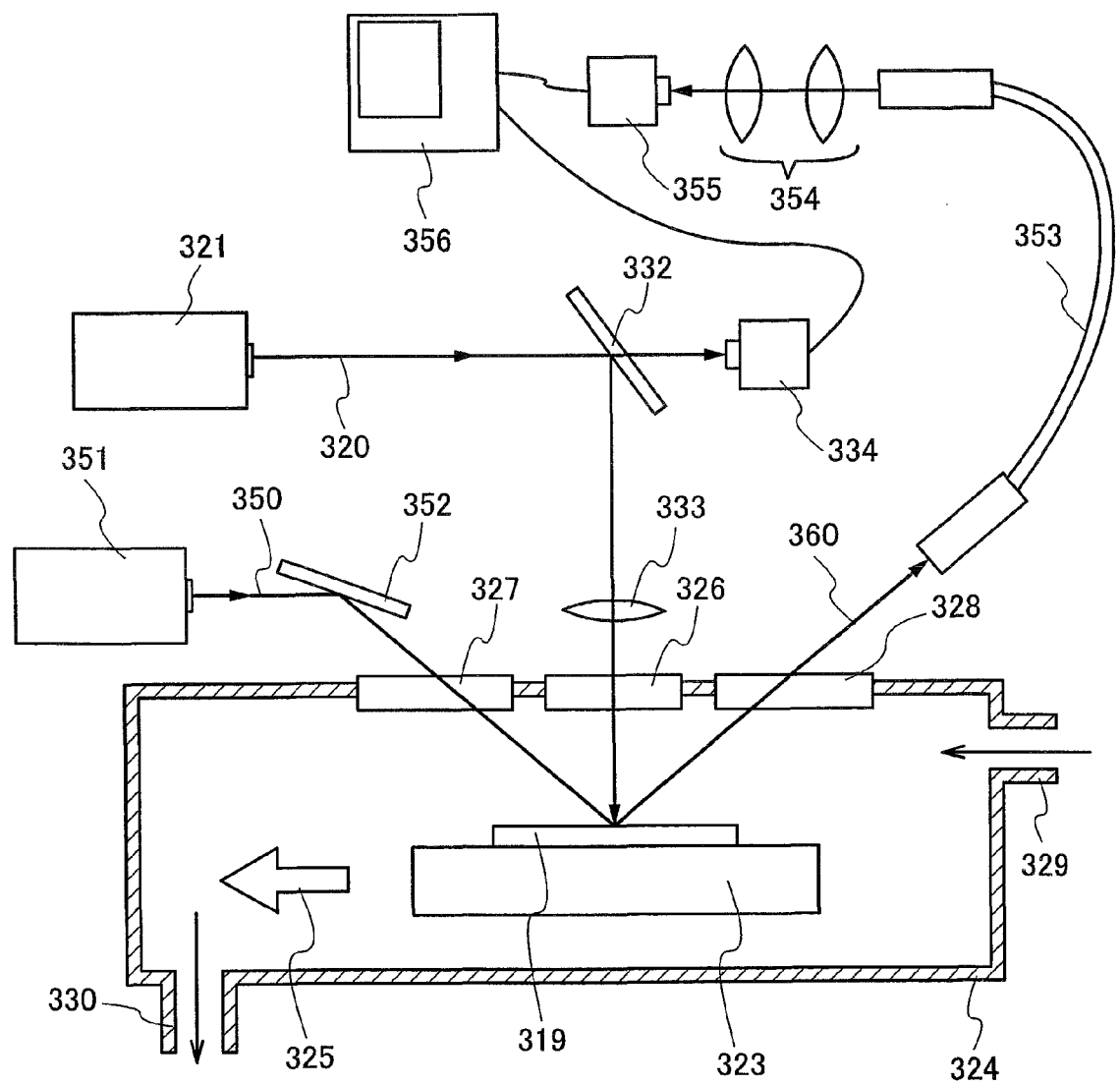
FIG. 32 is a diagram illustrating a structure of a laser irradiation apparatus used to measure intensity variation of reflected probe light.

First, a structure of a laser irradiation apparatus used for measurement is described with reference to FIG. 32. FIG. 32 is a drawing for explanation of the structure of the laser irradiation apparatus used for the measurement. The laser irradiation apparatus includes a laser 321 that emits a laser beam 320 used for a laser irradiation process of a semiconductor substrate 319, a laser 351 that emits probe light 350, and a chamber 324 provided with a stage 323 where the semiconductor substrate 319 is disposed.

The stage 323 is provided so that the stage 323 can move inside the chamber 324. An arrow 325 is an arrow that shows a direction of movement of the stage 323. The stage 323 is provided with a heater. By heating the stage, the semiconductor substrate 319 that is disposed over the stage is heated.

Windows 326 to 328 formed of quartz are provided in the wall of the chamber 324. The window 326 is a window through which the laser beam 320 is guided into the chamber 324. The window 327 is a window through which the probe light 350 is guided into the chamber 324, and the window 328 is a window through which the probe light 350 reflected by the semiconductor substrate 319 is guided to the outside of the chamber 324. In FIG. 32, the probe light 350 that is reflected by the semiconductor substrate 319 is denoted by a reference numeral 360.

In order to control an atmosphere inside the chamber 324, the chamber 324 is provided with a gas supply port 329 connected to a gas supply device and a gas exhaust port 330 coupled with an exhaust system.

The laser beam 320 which is emitted from the laser 321 is reflected by a half mirror 332 and is converged into a linear shape by an optical system 333 including a lens and the like. The laser beam 320 exiting from the optical system 333 passes through the window 326 and is delivered to the semiconductor substrate 319 over the stage 323. A photodetector 334 is arranged on a transmission side of the half mirror 332. A change in intensity of the laser beam 320 emitted from the laser 321 is detected by the photodetector 334.

The probe light 350 emitted from the laser 351 is reflected by a mirror 352 and is delivered to the semiconductor substrate 319 through the window 327. A region irradiated with the laser beam 320 is irradiated with the probe light 350. The probe light 360 reflected by the semiconductor substrate 319 passes through the window 328 and an optical fiber 353 and is converted into a collimated beam by a collimator 354 including a collimator lens, and then enters a photodetector 355. A change in intensity of the probe light 360 is detected by the photodetector 355. In other words, the intensity of the probe light 360 reflected by the region irradiated with the laser beam 320 in the single crystal silicon layer 201 can be detected; thus, a change over time in reflectance of the region irradiated with the laser beam 320 for the probe light 350 can be detected.

The outputs of the photodetectors 334 and 355 are connected to an oscilloscope 356. The voltage value (intensity of signal) of an output signal of the photodetector 334 input to the oscilloscope 356 corresponds to the intensity of the laser beam 320, and the voltage value (intensity of signal) of an output signal of the photodetector 355 input to the oscilloscope 356 corresponds to the intensity of the probe light 360.

Figure 33A:
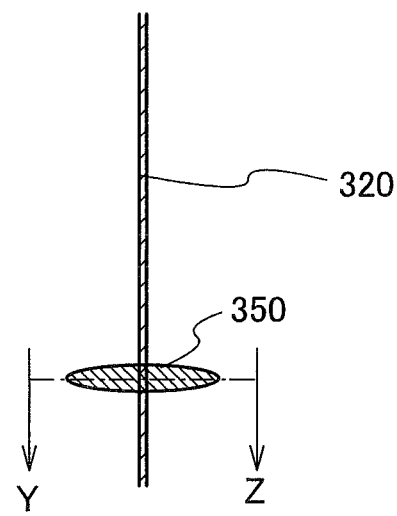
FIG. 33A shows a plan view illustrating relationship between a laser beam irradiation region and a probe light irradiation region and FIG. 33B shows a cross-sectional view of FIG. 33A taken along a section line Y-Z and illustrates a beam profile of probe light.
Figure 33B:
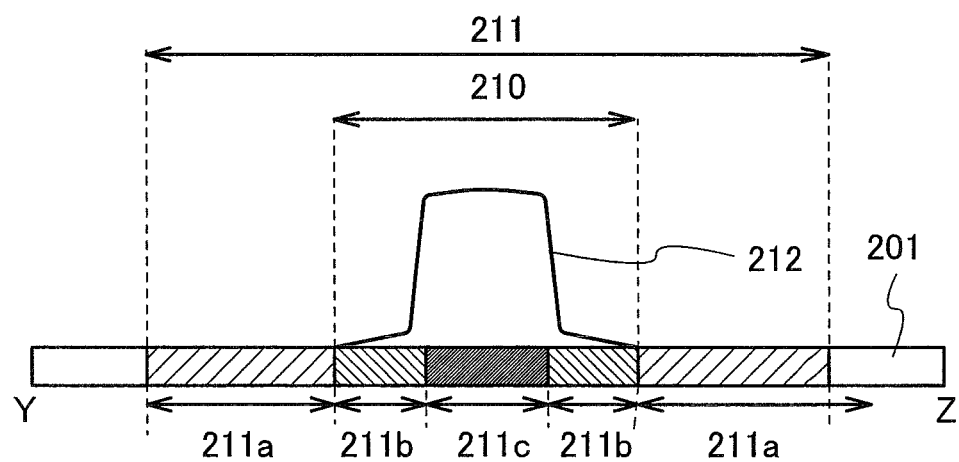

FIG. 33A shows a plan view illustrating the relationship between a region irradiated with the laser beam 320 and a region irradiated with the probe light 350 on the surface of the single crystal silicon layer 201. FIG. 33B shows a cross-sectional view taken along a line Y-Z of FIG. 33A.

In FIG. 33B, reference numeral 210 denotes an area irradiated with the laser beam 320, which is an irradiated area in a width direction (a short-axis direction) of the laser beam 320. Hereinafter, this area is referred to as a laser beam irradiated area 210. Reference numeral 211 denotes an area irradiated with the probe light 350. Hereinafter, this area is referred to as a probe light irradiated area 211. Reference numeral 212 denotes a beam profile of the laser beam 320 along the width direction (the short-axis direction). Hereinafter, this profile is referred to as a beam profile 212.

FIGS. 34A and 34B are photographs of signal waveforms of the oscilloscope 356, which show measurement results. In FIGS. 34A and 34B, the lower signal waveform is an output signal waveform of the photodetector 334 and shows the change in intensity of the laser beam 320. FIG. 34A shows a waveform when the stage temperature is 500° C., and FIG. 34B shows a waveform when the stage temperature is room temperature.

In FIGS. 34A and 34B, the upper signal waveform is an output signal waveform of the photodetector 355 and shows the change in intensity of the probe light 360 reflected by the single crystal silicon layer. The vertical axis represents signal intensity, and the horizontal axis represents time and each interval between marks on the horizontal axis is 100 nanoseconds.

In this embodiment, in order to confirm the effect produced by the laser irradiation process, the single crystal silicon layer 201 was measured for the data of FIGS. 34A and 34B before the laser irradiation process and had a thickness of 100 nm.

The laser 321 used for the measurement is a XeCl excimer laser which emits a beam at a wavelength of 308 nm. The pulse width is 25 nsec, and the repetition rate is 30 Hz. The laser beam 320 is collected through the optical system 333 such that it has a linear beam shape of 350 μm in width and 126 mm in length on the irradiation surface.

Either when the stage temperature is room temperature or when 500° C., the energy density of the laser beam 320 is 539 mJ/cm$^2$, and the single crystal silicon layer 201 is irradiated with one shot of the laser beam 320. Note that in FIGS. 34A and 34B, two peaks can be observed in the detected output signal which corresponds to the laser beam 320. This is due to the specification of the laser 321 used for the measurement.

As the laser 351 for emitting the probe light, a Nd:YVO$_4$ laser was used, and a beam of 532 nm which is a second harmonic of the laser was used as the probe light 350.

In addition, a nitrogen gas is supplied from the gas supply port 329 to change the atmosphere of the chamber 324 into a nitrogen atmosphere.

As shown in FIGS. 34A and 34B, when irradiation with the laser beam 320 is performed, the intensity of the probe light 360 rises and rapidly increases. In other words, it can be observed that the single crystal silicon layer 201 is melted by being irradiated with the laser beam 320. The intensity of the probe light 360 rises until the depth of the melted region of the single crystal silicon layer 201 is maximized, and a high intensity state is kept for a while. When the intensity of the laser beam 320 decreases, the intensity of the probe light 360 starts decreasing drastically some time later.

In other words, changes in signal intensity corresponding to the intensity of reflection of the probe light 360 in FIGS. 34A and 34B show the following: By irradiation of the single crystal silicon layer 201 with the laser beam 320, the temperature of a region irradiated with the laser beam 320 is increased to its melting point or higher, and the region is melted. In addition, this region is kept in a melted state (a liquid phase state) for a while after the irradiation with the laser beam 320, and the temperature of this region is decreased with time and this region starts solidifying and returns to its solid state completely.

The change in intensity of the probe light 360 and the change in phase of the single crystal silicon layer are described with reference to FIG. 35. FIG. 35 is a graph which schematically shows the output signal waveform of the photodetector 355 that is shown by the photographs of FIGS. 34A and 34B. The vertical axis represents signal intensity; the horizontal axis, time.

The signal intensity rapidly increases at time t1, and it can be considered that at the time t1, the single crystal silicon layer 201 starts melting. The period from time t2 to time t3 is a period in which a melted state is kept because the signal intensity is kept high. In addition, the period from the time t1 to the time t2 is a period in which the depth of the melted portion of the single crystal silicon layer is increased and can be regarded as a melting period.

After the time t3, the signal intensity rapidly decreases, and at and after time t4, the signal intensity is low. Thus, it can be considered that the melted region is solidified completely and is in a solid phase state at and after the time t4. Note that signal intensity $I_b$ at and after the time t4 is higher than signal intensity $I_a$ at and before the time t1, which means that the temperature at and after the time t4 is higher than that before irradiation with the laser beam 320 is performed. Therefore, it can be considered that recovery of crystal defects such as dislocation proceeds even after the time t4 in the region irradiated with the laser beam 1320 as the region is cooled gradually.

As a result of comparing the signal waveforms of FIGS. 34A and 34B, it can be seen that melting time in which the melting state is kept can be lengthened by heating. When the stage temperature is 500° C., the melting time is approximately 250 nanoseconds; when room temperature, approximately 100 nanoseconds.

As described above, by detection of a change in intensity of reflected light at a laser beam irradiation portion, it is confirmed that a single crystal semiconductor layer which is fixed to a supporting substrate is melted by a laser irradiation process.

Note that, although the signal intensity is kept high in the period from the time t2 to the time t3, it appears that the signal waveforms of FIGS. 34A and 34B each attenuate in two stages in this period. The cause is not clear; however, it can be considered that one possible cause is that the probe light 360 reflected by a plurality of regions which undergoes different phase changes is detected because a wider area than the area irradiated with the laser beam 320 is irradiated with the probe light 350 as shown in FIG. 33A. This is described below with reference to FIG. 33B.

As shown in FIG. 33B, the probe light irradiated area 211 includes three regions which are irradiated with the laser beam 320 having different amounts of energy.

First is a region which is outside the laser beam irradiated area 210 and is not irradiated with the laser beam. This region is hereinafter referred to as a region 211a. Second is a region which is inside the laser beam irradiated area 210 and is irradiated with a part of the laser beam 320 in a tail portion of the beam profile 212. This region is hereinafter referred to as a region 211b. Third is a region which is irradiated with a part of the laser beam 320 in a top flat portion of the beam profile 212. This region is hereinafter referred to as a region 211c. Accordingly, the photodetector 355 receives the probe light 360 where rays reflected by the region 211a, the region 211b, and the region 211c overlap with each other.

It can be thought that the region 211a does not undergo a phase change and change its reflectance for the probe light 350 because it is not irradiated with the laser beam 320. Therefore, the region 211a serves as a background of a detection signal of the photodetector 355; thus, the region 211a has little effect on the change in intensity of the detection signal.

On the other hand, the region 211b is irradiated with a part of the laser beam 320 having a lower energy density than the region 211c and has uneven distribution of energy density. Accordingly, it can be thought that an increase in temperature of the region 211b is smaller than that of the region 211c and the melting time of the region 211b is shorter than that of the region 211c. That is, the timing at which the region 211b that is melted starts solidifying is prior to the timing at which the region 211c starts solidifying.

From the above description, it can be supposed that reflectance for the probe light 350 decreases in the period when the region 211c is in a liquid phase state (the period from the time t2 to t3 in FIG. 35) because the region 211b starts solidifying in this period and this decrease in reflectance is detected as the change in intensity of the detection signal of the photodetector 355.

Embodiment 3

In Embodiment 2, it is described that the single crystal silicon layer 201 is melted by a laser irradiation process. In this embodiment, it is described that a melted single crystal semiconductor layer undergoes re-single-crystallization.

In this embodiment, electron backscatter diffraction patterns (EBSP) of surfaces of the single crystal silicon layer 201 which was not subjected to a laser irradiation process and the single crystal silicon layer 201 which was subjected to a laser irradiation process were measured. FIGS. 36A to 36D are inverse pole figure (IPF) maps obtained from the measurement data.

Figure 36A:
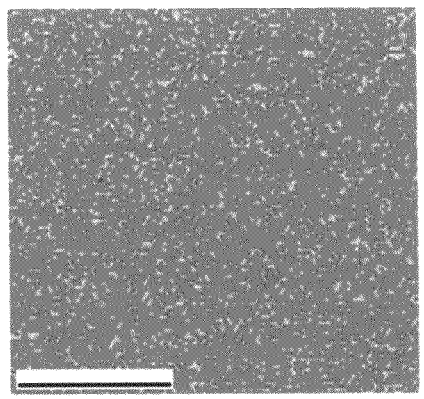
FIGS. 36A to 36D are IPF maps of single crystal silicon layers which are obtained from EBSP and FIG. 36E is a color-coded map showing relationship between coloring of IPF maps and crystal orientation.
Figure 36B:
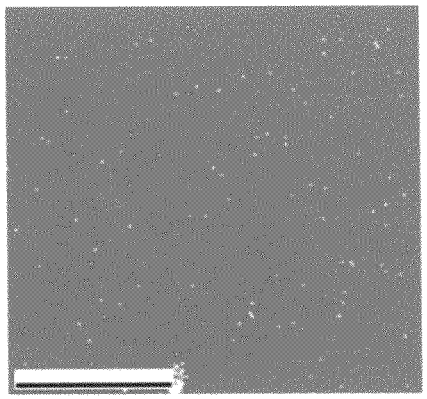
Figure 36C:
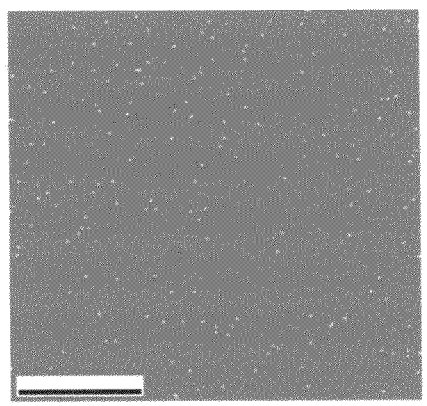
Figure 36D:
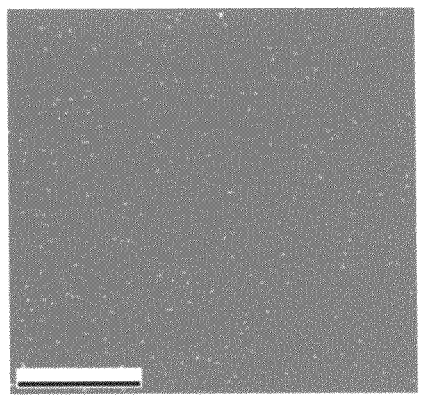

FIG. 36A shows data of a single crystal silicon layer before a laser irradiation process. FIGS. 36B and 36C each show data of a single crystal silicon layer after a laser irradiation process, which are data of single crystal silicon layers 201 after being irradiated with a laser beam in a nitrogen atmosphere while being heated at stage temperatures of 500° C. and 250° C., respectively. FIG. 36D shows data of the single crystal silicon layer 201 after being irradiated with a laser beam in a nitrogen atmosphere at room temperature without being heated.

Figure 36E:
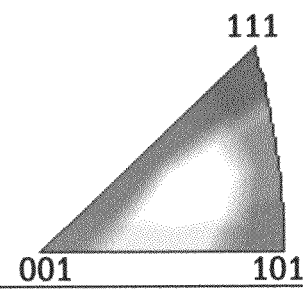

FIG. 36E is a color code map showing the relationship between colors of the IPF maps and crystal orientation, in which the orientation of each crystal plane is color-coded.

According to the IPF maps of FIGS. 36A to 36D, crystal orientation of the single crystal silicon layer 201 is not disordered either before or after laser beam irradiation, and the plane orientation of the surface of the single crystal silicon layer 201 is (100) which is the same as the plane orientation of the single crystal silicon wafer. In addition, it can be seen that there are no crystal grain boundaries in the single crystal silicon layer 201 either before or after laser beam irradiation. This can be confirmed based on the fact that the IPF maps of FIG. 36A to 36D are monochromatic square images of a color (red in the color images) representing the (100) plane in the color code map of FIG. 36E.

Therefore, it is confirmed by EBSP measurement that a single crystal silicon layer whose main surface is oriented along the (100) plane is formed from a single crystal silicon wafer whose main surface is oriented along the (100) plane, and a single crystal silicon layer which is obtained by melting the above single crystal silicon layer through laser beam irradiation also has a main surface which is oriented along the (100) plane.

Note that dots that are present in the IPF maps of FIGS. 36A to 36D show portions having a low CI value. The CI value is an index value showing reliability and accuracy of data with which crystal orientation is determined. The CI value is decreased in the presence of crystal grain boundaries, crystal defects, and the like. In other words, as the number of portions having a low CI value becomes smaller, a crystal structure can be evaluated as having higher perfection and crystallinity can be evaluated as being higher. The number of portions having a low CI value is smaller in the IPF maps of the single crystal silicon layer 201 which has been irradiated with a laser beam than in the IPF map of the single crystal silicon layer 201 which is not irradiated with a laser beam. Therefore, it can be seen from the EBSP measurement that crystal defects and microdefects such as dangling bonds in the single crystal silicon layer 201 are recovered by laser beam irradiation.

Note that conditions for the laser irradiation process of the single crystal silicon layer 201 of FIGS. 36B to 36D are as follow: The laser beam has a linear beam shape of 350 μm in width and 126 mm in length on the irradiation surface, and the scanning rate of the laser beam is 1.0 mm/sec. The number of shots of the laser beam with which the same region of the single crystal silicon layer 201 is irradiated is 10.5 by calculation from the beam width and the scanning rate. The energy density of the laser beam is 513 mJ/cm$^2$ when the stage temperature is 500° C.; 567 mJ/cm$^2$, when 250° C.; and 648 mJ/cm$^2$, when room temperature.

In this embodiment, cross sections of the semiconductor substrate 11 before the laser irradiation process and the semiconductor substrate 11 after the laser irradiation process were observed with a scanning transmission electron microscope (STEM).

Figure 37A:
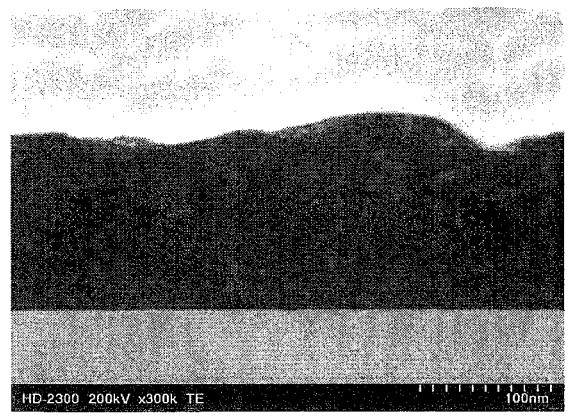
FIGS. 37A to 37C are STEM images of cross sections of semiconductor substrates, which are obtained with a scanning transmission electron microscope.
Figure 37B:
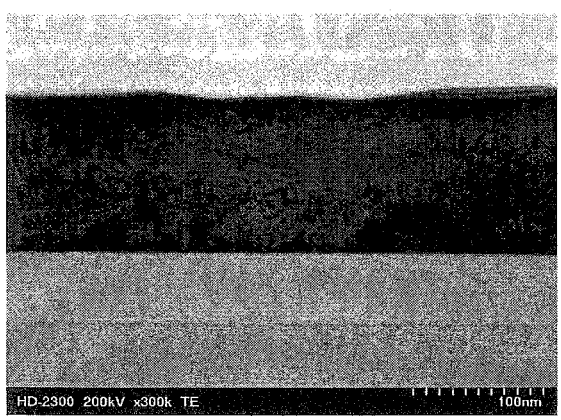
Figure 37C:
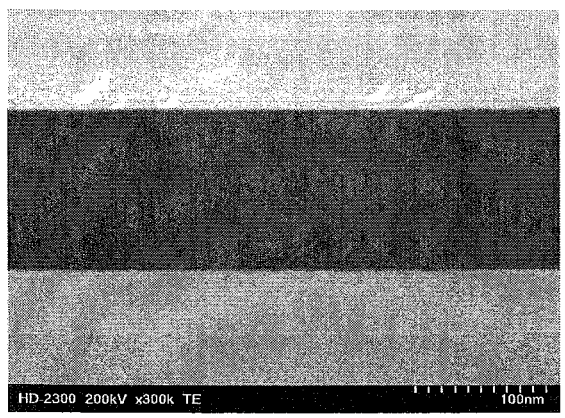

FIGS. 37A to 37C are cross-sectional photographs of each semiconductor substrate 11, which are STEM images photographed with a scanning transmission electron microscope (STEM). FIG. 37A shows an image before the laser irradiation process, and FIGS. 37B and 37C show images after the laser irradiation process. FIG. 37B shows an image when the stage temperature during the laser process is 500° C., and FIG. 37C is an image when it is room temperature. In each of FIGS. 37A to 37C, the thickness of the single crystal silicon layer 201 is 120 nm.

Conditions for the laser irradiation process are as follows: The laser beam is collected through an optical system such that it has a linear beam shape of 350 μm in width and 126 mm in length on an irradiation surface. The scanning rate of the laser beam is 1.0 mm/sec. The energy density of the laser beam is 513 mJ/cm$^2$ when the stage temperature is 500° C.; 567 mJ/cm$^2$, when 250° C.; and 647 mj/cm$^2$, when room temperature.

Laser irradiation is performed in a nitrogen atmosphere. In the cases where the stage temperatures are 500° C. and 250° C., a nitrogen atmosphere is realized by supply of a nitrogen gas into a chamber of a laser irradiation apparatus. In the case of room temperature, the laser irradiation process is performed in the atmosphere, and a nitrogen atmosphere is realized by blowing of nitrogen to a region irradiated with a laser beam.

As shown in FIG. 37A, no grain boundaries are observed in the single crystal silicon layer 201 before the laser beam irradiation. In addition, as shown in FIGS. 37B and 37C, there are also no grain boundaries in the single crystal silicon layer 201 after the laser beam irradiation. Accordingly, it can be confirmed that a portion melted by a laser beam through the laser irradiation process is solidified into a single crystal structure.

As described above, by the measurement of the electron backscatter diffraction patterns and the observation of the cross-sectional structures with a scanning transmission electron microscope, it is confirmed that a single crystal silicon layer melted by a laser irradiation process undergoes re-single-crystallization.

Embodiment 4

In Embodiment 2, it is described that the single crystal silicon layer 201 is melted by a laser irradiation process. In this embodiment, it is described that crystallinity of a melted single crystal silicon layer is improved. In this embodiment, Raman spectroscopy was conducted to evaluate crystallinity of a single crystal silicon layer after a laser irradiation process.

Figure 38:
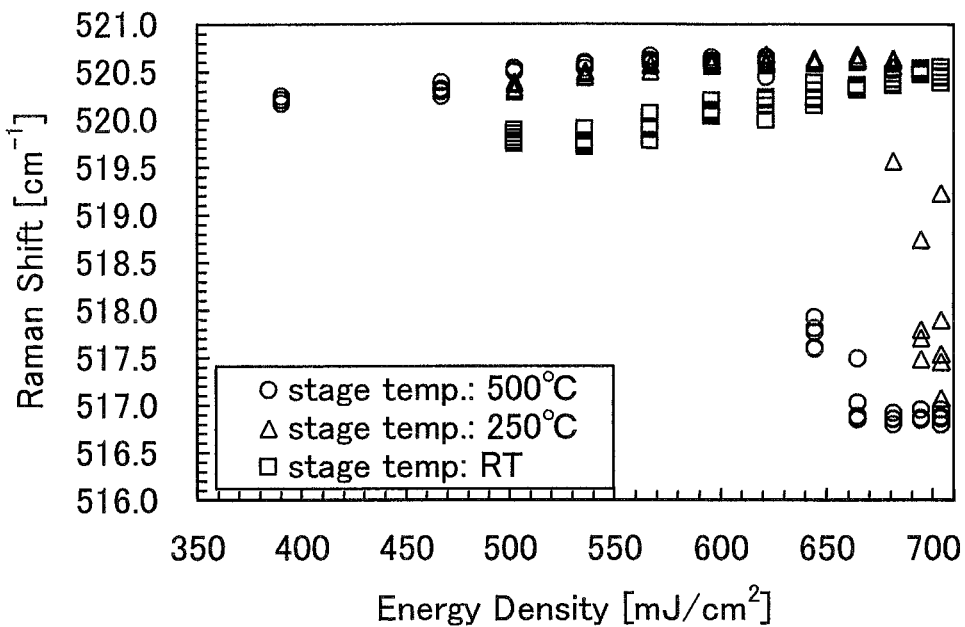
FIG. 38 is a graph showing a change in peak wavenumber of a Raman shift of a single crystal silicon layer with respect to energy density of a laser beam.
Figure 39:
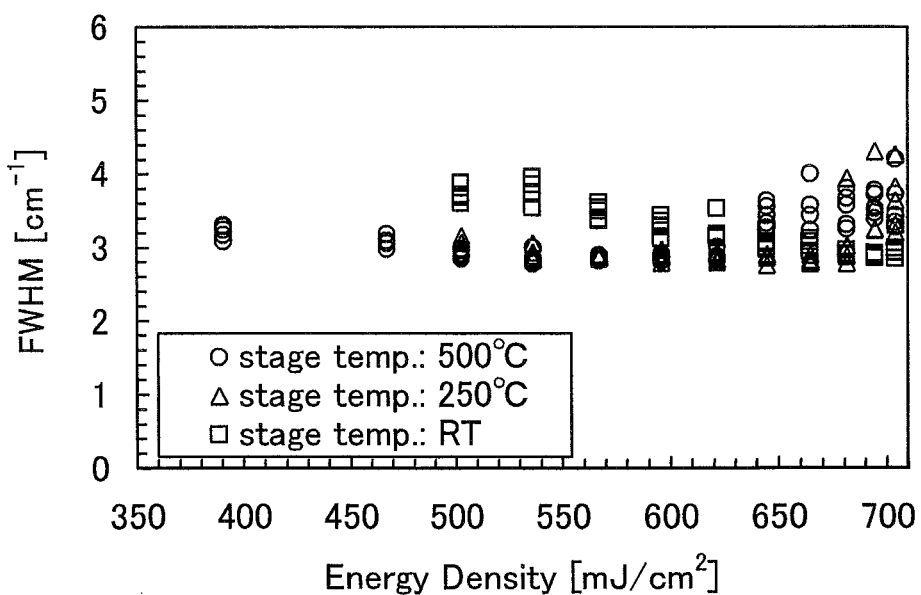
FIG. 39 is a graph showing a full width at half maximum of a Raman spectrum of a single crystal silicon layer with respect to energy density of a laser beam.

FIG. 38 is a graph showing change in Raman shift of a laser beam with respect to energy density. FIG. 39 is a graph showing change in full width at half maximum (FWHM) of a Raman spectrum with respect to energy density of a laser beam. Data obtained when the stage temperatures during a laser irradiation process are 500° C., 250° C., and room temperature are shown. The laser irradiation process is performed such that the scanning rate of a beam is 1.0 mm/sec and the same region is irradiated with 10 beam shots. The overlap percentage is about 90%. Conditions are as follows. Note that the thickness of the single crystal silicon layer 201 is 100 nm.

The peak wavenumber (also referred to as a peak value) of Raman shift shown in FIG. 38 is a value determined by the mode of vibration occurring in a crystal lattice and is a specific value depending on the kind of crystal. The Raman shift of single crystal silicon without any internal stress is 520.6 cm$^{-1}$. If the Raman shift is closer to this wavenumber, it can be determined that a crystal structure is closer to that of a single crystal and crystallinity is higher. Note that when compressive stress is applied to single crystal, the distance between lattices is shortened; therefore, the peak wavenumber is shifted to a higher wavenumber side in proportion to the amount of compressive stress. Meanwhile, when tensile stress is applied, the peak wavenumber is shifted to a lower wavenumber side in proportion to the amount of tensile stress.

Therefore, it is not adequate to determine whether or not a silicon layer is a single crystal simply by the fact that the peak wavenumber of Raman shift is 520.6 cm$^{-1}$. The single crystal means a crystal in which, when a certain crystal axis is focused, the crystal axes are oriented in the same direction in any portion of a sample and which has no crystal grain boundary between crystals. Therefore, measurement of crystal axis orientation and presence of a crystal grain boundary is needed to determine whether it has a single crystal structure. However, identification of crystal orientation and detection of a crystal grain boundary cannot be performed by Raman spectroscopy. For example, an electron backscattering diffraction method can be employed for identification of crystal orientation and detection of a crystal grain boundary. By obtaining IPF maps from EBSP as shown in FIG. 36A to 36D, it can be confirmed that crystal axes (crystal orientation) are uniform and there are no crystal grain boundaries.

A smaller FWHM shown in FIG. 39 indicates that a crystal state is more uniform with less variation. The FWHM of a commercially available single crystal silicon wafer is approximately 2.5 cm$^{-1}$ to 3.0 cm$^{-1}$, which can be used as an indictor of crystallinity. The closer a FWHM is to this value, the more uniform the crystallinity is like that of a single crystal silicon wafer.

It can be seen from the results of measurement by Raman spectroscopy in FIGS. 38 and 39 that crystallinity can be recovered by a laser irradiation process to the same or substantially the same degree as a single crystal silicon wafer before processing.

It can also be seen from the data in FIGS. 38 and 39 that the energy density of a laser beam needed to recover the crystallinity of the single crystal semiconductor layer 117 can be decreased when the single crystal semiconductor layer 117 is irradiated with the laser beam 122 while being heated. In other words, irradiation energy density necessary for the wavenumber of Raman shift to be about 520.6 cm$^{-1}$ and for the FWHM to be about 2.5 cm$^{-1}$ to 3.0 cm$^{-1}$ can be decreased when the single crystal silicon layer 201 is irradiated with a laser beam while being heated.

By a decrease of irradiation energy density, the beam shape of a laser beam can be enlarged. Accordingly, the width of a laser beam (the length in a scanning direction or the length in a short-axis direction) can be increased, and the scanning rate of a laser beam can thus be increased. In addition, the overlap percentage of a laser beam can be decreased, and the scanning rate of a laser beam can thus be increased. Accordingly, the scanning rate can be increased, and the cycle time needed for a laser irradiation process can thus be shortened. Thus, throughput of a laser irradiation process is increased by a laser process of a single crystal silicon layer while the single crystal silicon layer is heated. When scanning with a laser beam is performed, a region irradiated with a laser beam is moved. The term "overlap percentage" refers to the percentage of overlap of regions irradiated with a laser beam.

One reason why the energy density of a laser beam needed to recover crystallinity of a single crystal semiconductor layer is reduced by heating of the single crystal silicon layer is because the melting time of the single crystal silicon layer is increased by heating as shown by the measurement results in FIGS. 34A and 34B. Another reason is that it takes longer for the single crystal silicon layer having a melted portion (a liquid phase portion) to be cooled and return to a solid phase state completely.

Accordingly, it is preferable that the single crystal silicon layer be heated so that the melting time ranges from 200 nanoseconds to 1000 nanoseconds. Therefore, it is preferable that the single crystal silicon layer be heated at a temperature in the range of from 400° C. to the strain point of a supporting substrate. Note that when a melted state is kept for a period longer than 1000 nanoseconds, the temperature of the supporting substrate 100 may be increased to its strain point or higher and the supporting substrate 100 may be melted. Accordingly, it is preferable that the melting time be 1000 nanoseconds or shorter.

In order to recover the crystallinity of a single crystal semiconductor layer which has been separated from a single crystal semiconductor substrate, it is important to melt a single crystal silicon layer.

As a result of observing the intensity of reflection of the probe light 360 with the use of the laser irradiation apparatus of FIG. 32 in a similar manner to Embodiment 2 under conditions where the stage temperature is room temperature and the energy density of the laser beam is 498 mJ/cm$^2$, no drastic increase is seen in the intensity of reflection of the probe light 360. That is, it can be considered that the single crystal silicon layer is not melted by the laser irradiation process at room temperature with 498 mJ/cm². On the other hand, from the data of Raman spectroscopy in FIGS. 38 and 39, it can be considered that the crystallinity of the single crystal silicon layer 201 is not recovered by the laser irradiation process under conditions at room temperature with 498 mJ/cm².

From the above description, it is important to melt a single crystal silicon layer by a laser irradiation process in order to recover the crystallinity of the single crystal silicon layer. It is also important to melt a single crystal silicon layer by a laser irradiation process in order to increase planarity.

Embodiment 5

In Embodiment 2, it is described that the single crystal silicon layer 201 is melted by a laser irradiation process. In this embodiment, it is described that the surface of a melted single crystal silicon layer is planarized.

In this embodiment, surface planarity was evaluated with measured values that represent surface roughness and that are obtained by analysis of images observed with an atomic force microscope (AFM) in a dynamic force mode (DFM) (such images are hereinafter referred to as AFM images). FIG. 40 shows results of measurement with AFM. FIG. 40 shows images of the surface of the single crystal silicon layer 201 observed with an atomic force microscope (such images are hereinafter referred to as "AFM images") and surface roughnesses of the single crystal silicon layer calculated based on the AFM images. As surface roughnesses, average surface roughness $R_a$, root-mean-square surface roughness RMS, and maximum peak-to-valley height (P-V) were calculated. These values were calculated by surface roughness analysis of the AFM images with software that was supplied with the AFM.

The conditions for measurement by AFM are as follows.
Atomic force microscope (AFM): a scanning probe microscope SPI3800N/SPA500 manufactured by Seiko Instruments Inc.
Measurement mode: dynamic force mode (DFM)
Cantilever: SI-DF40 (made of silicon, a spring constant of 42N/m, a resonant frequency of 250 kHz to 390 kHz, and a probe tip of R≤10 nm)
Measured area: 30 μm×30 μm
Measured points: 256 points×256 points Note that DFM refers to a measurement mode in which the surface shape of a sample is measured in a state where a cantilever is resonated at a given frequency (a frequency specific to the cantilever) while the distance between a probe and the sample is controlled so that the vibration amplitude of the cantilever is maintained constant. In DFM, the surface of the sample and the cantilever are not in contact with each other; thus, measurement is possible without changing the original shape of the surface of the sample and without damaging the surface.

FIG. 40 is a table showing results of measurement with AFM. The surface of a single crystal silicon layer which was not subjected to a laser irradiation process and those of single crystal silicon layers which were subjected to a laser irradiation process were measured with AFM. FIG. 40 shows AFM images of the single crystal silicon layers and surface roughnesses obtained from the AFM images.

The laser irradiation process was performed under a total of four conditions where stage temperatures and laser beam scanning rates were different as shown in FIG. 40. Stage temperatures are 500° C. and room temperature, and scanning rates are 1.0 mm/sec and 8.0 mm/sec. When the scanning rate is 1.0 mm/sec, the overlap percentage of pulses of a laser beam is 89%; when 8.0 mm/sec, 11%.

The measurement results in FIG. 40 show the following. The surface of the single crystal silicon layer 201 which is melted and recrystallized by laser beam irradiation is planarized. The average surface roughness $R_a$ of the surface having an uneven shape can be made to be 3 nm or less, and the root-mean-square average surface roughness RMS can be made to be 1 nm to 5 nm. In addition, the maximum height difference P-V of the uneven shape can be made to be 130 nm or less. In other words, one advantageous effect of the laser irradiation process is to planarize a single crystal semiconductor layer.

Furthermore, it can be seen that the energy density needed for planarization can be decreased when a single crystal semiconductor layer is irradiated with a laser beam while being heated. In addition, the number of laser beam shots (overlap percentage) as well as energy density can be decreased. A reduction in the number of shots leads to an increase in scanning rate with a laser beam (moving speed of a substrate); thus, the cycle time for processing each substrate is shortened. Accordingly, throughput of a laser irradiation step is improved. By extension of time in which the single crystal semiconductor layer is melted, the percentage can be decreased to about one tenth, and further to 0%. It is preferable that the single crystal semiconductor layer be heated when irradiated with a laser beam. Heating temperature is preferably in the range of 250° C. to 650° C.

This embodiment clearly shows that a single crystal silicon layer can be planarized without applying any force that may damage a glass substrate and without heating the glass substrate at a temperature exceeding its strain point. Thus, this embodiment discloses an innovative method for using a laser irradiation process in a method for manufacturing a semiconductor substrate.

Hereinafter, average surface roughness $R_a$, root-mean-square surface roughness RMS, and maximum peak-to-valley height (P-V), which are used in this specification as indexes of surface planarity, are described.

The average surface roughness ($R_a$) is obtained by expanding into three dimensions center line average roughness $R_a$ that is defined by JIS B 0601:2001 (ISO 4287:1997) so as to be able to apply $R_a$ to a measurement surface. The $R_a$ can be expressed as an average value of the absolute values of deviations from a reference surface to a specific surface and can be given by Formula (a1).

$$R_a = \frac{1}{S_0} \int_{Y_1}^{Y_2} \int_{X_1}^{X_2} |F(X, Y) - Z_0| dX dY \qquad (a1)$$

Note that the measurement surface is a surface which is shown by the all measurement data, and is represented by Formula (a2).

$$Z=F(X,Y) \qquad (a2)$$

The specific surface is a surface which is an object of roughness measurement, and is a rectangular region which is defined by four points represented by the coordinates $(X_1, Y_1)$, $(X_1, Y_2)$, $(X_2, Y_1)$, and $(X_2, Y_2)$. The area of the specific surface when the specific surface is flat ideally is denoted by $S_0$. Then, $S_0$ is obtained from Formula (a3).

$$S_0=(X_2-X_1)\cdot(Y_2-Y_1) \qquad (a3)$$

The reference surface is a plane surface represented by $Z=Z_0$ where $Z_0$ is the average value of height of the specific surface. The reference surface is parallel to the XY plane. Note that $Z_0$ is obtained from Formula (a4).

$$Z_0 = \frac{1}{S_0} \int_{Y_1}^{Y_2} \int_{X_1}^{X_2} F(X, Y) dX dY \qquad (a4)$$

The root-mean-square surface roughness (RMS) is obtained by expanding into three dimensions the RMS of a cross section curve so as to be able to apply the RMS of a cross section curve to the measurement surface, in a similar manner to $R_a$. The RMS can be expressed as the square root of the average value of squares of deviations from the reference surface to the specific surface, and can be given by Formula (a5)

$$RMS = \sqrt{\frac{1}{S_0} \int_{Y_1}^{Y_2} \int_{X_1}^{X_2} \{F(X, Y) - Z_0\}^2 dX dY} \qquad (a5)$$

The maximum peak-to-valley height (P-V) can be expressed as a difference between the height of the highest peak $Z_{max}$ and the height of the lowest valley $Z_{min}$ in the specific surface, and can be given by Formula (a6).

$$P-V = Z_{max} - Z_{min} \qquad (a6)$$

The peak and the valley herein are obtained by expanding into three dimensions the "peak" and the "valley" that are defined by JIS B 0601:2001 (ISO 4287:1997). The peak can be expressed as the highest point in the specific surface and the valley can be expressed as the lowest point in the specific surface.

This application is based on Japanese Patent Applications serial nos. 2007-264912, 2007-267265, and 2007-285598 filed with Japan Patent Office on Oct. 10, 2007, Oct. 12, 2007, and Nov. 1, 2007, respectively, the entire contents of which are hereby incorporated by reference.

What is claimed is:

1. A method for manufacturing a semiconductor device, comprising the steps of:
    irradiating a single crystal semiconductor substrate with ions that are accelerated with an ion doping apparatus to form a damaged region in a region at a predetermined depth from a surface of the single crystal semiconductor substrate;
    forming a buffer layer over at least one of a supporting substrate and the single crystal semiconductor substrate;
    disposing the supporting substrate and the single crystal semiconductor substrate in contact with each other with the buffer layer interposed between the supporting substrate and the single crystal semiconductor substrate to bond the supporting substrate and the single crystal semiconductor substrate to each other;
    causing a crack in the damaged region by heating the single crystal semiconductor substrate to separate the single crystal semiconductor substrate from the supporting substrate, thereby forming a supporting substrate to which a single crystal semiconductor layer that is separated from the single crystal semiconductor substrate is fixed; and
    irradiating the single crystal semiconductor layer fixed to the supporting substrate with a laser beam while heating the single crystal semiconductor layer by a heated gas, to melt the single crystal semiconductor layer, thereby performing re-single-crystallization of the single crystal semiconductor layer.

2. The method for manufacturing a semiconductor device according to claim 1, wherein a surface and a vicinity of the surface of a region irradiated with the laser beam in the single crystal semiconductor layer are melted by irradiating the single crystal semiconductor layer with the laser beam while heating the single crystal semiconductor layer.

3. The method for manufacturing a semiconductor device according to claim 1, wherein a part of the single crystal semiconductor layer in a depth direction of a region irradiated with the laser beam is melted by irradiating the single crystal semiconductor layer with the laser beam while heating the single crystal semiconductor layer.

4. The method for manufacturing a semiconductor device according to claim 1, wherein a region irradiated with the laser beam in the single crystal semiconductor layer is melted entirely in a depth direction by irradiating the single crystal semiconductor layer with the laser beam while heating the single crystal semiconductor layer.

5. The method for manufacturing a semiconductor device according to claim 1, wherein the single crystal semiconductor layer is heated at a temperature equal to or higher than 400° C. and equal to or lower than a strain point of the supporting substrate when the single crystal semiconductor layer is irradiated with the laser beam.

6. The method for manufacturing a semiconductor device according to claim 1, wherein the single crystal semiconductor layer is heated at a temperature equal to or higher than 400° C. and equal to or lower than 650° C. when the single crystal semiconductor layer is irradiated with the laser beam.

7. The method for manufacturing a semiconductor device according to claim 1, wherein the single crystal semiconductor layer fixed to the supporting substrate is irradiated with the laser beam while the supporting substrate to which the single crystal semiconductor layer is fixed is heated at a temperature equal to or higher than 400° C. and equal to or lower than a strain point of the supporting substrate.

8. The method for manufacturing a semiconductor device according to claim 1, wherein the single crystal semiconductor layer fixed to the supporting substrate is irradiated with the laser beam while the supporting substrate to which the single crystal semiconductor layer is fixed is heated at a temperature equal to or higher than 450° C. and equal to or lower than 650° C.

9. The method for manufacturing a semiconductor device according to claim 1 wherein the single crystal semiconductor layer is irradiated with the laser beam in an inert gas atmosphere.

10. The method for manufacturing a semiconductor device according to claim 9, wherein the inert gas is a nitrogen gas or a noble gas.

11. The method for manufacturing a semiconductor device according to claim 9, wherein the inert gas has a concentration of an oxygen gas of 30 ppm or less.

12. The method for manufacturing a semiconductor device according to claim 1, wherein the damaged region is formed by exciting a hydrogen gas to generate a plasma including $H_3^+$ and by irradiating the single crystal semiconductor substrate with ions that are included in the plasma and accelerated.

13. The method for manufacturing a semiconductor device according to claim 1, wherein the supporting substrate has a strain point of 650° C. to 690° C.

14. The method for manufacturing a semiconductor device according to claim 1, wherein the supporting substrate is a glass substrate.

15. The method for manufacturing a semiconductor device according to claim 1, wherein the supporting substrate is one of a non-alkali glass substrate (product name: AN100), a non-alkali glass substrate (product name: EAGLE2000 (registered trademark)), and a non-alkali glass substrate (product name: EAGLE XG (registered trademark)).

16. The method for manufacturing a semiconductor device according to claim 1, wherein the laser beam has a cross-sectional shape of one of a linear shape, a square shape, and a rectangular shape on an irradiation surface.

17. The method for manufacturing a semiconductor device according to claim 1, wherein the buffer layer has a multilayer structure and comprises an insulating film in contact with the single crystal semiconductor layer, and the insulating film includes a halogen.

18. The method for manufacturing a semiconductor device according to claim 1, wherein the single crystal semiconductor layer is melted for 200 nanoseconds to 1000 nanoseconds by being irradiated with the laser beam.

19. The method for manufacturing a semiconductor device according to claim 1, wherein the supporting substrate is shrunk by the heating.

20. The method for manufacturing a semiconductor device according to claim 17, wherein the halogen is segregated at an interface between the single crystal semiconductor layer and the insulating film by irradiating the single crystal semiconductor layer fixed to the supporting substrate with the laser beam while heating.

21. A method for manufacturing a semiconductor device, comprising the steps of:
fixing a single crystal semiconductor layer to a glass substrate with a buffer layer interposed therebetween; and
while heating the single crystal semiconductor layer fixed to the glass substrate at a temperature equal to or lower than a strain point of the glass substrate by a heated gas, irradiating a part of the single crystal semiconductor layer with a laser beam to melt an upper portion with leaving a single crystal region in a lower portion, thereby performing re-single-crystallization of the upper portion into a single crystal state having the same crystal orientation as the single crystal region of the lower portion.

22. The method for manufacturing a semiconductor device according to claim 21,
wherein the laser beam has a cross-sectional shape of one of a square shape, a rectangular shape, and a linear shape on an irradiation surface, and
wherein the part of the single crystal semiconductor layer is irradiated with the laser beam while the glass substrate to which the single crystal semiconductor layer is fixed is moved.

23. The method for manufacturing a semiconductor device according to claim 21, wherein re-single-crystallization of the melted portion is performed and a defect in the melted portion is recovered by irradiating the single crystal semiconductor layer with the laser beam.

24. The method for manufacturing a semiconductor device according to claim 21, wherein the glass substrate is one of a non-alkali glass substrate (product name: AN100), a non-alkali glass substrate (product name: EAGLE2000 (registered trademark)), and a non-alkali glass substrate (product name: EAGLE XG (registered trademark)).

25. The method for manufacturing a semiconductor device according to claim 21, wherein the buffer layer has a multilayer structure and comprises a barrier layer capable of preventing sodium from entering the single crystal semiconductor layer.

26. The method for manufacturing a semiconductor device according to claim 21, wherein the buffer layer has a multilayer structure and comprises a silicon nitride film or a silicon nitride oxide film.

27. The method for manufacturing a semiconductor device according to claim 21, wherein the buffer layer has a multilayer structure and comprises a bonding layer that is bonded to the glass substrate or the single crystal semiconductor layer.

28. The method for manufacturing a semiconductor device according to claim 21, wherein the buffer layer has a multilayer structure and comprises an oxide film obtained by oxidizing the single crystal semiconductor layer.

29. The method for manufacturing a semiconductor device according to claim 21, wherein the buffer layer has a multilayer structure and comprises a bonding layer that is bonded to the glass substrate or the single crystal semiconductor layer and a barrier layer capable of preventing sodium from entering the single crystal semiconductor layer.

30. The method for manufacturing a semiconductor device according to claim 21, wherein the buffer layer has a multilayer structure and comprises a bonding layer that is bonded to the glass substrate, an insulating film in contact with the single crystal semiconductor layer, and a barrier layer capable of preventing sodium from entering the single crystal semiconductor layer, the barrier layer being formed between the bonding layer and the insulating film.

31. The method for manufacturing a semiconductor device according to claim 30, wherein the insulating film in contact with the single crystal semiconductor layer is a silicon oxide film or a silicon oxynitride film.

32. The method for manufacturing a semiconductor device according to claim 30, wherein the insulating film in contact with the single crystal semiconductor layer is an oxide film obtained by oxidizing the single crystal semiconductor layer.

33. The method for manufacturing a semiconductor device according to claim 30, wherein the barrier layer is a silicon nitride film or a silicon nitride oxide film.

34. The method for manufacturing a semiconductor device according to claim 21, wherein the buffer layer has a multilayer structure and comprises an insulating film in contact with the single crystal semiconductor layer, the insulating film including a halogen.

35. The method for manufacturing a semiconductor device according to claim 21, wherein the single crystal semiconductor layer is melted for 200 nanoseconds to 1000 nanoseconds by being irradiated with the laser beam.

36. The method for manufacturing a semiconductor device according to claim 21, wherein the glass substrate is shrunk by the heating.

37. The method for manufacturing a semiconductor device according to claim 34, wherein the halogen is segregated at an interface between the single crystal semiconductor layer and the insulating film by irradiating the part of the single crystal semiconductor layer fixed to the glass substrate with the laser beam while heating.

38. A method for manufacturing a semiconductor device, comprising the steps of:
fixing a single crystal semiconductor layer to a glass substrate with a buffer layer interposed therebetween; and
while heating the single crystal semiconductor layer fixed to the glass substrate at a temperature equal to or lower than a strain point of the glass substrate by a heated gas, irradiating a part of the single crystal semiconductor layer with a laser beam to melt a region irradiated with the laser beam in the single crystal semiconductor layer, thereby performing re-single-crystallization into a single crystal state having the same crystal orientation as a single crystal state in a region adjacent to the region irradiated with the laser beam.

39. The method for manufacturing a semiconductor device according to claim 38,
wherein the laser beam has a cross-sectional shape of one of a square shape, a rectangular shape, and a linear shape on an irradiation surface, and
wherein the part of the single crystal semiconductor layer is irradiated with the laser beam while the glass substrate to which the single crystal semiconductor layer is fixed is moved.

40. The method for manufacturing a semiconductor device according to claim 38, wherein re-single-crystallization of the melted portion is performed and a defect in the melted portion is recovered by irradiating the single crystal semiconductor layer with the laser beam.

41. The method for manufacturing a semiconductor device according to claim 38, wherein the glass substrate is one of a non-alkali glass substrate (product name: AN100), a non-alkali glass substrate (product name: EAGLE2000 (registered trademark)), and a non-alkali glass substrate (product name: EAGLE XG (registered trademark)).

42. The method for manufacturing a semiconductor device according to claim 38, wherein the buffer layer has a multi-layer structure and comprises a barrier layer capable of preventing sodium from entering the single crystal semiconductor layer.

43. The method for manufacturing a semiconductor device according to claim 38, wherein the buffer layer has a multi-layer structure and comprises a silicon nitride film or a silicon nitride oxide film.

44. The method for manufacturing a semiconductor device according to claim 38, wherein the buffer layer has a multi-layer structure and comprises a bonding layer that is bonded to the glass substrate or the single crystal semiconductor layer.

45. The method for manufacturing a semiconductor device according to claim 38, wherein the buffer layer has a multi-layer structure and comprises an oxide film obtained by oxidizing the single crystal semiconductor layer.

46. The method for manufacturing a semiconductor device according to claim 38, wherein the buffer layer has a multi-layer structure and comprises a bonding layer that is bonded to the glass substrate or the single crystal semiconductor layer and a barrier layer capable of preventing sodium from entering the single crystal semiconductor layer.

47. The method for manufacturing a semiconductor device according to claim 38, wherein the buffer layer has a multi-layer structure and comprises a bonding layer that is bonded to the glass substrate, an insulating film in contact with the single crystal semiconductor layer, and a barrier layer capable of preventing sodium from entering the single crystal semiconductor layer, the barrier layer being formed between the bonding layer and the insulating film.

48. The method for manufacturing a semiconductor device according to claim 47, wherein the insulating film in contact with the single crystal semiconductor layer is a silicon oxide film or a silicon oxynitride film.

49. The method for manufacturing a semiconductor device according to claim 47, wherein the insulating film in contact with the single crystal semiconductor layer is an oxide film obtained by oxidizing the single crystal semiconductor layer.

50. The method for manufacturing a semiconductor device according to claim 47, wherein the barrier layer is a silicon nitride film or a silicon nitride oxide film.

51. The method for manufacturing a semiconductor device according to claim 38, wherein the buffer layer has a multi-layer structure and comprises an insulating film in contact with the single crystal semiconductor layer, the insulating film including a halogen.

52. The method for manufacturing a semiconductor device according to claim 38, wherein the single crystal semiconductor layer is melted for 200 nanoseconds to 1000 nanoseconds by being irradiated with the laser beam.

53. The method for manufacturing a semiconductor device according to claim 38, wherein the glass substrate is shrunk by the heating.

54. The method for manufacturing a semiconductor device according to claim 51, wherein the halogen is segregated at an interface between the single crystal semiconductor layer and the insulating film by irradiating the part of the single crystal semiconductor layer fixed to the glass substrate with the laser beam while heating.

* * * * *